(12) United States Patent
Agrawal et al.

(10) Patent No.: US 7,195,872 B2
(45) Date of Patent: Mar. 27, 2007

(54) HIGH SURFACE AREA SUBSTRATES FOR MICROARRAYS AND METHODS TO MAKE SAME

(75) Inventors: Anoop Agrawal, Tucson, AZ (US); John P. Cronin, Tucson, AZ (US); Juan C. Tonazzi, Tucson, AZ (US); A. G. Goodyear, Tucson, AZ (US); Robert S. LeCompte, Tuscon, AZ (US); Michael E. Hogan, Tuscon, AZ (US); David W. Galbraith, Tuscon, AZ (US)

(73) Assignee: 3D Biosurfaces, Inc., Tucson, AZ (US)

( * ) Notice: Subject to any disclaimer, the term of this patent is extended or adjusted under 35 U.S.C. 154(b) by 711 days.

(21) Appl. No.: 10/291,467

(22) Filed: Nov. 8, 2002

(65) Prior Publication Data

US 2003/0148401 A1    Aug. 7, 2003

Related U.S. Application Data

(60) Provisional application No. 60/393,044, filed on Jul. 1, 2002, provisional application No. 60/361,588, filed on Mar. 2, 2002, provisional application No. 60/345,848, filed on Nov. 9, 2001.

(51) Int. Cl.
*C12Q 1/68* (2006.01)

(52) U.S. Cl. ............... 435/6; 435/287.1; 435/7.92; 436/518; 422/58

(58) Field of Classification Search ............... 435/6, 435/4, 7.1, 7.8, 7.91–7.95, 283.1, 285.2, 435/287.1–287.3, 287.7–289.1; 436/514, 436/518, 524–527; 422/50–73
See application file for complete search history.

(56) References Cited

U.S. PATENT DOCUMENTS 4,483,700 A    11/1984   Forker, Jr. et al.

(Continued)

FOREIGN PATENT DOCUMENTS

CA    2323719    10/2000

(Continued)

OTHER PUBLICATIONS

Biebuyck et al., "Lithography beyond light: Microcontact printing with monolayer resists", IBM J. Res. Develop., vol. 41, No. 1/2, pp. 159-170, (1997).*

(Continued)

*Primary Examiner*—Long V. Le
*Assistant Examiner*—Ann Y. Lam
(74) *Attorney, Agent, or Firm*—Lawrence R. Oremland, P.C.

(57) ABSTRACT

The present invention is directed to a substrate having a plurality of microfeatures that provide a high surface area and are open to provide ready access to fluids and components therein. Methods of making the high surface area substrates are described and include generating microfeatures and/or microstructures on the surface of the substrate.

4 Claims, 18 Drawing Sheets

U.S. PATENT DOCUMENTS

| | | | |
|---|---|---|---|
| 5,252,294 | A | 10/1993 | Kroy et al. |
| 5,412,087 | A | 5/1995 | McGall et al. |
| 5,445,934 | A | 8/1995 | Foder et al. |
| 5,451,260 | A | 9/1995 | Versteeg et al. |
| 5,525,264 | A | 6/1996 | Cronin et al. |
| 5,629,186 | A | 5/1997 | Yasukawa et al. |
| 5,654,418 | A * | 8/1997 | Sheiness et al. ......... 536/24.32 |
| 5,700,637 | A | 12/1997 | Southern |
| 5,744,305 | A | 4/1998 | Foder et al. |
| 5,788,814 | A | 8/1998 | Sun et al. |
| 5,807,522 | A | 9/1998 | Brown et al. |
| 5,827,748 | A | 10/1998 | Golden |
| 5,843,767 | A | 12/1998 | Beattie |
| 5,859,937 | A * | 1/1999 | Nomura ...................... 385/12 |
| 5,922,534 | A * | 7/1999 | Lichtenwalter ................ 435/6 |
| 5,922,617 | A | 7/1999 | Wang et al. |
| 5,951,295 | A | 9/1999 | Lyles et al. |
| 6,054,270 | A | 4/2000 | Southern |
| 6,083,763 | A | 7/2000 | Balch |
| 6,150,103 | A | 11/2000 | Ness et al. |
| 6,151,973 | A | 11/2000 | Geysen et al. |
| 6,262,216 | B1 | 7/2001 | McGall |
| 6,266,127 | B1 | 7/2001 | Iida |
| 6,297,016 | B1 * | 10/2001 | Egholm et al. ................ 435/6 |
| 6,476,215 | B1 * | 11/2002 | Okamoto et al. .......... 536/25.3 |
| RE38,214 | E * | 8/2003 | Lacey et al. ................ 422/102 |
| 6,861,214 | B1 * | 3/2005 | Rampal et al. ................ 435/6 |
| 6,921,418 | B2 * | 7/2005 | Ledergerber ............ 623/11.11 |
| 2001/0003907 | A1 | 6/2001 | Siman-Tov et al. |

FOREIGN PATENT DOCUMENTS

| | | |
|---|---|---|
| EP | 1 095 760 A1 | 8/2000 |
| WO | WO 90/03382 | 4/1990 |
| WO | WO 93/22680 | 11/1993 |
| WO | WO 95/15970 | 6/1995 |
| WO | WO 99/32663 | 7/1999 |
| WO | WO 99/36176 | 7/1999 |
| WO | WO 00/61282 | 10/2000 |
| WO | WO 01/16376 | 3/2001 |
| WO | WO 01/61042 A2 | 8/2001 |
| WO | WO 01/66687 | 9/2001 |
| WO | WO 01/73126 A3 | 10/2001 |

OTHER PUBLICATIONS

Vithayaveroj, Viriya, "Atomic Force Microscopy for Sorption Studies", A Thesis Presented to the Academic Faculty, Georgia Institute of Technology, 2004.*

Belosludtsev, Y., et al., *Nearly Instantaneous, Cation-Independent, High Selectivity Nucleic Acid Hybridization to DNA Microarrays*; Biochemical and Biophysical Research Communication, vol. 282, pp. 1263-1267 (2001).

Chan, S., *Nanoscale Microcavities for Biomedical Sensor Applications*, Proceedings of SPIE, Micro- and Nanotechnology for Biomedical and Environmental Applications, vol. 3912, pp. 23-34 (2000).

Chang, T., *Plasma Surface Treatment in Composites Manufacturing*, J. Industrial Technology, vol. 15:1 (Nov. 1998-Jan. 1999).

Che, et al, *Novel surface and multicolor charge coupled device-based fluorescent imaging system for DNA microarrays*, J. of Biomedical Optics, vol. 6:4, p. 450-456 (Oct. 2001).

Ghosh, S, et al., *Covalent attachment of oligonucleotides to solid supports*, Nucleic Acids Research, vol. 15:13, 5352 (1987).

Khanna, R., et al., *Microfabrication Protocols for Deep Reactive Ion Etching and Wafer-Level Bonding*, Sensors, (Apr. 2001).

Kikuchi, H., et al., *Stretching and movement of ibroblasts and osteoblasts cultured in microchannel and micropit arrays*, Proceedings SPIE, Micro- and Nonofabricated Electro-Optical Mechanical Systems for Biomedical Environmental Applications II, vol. 3606:150 (1999).

Kopf-Sill, A., et al., *Complexity and performance of on-chip biochemical assays*, Proceedings SPIE, Micro- and Nonofabricated Electro-Optical Mechanical Systems for Biomedical Environmental Applications II, 2978:172 (1999).

Kremsky, J., et al., *Immobilization of DNA via oligonucleotides containing an aldehyde or carboxylic acid group at the 5' terminus*, Nucleic Acid Research, vol. 15:2891 (1987).

Leech, P., *Reactive ion etching of quartz and silica-based glasses in $CF_4/CHF_3$ plasmas*, Vacuum, vol. 55, pp. 191-196 (1999).

Loh, I., *Plasma Surface Modification in Biomedical Applications*, AST Technical Journal (AST Products Inc., Billerica, MA).

Mackenzie, John, et al., *Structures, Properties and Potential Applications of Ormosils*, J. Sol-Gel Sci and Technol., vol. 13, pp. 371-377 (1998).

Maier, B., et al, *Conformation and Self-Diffusion of Single DNA Molecules Confined to Two Dimensions*, Phys. Rev. Letters, vol. 82:9, pp. 1911-1914, (Mar. 1, 1999).

Matsuda, A, et al., *Pregrooving on Glass Disks by the Sol-Gel Method (Part 1)—Formation and Evaluation of Pregrooved Glass Disks*, Proceedings SPIE vol. 1328, pp. 62-79, (1990).

Mitsuhashi, Y., et al., *Sol-Gel Technology for Optical Disk Application*, Proceedings SPIE, vol. 1758, pp. 105-112 (1992).

Meyer, F., et al. *Acid Etching chemistry Characterizes Silicon Wafer Surface Metals*, Semiconductor International, (Jul. 1999).

Park, J., et al., *Characteristics of DNA Microarrays Fabricated on Various Aminosilane Layers*, LANGMUIR, vol. 18:5, pp. 1764-1769 (2002).

Parks, G., *the Isoelectric Points of Solic Oxides, Solid ydroxides, and Aqueous Hydroxo Complex Systems*, Chem. Rev., vol. 65, pp. 177-198 (1965).

Peterson, A., et al., *The effect of surface probe density on DNA hybridization*, Nucleic Acids Research, vol. 29:24, pp. 5163-5168 (2001).

Ramaswamy, R., et al. *Ion-Exchanged Glass Waveguides: A Review*, J. of Lightwave Technology, vol. 6:6, pp. 984-1002 (Jun. 1988).

Resnick, D., et al., *Release Layers for Contact and Imprint Lithography*, Semiconductor Int., pp. 1-7 (Jun. 2002).

Stein, A., et al., *The Role of Surfactants and Amphiphiles in the Synthesis of Porous Inorganic Solics*, Reactants & Synthesis in Surfactant Systems, edited by J. Texter, pub. by Marcell & Dekker, NY (2001).

Tian, D., *Porous Silica Obtained from Biodegradable and Biocompatible Inorganic-Organic Hybrid Materials*, J. Sol-Gel Sci. and Technol., vol. 13, pp. 415-419 (1998).

Turner, D., et al., *Direct enzymatic hydrolysis and patterning of a chemisorbed peptide thin film*, Proceedings SPIE, Micro- and Nanofabricated Electro-Optical Mechanical Systems for Biomedical and Environmental Applications II, vol. 2978, pp. 22-30 (1997).

Van Den Doel, L., et al., *Fluorescence detection in (sub-)nanoliter microarrays*, Proceedings SPIE, Micro-and Nanofabricricated Structures and Devices for Biomedical Environmental Applications II, vol. 3606, pp. 28-39 (Jan. 1999).

Vayssieres, L., et al., *Three-Dimensional Array of Highly Oriented Crystalline ZnO Microtubes*, Chemistry of Materials, vol. 13:12, pp. 4395-4398 (Dec. 2001).

Zhang, P, et al., *Acceleration of nucleic acid hybridization on DNA microarrays driven by pH tunable modifications*, Nucleosides Nucleotides Nucleic Acids, vol. 4:7, pp. 1251-1254 (2001).

Zhao, D., et al., *Nonionic Triblock and Star Diblock Copolymer and Oligomeric Surfactant Syntheses of Highly Ordered, Hydrothermally Stable, Mesoporous Silica Structures*, J. Am. chem. Soc., vol. 120, pp. 6024-6036 (1998).

Zhu, H., et al., *Analysis of yeast protein kinases using protein chips*, Nature Genetics, vol. 6, pp. 283-289 (Nov. 2000).

* cited by examiner

HIGH SURFACE AREA SUBSTRATES FOR MICROARRAYS AND METHODS TO MAKE SAME

CROSS-REFERENCE TO RELATED APPLICATIONS

This application claims benefit of and priority to U.S. provisional patent applications, Ser. No. 60/345,848, filed Nov. 9, 2001, Ser. No. 60/361,588, filed Mar. 2, 2002, and Ser. No. 60/393,044, filed Jul. 1, 2002.

TECHNICAL FIELD

The present invention relates to the fields of inorganic chemistry, organic chemistry, molecular biology, biochemistry and medicine. The invention is directed to methods of preparing substrates, having a high surface area for use as a microarray device, that involve forming structural microfeatures on a surface of the substrate that increase surface area and accessibility thereto. Further, the textured surface further comprises microstructures and/or physical surface features, such as pits, that further contribute to the increased surface area. Compositions directed to the substrates of the invention are also described.

BACKGROUND OF THE INVENTION

A rapid explosion in the sequencing of entire genomes has increased the need for highly parallel methods that allow simultaneous investigation of several thousands of genes in a highly miniaturized fashion. Parallel study of thousands of genes at the genomic level promises to be a critical element in understanding and curing disease. For this reason, among others, high-throughput analysis methods are imperative to the future of medicine including gene discovery, disease diagnosis, genotyping, protein expression, elucidating metabolic responses, drug design, drug discovery and toxicology.

One such tool capable of investigating several thousands of molecules in parallel is an array (Shi, 2002). Briefly, an array is an ordered arrangement of compounds, including biological and biochemical materials, and serves as a medium for matching samples based on complementarity or selective chemical reactions. A microarray is a specific array and is distinguished by samples sizes of less than 200 microns in diameter. The microarray is a device comprising several molecules or more biomolecules of known identity, attached to or immobilized on a surface of a substrate or solid support. The molecules or biomolecules are applied iteratively to the substrate in a highly parallel fashion to generate a discrete spatial grid such that an array having elements corresponding to particular complementary molecules or biomolecules is produced. Generally, the attached or immobilized molecules are the "probe", and the complementary species is the "target". The "target is typically the analyte or species to be detected or quantitated. Nevertheless, in some applications these roles may be reversed and the target may be immobilized while the probe may be free. In the general case, the probe is a molecule to be analyzed (i.e., the "analyte") which is often of unknown identity and, in some cases, is extracted from a sample of interest and labeled, such as with a fluorescent dye, for ready detection. The labeled target(s) is incubated with the microarray under hybridizing conditions and allowed to bind to its complementary probe on the array. After removing the unbound probe, the amount of bound probe is detected and quantitated.

Reliance on microarrays for biochemical investigations has increased because of their demonstrated high throughput capacity. Various methods of microarray manufacture, use and improvements thereon have been described. For example, U.S. Pat. No. 5,744,305 and U.S. Pat. No. 5,445,934 to Foder et al. teach methods of synthesizing polymers, particularly oligonucleotides, polynucleotides and peptides, in an array format on a planar, non-porous solid support. The synthetic regions are prepared and defined by lithography methods that involve passing light through a mask to activate the exposed region for synthesis of the polymer. The resulting derivatized substrate, or array device, comprises polymers attached to the surface of the support in the regions activated by the light treatment.

U.S. Pat. No. 5,807,522 to Brown et al. teaches a spotting method of fabricating microarrays for biological samples in which a solid support having a discrete sample-analysis region prepared by applying a selected, analyte-specific reagent to the solid support using an elongate capillary channel and a tip region at which the solution in the channel forms a meniscus, tapping the tip of the dispensing device against the solid support at a defined position on the surface, with an impulse effective to break the meniscus in the capillary channel and depositing a selected volume between 0.002 and 2 nl of solution on the surface. Iterative steps of depositing the analyte-specific reagent to the solid support produces the final microarray. Brown et al. also teaches that the solid support comprises a substrate having a water impermeable backing, and atop the backing is a water permeable film formed of a porous or a non-porous material that is, for example, in a grid that is formed by applying a barrier material, such as silicon, by mechanical pressure or printing to form a water-proof barrier separating regions of the solid support.

U.S. Pat. No. 6,210,894 teaches that surrounding each array element, which is hydrophilic, with hydrophobic regions prevents potential cross-contamination caused by spreading of solution that are spotted on the surface of the microarray. This modified surface characteristic establishes clear boundaries between array elements. Further, it was suggested that the drop of the solution is deposited in such a manner as to synchronize spatially with each of the hydrophilic array elements, however, requiring alignment imposes a substantial restriction on the dispensing equipment, which, in many cases, is difficult to attain with conventional devices.

WO 01/73126 to Lyles describes a diagnostic device comprising a matrix having fibers of silica, alumina or their combination to provide a rigid, three-dimensionally continuous network of open, intercommunicating voids. The structure is taught to be readily modified by chemical reactions for binding a compound with increased loading capacity (see also U.S. Pat. No. 5,951,295 to Lyles). U.S. Pat. No. 5,629,186 to Yasukawa et al. also teaches rigid fused silica, alumina, or silica and alumina fiber matrices, and the matrices are useful for as a body implantable material, for supporting tissue growth in vivo, for in affinity chromatography and for blood diagnostic assays.

U.S. Pat. Nos. 5,700,637 and 6,054,270 to Southern teach arrays prepared by methods involving iterative coupling of a nucleotide precursor to form the array. The surface is taught to include a smooth, impermeable surface such as glass, and a surface having sintered microporous glass placed in microscopic patches.

WO 99/32663 teaches a system for detecting a molecule in a sample comprising a substrate having multiple spatially discrete regions, wherein the region comprises at least eight different anchors, each in association with a bifunctional linker, and at least two regions are identical. The regions on the surface may comprise a subregion for purposes of reducing the tolerance required for physically placing a single anchor (or group of anchors) into each designated space, and providing uniformity to the size of the areas containing the anchors, thereby facilitating the detection of the molecule.

Two main ways of preparing a microarray using flat plain glass as substrates have been described—light directed in-situ synthesis of a probe, and immobilization of synthesized biomolecules onto solid substrates that serve as probes for the microarray (WO 90/03382; WO 93/22680; U.S. Pat. No. 5,412,087 to McGall et al.; WO 95/15970). Methods in the prior art to increase the surface area of a microarray, and consequently the throughput capacity and sensitivity, have involved, for example, preparing a porous substrate, wherein the pores serve a sites for attachment of a plurality of biomolecules. For example, Nagasawa et al. (U.S. published application 2001/0039072) teaches a reactive probe chip comprising a composite substrate having compartments (i.e., wells) within which loaded porous carrier particulate probes are immobilized. Nagasawa et al. teaches that it is critical that the immobilization of the carrier particulate probes occur only at the outer surfaces and protective measures, such as impregnating with water, are taught to prevent damage to the inner pore surface, which carries the bound probe, during immobilization. Another approach to improving low probe density is described in WO 00/61282, which teaches a porous substrate for making a microarray that has two regions, a support region and a porous region. This porous region is described as offering substantial advantages over flat glass, and porous regions created by depositing a thin film comprising colloidal silica were found to improve signal enhancement 15 to 45 times that of flat glass, wherein the thicker films and smaller particles afforded that better results. However, accessiblity of biomolecules in the optimal systems was not maximized, i.e., the means for molecules to penetrate the pores is difficult and kinetically challenging with respect to achieving sufficient proximity to a specific binding site. Further, in the wash step, this problem manifests itself because non-specific molecules get physically trapped within the pores.

PCT application WO 01/61042 teaches smooth surfaced porous membranes having one or more advantages such as low autofluorescence, thermal-cyclability, especially under humid conditions, and three-dimensional binding capacity. The membrane is a composite membrane comprising a porous polymer layer disposed on a support, which are disclosed for the use of making a microarray device, and the porous layer is characterized by having specific surface characteristics (e.g., surface roughness).

The problem of accessibility in designing high surface area microarrays is observed in WO 01/16376, which teaches a substrate for the attachment of an array of biomolecules comprising a substantially planar, rigid inorganic material having a top surface, wherein the top surface has a plurality of pores disposed therein. Further, the planar, top surface further comprises a cationic polymer, such as polylysine, bonded to the surface to afford ready attachment of negatively charged biomolecules, including polynucleotides. In describing suitable inorganic materials for providing the pores within the top surface of the substrate, it was observed that sol-gel coating and Vycor provided relatively poor accessibility of the polynucleotide (i.e., DNA) for hybridization.

The porous coatings described in the prior art resulted in at least one of several problems such as inadvertent trapping of the targets (and probes), poor access of longer and/or larger molecules to the pores and long hybridization times. The inadvertent trapping of the molecules result in the background signal to rise and thus negate the advances made in the increased signal. One attempt to overcome the problems associated with poor molecular accessibility is described in U.S. Pat. No. 5,843,767, which teaches creating capillary tubes that bind an analyte to a surface of the tube and function to carry fluids comprising probes. Thus, the probes are accessible to the analytes. However, the construction introduces many constraints in the chip design, and the analysis requires special equipment, thereby adding to the cost.

These results indicate that effecting a high surface area to a microarray device involves not only a quantitative increase in the surface area, such as with disposing pores on a planar top surface, but also a consideration of accessibility the surface area to the target and/or probe. Otherwise, the structural increase in surface area does not fully translate into a microarray device having increased surface area.

The present invention alleviates these problems in the prior art by providing systems and methods directed to a substrate having a high surface area in each of three dimensions for making a microarray that realizes the full potential of the surface area. The invention is well-suited in the fabrication of microarray devices that are employed in biological and chemical analyses of biomolecules of various sizes and dimensions. Specifically, the substrate comprises surface micro-features that are smaller than each of the array elements. These micro-features have specific surface characteristics and texture, such as a tailored porosity, that is useful for the analysis of chemicals, particularly biomolecules.

BRIEF SUMMARY OF THE INVENTION

The present invention is directed to systems and methods that provide a high surface area substrate.

In one embodiment of the present invention there is a substrate having a high surface area for use as a microarray comprising a plurality of adjacent microfeatures on a surface of the substrate arranged in spatially discrete regions to produce a texture on the surface, wherein the textured surface provides an increase in surface area as compared to a non-textured surface.

Specific embodiments may include one or more of the following:

The substrate may comprise a material selected from the group consisting of glass, a ceramic, a metal, a non-metal and a polymer. The microfeatures may comprise a material that is different from the material of the substrate, said material being selected from the group consisting of a glass, a ceramic, a metal, a non-metal, an inorganic oxide and a polymer. A plurality of microfeatures may comprise a pit, a trench, a pillar, a cone, a wall, a micro-rod, a tube, a channel or a combination thereof. The plurality of microfeatures may comprise communicating microfeatures. The plurality of microfeatures may be distributed uniformly on the surface of the substrate. Alternatively, the plurality of microfeatures may be distributed randomly on the surface of the substrate. The plurality of microfeatures may have an aspect ratio less than about 10. Each of the plurality of microfeatures may have a height of about 0.1 to about 100 microns. Each of the plurality of microfeatures may have a cross-section of about 0.01 to about 500 sq. microns. Each of the plurality of microfeatures may have an aspect ratio of less than about 5. Each of the plurality of microfeatures may have an aspect ratio of less than about 1. The textured surface may be characterized by having a peak-to-valley value of greater than about 10 nm. Alternatively, the textured surface is characterized by having a peak-to-valley value of greater than about 100 nm. As yet another alternative, the textured surface is characterized by having a peak-to-valley value of greater than about 1000 nm. The surface area may be increased by at least about 20%. The surface area may be increased by at least about 100%.

In specific embodiment, the surface further comprises a plurality of microstructures. The plurality of microstructures may comprise a pit, a trench, a pillar, a cone, a wall, a micro-rod, a tube, a channel or a combination thereof. Each of the plurality of microstructures may be smaller in dimension than each of the plurality of microfeatures and occupy a spatially discrete region within the microfeature.

In another embodiment, the microfeatures are etched into the surface of the substrate. The etching may comprise corrosion, ablation, abrasion, reaction, impact, drilling or dissolving.

In a specific embodiment, the microfeatures are formed on the surface of the substrate. The microfeatures may comprise an inorganic oxide selected from the group consisting of tungsten oxide, silica, zirconia, alumina, titania, tantala (tantalum oxide) zinc oxide, nickel oxide, magnesium oxide, calcium oxide, boron oxide, potassium oxide, sodium oxide, chromium oxide, tin oxide, lithium oxide, lead oxide, and phosphorous oxide.

In another embodiment of the substrate, at least one spatially discrete region comprises a well, said well comprising at least two microfeatures and a plurality of microstructures that are each integral to the bottom of the well, said microstructures are smaller in dimension than each of the microfeatures. Each of the plurality of microfeatures may be smaller in dimension than an array element of the microarray, said array element comprises a textured array element comprised of at least two microfeatures. The textured array element may provide local replications of measurements as compared to a non-textured array element. Each of the local measurements in said textured array element may be of uniform intensity as compared to a non-textured array element. At least one of the microfeatures of the textured array element may function as a well-defined boundary of said textured array element.

In another embodiment of the substrate, the substrate further comprises an activating material coated on at least one of the plurality of microfeatures. The activating material may function to immobilize a biomolecule. The biomolecule may comprise at least one of a nucleic acid, an oligonucleotide, a peptide, a polypeptide, a protein, an enzyme, a cell, an organelle, a lipid, a carbohydrate, a fat, a vitamin, a nutrient, or an antibody. The substrate may be further characterized by providing an access of the biomolecule to the textured surface that is substantially similar to an access provided by a non-textured surface. The activating material may have an iso-electric point (IEP) equal to or greater than about 4. The activating material may comprise a silane, a metal oxide, streptavidin, salicylhydroxamic acid (SHA), a hydrazine, an aldehyde, a ketone, an ester, an amide, poly(ethyleneimine), polyamide, polyacrylamide, nitrocellulose, an organic molecule having at least one free amino group, or derivatives thereof. The silane may comprise an amino group, a mercaptan, or an epoxy group. When the activating material is a metal oxide, the metal oxide may comprises tungsten oxide, silica, zirconia, alumina, titania, tantala, zinc oxide, nickel oxide, magnesium oxide, calcium oxide, boron oxide, potassium oxide, sodium oxide, chromium oxide, tin oxide, lithium oxide, lead oxide, or phosphorous oxide.

In a specific embodiment of any of the substrates described above, the substrate comprises a microarray comprising a high surface area substrate. Specific embodiments may include one or more of the following:

In another embodiment, there is a substrate having a high surface area for use in a microarray comprising a well, the well comprising a textured bottom surface comprised of a plurality of microfeatures that provide the high surface area. The textured bottom surface may further comprise a plurality of microstructures, wherein each of said microstructures are smaller in dimension than each of the plurality of microfeatures. Each of the plurality of microfeatures may be smaller in dimension than an array element of the microarray, the array element comprises a textured array element comprised of at least two microfeatures.

In yet another embodiment of the invention, there is a microarray having improved analytical accuracy comprising a high surface area substrate, the substrate comprising a plurality of microfeatures on a surface of the substrate arranged in spatially discrete regions to produce a texture on the surface, wherein the textured surface provides an improvement in accuracy as compared to a non-textured surface. Each of the plurality of microfeatures may be smaller in dimension than an array element of the microarray, the array element comprises a textured array element comprised of at least two microfeatures. The textured array element may provide local replications of measurements. At least one of the microfeatures of the textured array element functions as a well-defined boundary of said textured array element.

In another embodiment of the present invention, there is a microarray having improved uniformity of signal intensity comprising a high surface area substrate, the substrate comprising a plurality of microfeatures on a surface of the substrate arranged in spatially discrete regions to produce a texture on the surface, wherein the textured surface provides the improvement in the uniformity of the signal intensity as compared to a non-textured surface. Each of the plurality of microfeatures may be smaller in dimension than an array element of the microarray, said array element comprises a textured array element comprised of at least two microfeatures.

In another embodiment of the present invention, there is a method of preparing a substrate having a high surface area for use in a microarray comprising the steps of covering a surface of the substrate with a coating material and patterning the coating material, the patterning defining a plurality of microfeatures arranged in spatially discrete regions on the surface to form a textured surface, wherein the textured surface provides the high surface area as compared to a non-textured surface. Specific embodiments may include one or more of the following:

The coating material may comprise a photoresist polymer, a metal, a non-metal, or a ceramic. The coating material may further comprises an adhesion promoter. The patterning may comprise photolithography.

In a yet another embodiment, the patterning may comprise embossing the coating material. In a specific embodiment, the coating material is deposited on the surface by a sol-gel process. The coating material may comprise an inorganic oxide comprised of tungsten oxide, silica, zirconia, alumina, titania, tantala, zinc oxide, nickel oxide, magnesium oxide, calcium oxide, boron oxide, potassium oxide, sodium oxide, chromium oxide, tin oxide, lithium oxide, lead oxide, or phosphorous oxide. The embossing comprises consolidation, said consolidation involves applying heat, radiation or a combination thereof of the embossed surface.

In another embodiment, the method of preparing may further comprise forming a plurality of micro-rods on the surface. The method may comprise covering the surface of the substrate with a coating material which inhibits the growth of micro-rods. The micro-rods may have an aspect ratio of less than about 10. Alternatively, the micro-rod may have an aspect ratio of less than about 5. Alternatively, the micro-rods may have an aspect ratio of less than about 1. In a specific embodiment, the micro-rods may be hollow.

In another embodiment, the method further comprises applying an activating material to at least one of the plurality of microfeatures, wherein the activating material functions to immobilize a biomolecule. The method may further comprise the step of removing the coating material from the textured surface. The method may further comprising applying an activating material to at least one of the plurality of microfeatures, wherein the activating material functions to immobilize a biomolecule.

In another embodiment, the method further comprises the step of etching the textured surface, wherein the etching decreases an aspect ratio of said plurality of microfeatures. In a specific embodiment of the method, the coating material is etch-resistant. The etching may comprise corrosion, ablation, abrasion, reaction, impact, drilling, or dissolving. The etching may comprise a wet-chemical process. The etching may comprises anisotropic etching. The method may further comprise the step of applying an activating material to at least one of the plurality of microfeatures, wherein the activating material functions to immobilize a biomolecule. The method may further comprise the step of removing the coating material from the textured surface. The method may further comprise applying an activating material to at least one of the plurality of microfeatures, wherein the activating material functions to immobilize a biomolecule. The method may further comprise applying an activating material to at least one of the plurality of microfeatures, wherein the activating material functions to immobilize a biomolecule. In a specific embodiment, the biomolecule may comprises at least one of a nucleic acid, an oligonucleotide, a peptide, a polypeptide, a protein, an enzyme, a cell, an organelle, a lipid, a carbohydrate, a fat, a vitamin, a nutrient, or an antibody.

In another embodiment, there is a method of preparing the high surface area substrate comprising molding the substrate and each of the plurality of microfeatures in one step using a molding material. The molding material may comprise polycarbonate, acrylic, polystyrene, nylon, polyolefin, or silicone. At least one of the spatially discrete regions may be a well comprising a textured bottom surface comprised of said plurality of microfeatures. The textured bottom surface may further comprise a plurality of microstructures, wherein each of the plurality of microstructures are smaller in dimension than each of the plurality of microfeatures. The method may further comprise a molding step which comprises injection molding or compression molding. The method may further comprise applying an activating material to at least one of the plurality of microfeatures, wherein the activating material functions to immobilize a biomolecule.

In another embodiment, there is a method of preparing a substrate having a high surface area for a microarray comprising embossing a surface of the substrate to generate a plurality of microfeatures on the surface to form a textured surface that provides the high surface area. The substrate may comprise a well plate or a micro-well plate and each of said plurality of microfeatures occupy a bottom surface of at least one well of said well plate or said micro-well plate.

In another embodiment of the present invention, there is a method of detecting an analyte comprising applying a sample to a microarray binding the sample to at least one biomolecule, wherein the biomolecule is a probe, and detecting the binding, wherein the binding indicates the presence of the analyte. The probe may be labeled with a fluorescent molecule, a particle, a chemiluminescent fragment, or a radioactive molecule. The step of detecting may comprise detecting a fluorescent signal, light scattering, a radioactive signal, an optical signal, an electronic signal, or mass desorption. The method of detecting may comprise a detecting step comprising electronic discrimination. The electronic discrimination may comprise determining a change in mass, capacitance, resistance, inductance or a combination thereof as compared to a control. The analyte may be selected from the group consisting of a small organic molecule, a biomolecule, a macromolecule, a particle and a cell.

In another embodiment, there is a bioreactor having an increased surface area comprising a substrate comprising at least one reservoir, the reservoir comprising more than one communicating microfeature, wherein the microfeature increases the surface area by at least about 100% as compared to a flat surface. Specific embodiments may include one or more of the following: The reservoir may further comprises a microstructure, said microstructure is smaller in dimension than the microfeature. The reservoir may comprise a reaction chamber, said reaction comprises surface catalysis, mixing, filtration, or fractionation.

In another embodiment, there is a substrate having a high surface area comprising a solid substrate and a layer of a coating on a surface of the substrate comprising an inorganic oxide and a plurality of microchannels, wherein said microchannels are formed from a removable fibrous template.

Specific embodiments may include one or more of the following:. The fibrous template may comprise a plurality of particles having a fiber aspect ratio of at least about 3. The fibrous template may comprise a peptide, latex, collagen, a glycol, an amine or an organic acid. The fibrous template may further comprise a removable non-fibrous template that forms a void in the coating. In specific embodiment, the non-fibrous template comprises a peptide, latex, collagen, a glycol, an amine or an organic acid. The inorganic oxide comprises tungsten oxide, silica, zirconia, alumina, titania, tantala, zinc oxide, nickel oxide, magnesium oxide, calcium oxide, boron oxide, potassium oxide, sodium oxide, chromium oxide, tin oxide, lithium oxide, lead oxide, or phosphorous oxide. The layer of coating on the surface of the substrate may be formed by a sol-gel process.

In another embodiment of the invention there is a substrate for use in a microarray comprising a coating which is doped with a dopant, wherein the coating is selected from the group consisting of silica, titania, tantala, zirconia, tantala, tungsten oxide and alumina, and wherein the dopant is selected from the group consisting of lithium oxide, sodium oxide, potassium oxide, zinc oxide, and organic salts.

Specific embodiments may include one or more of the following. The coating may be silica and the dopant may be lithium oxide or zinc oxide. The coating on the substrate may be porous. The coating on the substrate may be formed by a wet chemical deposition process. Where wet chemical deposition processes are used, the wet chemical deposition process may comprise deposition of a liquid precursor comprising an organic moiety. Where wet chemical deposition processes are used with a liquid precursor comprising an organic moiety, the organic moiety may be ablated.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings.

DETAILED DESCRIPTION OF THE INVENTION

Figure 1A:
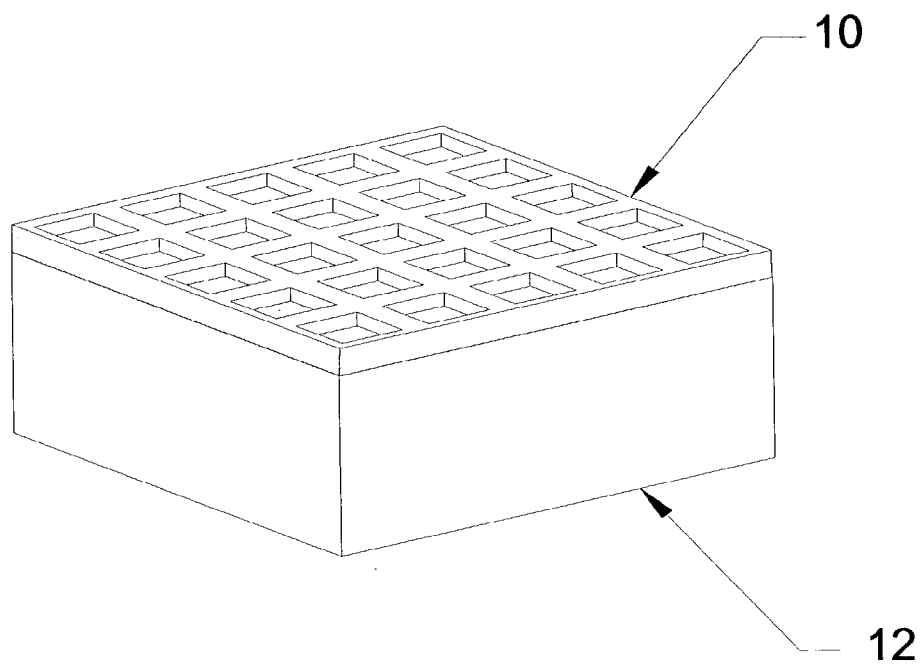
FIGS. 1A to 1C shows substrates having a plurality of microfeatures that are formed on the substrate.

As used in the specification, "a" or "an" may mean one or more. As used in the claim(s), when used in conjunction with the word "comprising", the words "a" or "an" may mean one or more than one. As used herein "another" may mean at least a second or more.

The term "activating material," as used herein, refers to a substance that functions to immobilize a compound on a surface of a substrate.

The term "array element," as used herein, refers to an area or region on a surface of a substrate that is occupied by a single material type immobilized on the surface. For example, the single material type is transferred to the surface in a discrete volume of a solution, which includes a compound and/or a biomolecule, such as a nucleic acid, a polynucleotide, a peptide, a polypeptide, a protein, an antibody or fragment thereof, an enzyme, a small molecule, a hapten or the like that is immobilized on the surface. Alternatively, the single material type is synthesized from the vapor phase directly or indirectly on the surface, such as the synthesis regions discussed in U.S. Pat. No. 5,445,934. In a specific embodiment of the present invention, the single material type is immobilized on a textured surface of the substrate to define an array element. If spotting methods are used, the volume is not critical because dispensing alignment restrictions and cross-contamination are alleviated by the textured surface of the present invention. A size range for one array element is in the range of about 20 to about 2000 microns, and in a preferred embodiment, the size range for one array element is between about 50 and about 1000 microns.

The term "aspect ratio," as used herein, refers to a cross-sectional width divided by a depth or height. In specific embodiments, the cross-sectional width is the average cross-sectional width, such as determining an aspect ratio of an irregularly shaped structure.

The term "communicating microfeatures," as used herein, refers to microfeatures that are connected to at least one of another microfeature and/or the textured surface. Because the microfeatures are connected to each other and/or to the textured surface of the present invention and, thus, are communicating with each other and/or with the textured surface.

The term "fiber aspect ratio," as used herein, refers to a dimension of a fibrous structure defined by the length divided by the width. In the present invention, this term is directed to the removable fibrous template that is employed to prepare microchannels in a coating.

The term "iso-electric point" or "IEP," as used herein, refers to the ionic property of a surface that is exposed to an aqueous liquid at a specific pH. For example, a surface, which is exposed to an aqueous solution having a pH 7, that exhibits no ionic property possess an IEP of 7. Further, this surface exhibits a negative charge at a pH greater than 7 and a positive charge at a pH less than 7. IEP is determined by measuring the Zeta Potential of a surface that is exposed to a series of fluids having varying pH. The value of the pH at which the Zeta potential of the surface is "0", is the IEP of the surface. Zeta potential is measured using commercially available equipment, such as an Electro Kinetic Analyzer from Anton Paar GmbH, Anton Paar (Graz, Austria).

The terms "microarray" and interchangeably "microarray device," as used herein, refer to an analytical device comprising an ordered arrangement of compounds and serves as a medium for matching samples to the compounds based on complementarity and/or selective reaction and/or selective interaction. Microarrays generally comprise array elements in which the matching takes place, and the microarrays of the present invention comprise textured array elements.

The term "microfeature," as used herein, refers to a three-dimensional structure that is generated on a surface of a substrate. The microfeature increases the surface area of the surface of the substrate, and is accessible to a compound, including biomolecules and macromolecules.

Figure 2A:
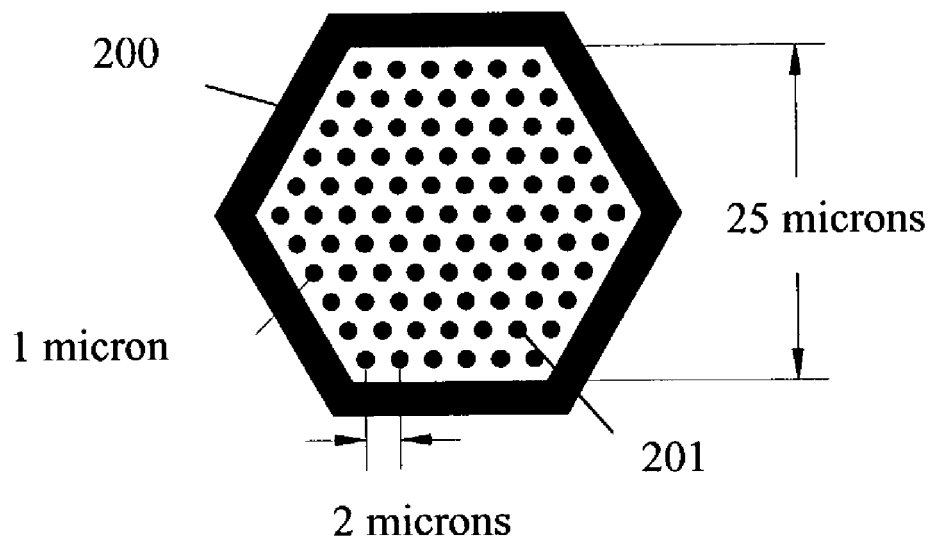
FIGS. 2A and 2B illustrate high surface area substrates having nested structural elements of microfeatures and/or microstructures on a surface.
Figure 2B:
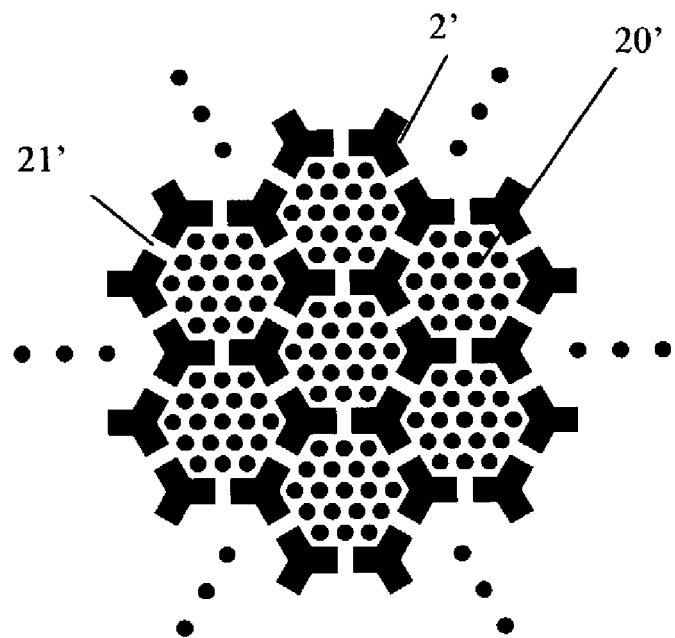

The term "microstructure," as used herein, refers to a structure that is generated on a surface of a substrate that occupies a space on the surface, and preferably, within a microfeature, however, such residence is not necessary. In preferred embodiments, each microstructure possesses a characteristic dimension that is smaller than a dimension of a microfeature on the same substrate and/or in the same array element. Preferably, the microstructure is at least about two-fold smaller than the microfeature on the same substrate and/or in the same array element. For example, FIGS. 2A and 2B illustrate a plurality of microstructures, illustrated as dots (i.e., tops of pillars), within a microfeature, the hexagon cell.

The term "peak-to-valley value," as used herein, refers to the unevenness exhibited by the texture on the surface of a substrate of the present invention.

The terms "polypeptide" and "protein" as used herein are interchangeable and refer to a gene product encoded by a nucleic acid sequence.

The term "probe", as used herein, is defined as a chemical or biochemical species which may or may not be immobilized and which is complementary, and binds with some specificity to, a molecule, a nucleic acid, a polypeptide or compound of natural or synthetic origin that serves as a target.

A "sample" as used herein refers to a molecule, a protein, a compound, an extract, a solution, a slurry, an emulsion, a colloidal dispersion, a cell, and/or organelle that is of interest to the user and comprises a target. For example in a specific embodiment, the sample is a nucleic acid obtained from a cell of an organism in a living or dead state, from an artificial cell culture or from a natural source in a fresh, boiled or frozen state. Methods of obtaining a nucleic acid from a cell are well known in the art.

The term "spatially discrete region," as used herein, refers to an area on a surface of a substrate that is distinct and/or separate from another area on the surface. For example, a plurality of microfeatures that are arranged in spatially discrete regions indicates that each of the plurality of microfeatures occupy a specific area on the surface; the specific areas are distributed on the surface, if applicable, in a random or uniform distribution. For brevity, the spatially discrete region is also referred to herein as "region."

The term "substantially similar," as used herein, refers to a quantitative and/or qualitative likeness of similarity. The similarity pertains to any characteristic as compared to a non-textured surface and/or a non-textured array element. In a specific embodiment, accessibility of a biomolecule to a microfeature and/or a microstructure of the textured surfaces of the present invention is substantially similar to accessibility of the biomolecule to regions of a non-textured surface. In a specific embodiment, the accessibility may be measured by the hybridization time required of a microarray comprising a high surface area substrate of the present invention. In such embodiments, the hybridization time required of the microarray is within four times the hybridization time required by a microarray comprising a substrate having a flat surface. More preferably, the hybridization time is within 50% as compared to a flat surface.

The term "substrate," as used herein, refers to a solid support that is modified by methods of the present invention to create a high surface area, textured surface thereon. In certain embodiments, the substrate comprises an inorganic material which is crystalline or a glass including modified or functionalized glass, a plastic (including acrylics, polystyrene and copolymers of styrene and other materials, polypropylene, polyethylene, polybutylene, polyurethanes, Teflon™, and the like), polysaccharides, nylon, nitrocellulose, resins, a variety of other polymers, silica or silica-based materials including silicon and modified silicon, carbon and metals. Some examples of inorganic crystalline substrate are quartz and sapphire, and examples of inorganic glasses are amorphous silica, soda-lime glass and borosilicate glass. For example, the substrate is a well plate, a micro-well plate, a titer plate, an optical fiber (i.e., end of the fiber is textured to increase surface area) or a bead. Thus, it is contemplated that the substrate is any shape that is suitable for its desired end use, and determining appropriate shapes and/or sizes are within the scope of routine experimentation and the skill of one of ordinary skill in the art.

The term "target" refers to a molecule, a nucleic acid, a polypeptide, an antibody, a cell, an organelle, a cellular structure or a compound and/or small molecule of natural or synthetic origin. Chemical synthesis of polypeptides is known in the art and are described further in Merrifield, J., *J. Am. Chem. Soc.*, 91:501 (1969); Chaiken, I. M., *CRC Crit. Rev. Biochem.*, 11:255 (1981); Kaiser et al., *Science*, 243: 187 91989); Merrifield, B., *Science*, 232:342 (1986); Kent, *Ann. Rev. Biochem.*, 57:957 (1988); and Offord, R. E., *Semisynthetic Proteins*, Wiley Publishing (1980). In addition, methods for chemical synthesis of peptide, polycarbamate and polynucleotide arrays have been reported (see Foder et al., *Science*, 251:767–773 (1991); Cho et al., *Science*, 261:1303–1305 (1993)). Functionally, the target is complementary to a molecule, a nucleic acid, a polypeptide or compound of natural or synthetic origin that serves as a probe. The target may or may not be immobilized to a solid or other support. In a specific embodiment, a target is a tethered nucleic acid with known sequence and the probe is a free nucleic acid sample whose identity and/or abundance is detected by complementary binding of the target. In another specific embodiment, the target is a polypeptide with a known or unknown amino acid sequence having a known biological activity and the probe is an organic molecule, wherein after binding of the probe to the target, the biological activity is detected either by a decrease in the biological activity or an increase in the biological activity as compared to the native biological activity of the polypeptide. Non-limiting examples of a target useful in the present invention include inorganic compounds such as inorganic metals or salts; organic molecules such as dyes, drugs, amino acids, small ligands, and synthetic organic compounds; bio-molecules such as DNA, RNA, PNA (protein nucleic acid), a protein, carbohydrate, amino acids, antibodies, cells, and organelles. A skilled artisan recognizes that biomolecules are also correctly considered natural polymers, for example, DNA and RNA and proteins are natural polymers.

The term "texture," as used herein, refers to a three-dimensional characteristic. For example, a surface of a substrate is textured and, more specifically, a surface of an array element is textured. In specific embodiments, the texture comprises a repeating design.

The term "uniform signal intensity," as used herein, refers to a detectable analytical output (i.e., measurement) that is consistent in quantity (i.e., magnitude) and/or quality (i.e., degree of output). In a specific embodiment, when local replications of measurements are obtained from an array element of the present invention, then their standard deviation is smaller, preferably by at least about 25%, as compared to a non-textured array element. More specifically, the measurements taken on each of the microfeatures (excluding the measurements from the microfeatures located at the edge of the array element) are each within about 50% detectable intensity of another measurement obtained in the same array element.

THE PRESENT INVENTION

The present invention provides substrates that offer a substantial improvement in microarray technology. The invention relates to a high surface area substrate, methods of using the substrate and methods of manufacturing the microarrays prepared therefrom, including processes of modifying the surface of the substrate.

The substrates of the present invention exhibit several advantages, including i) a higher effective surface area by utilizing a third dimension, which increases the number of potential binding sites and results in an increased dynamic range of measurement and increased signal-to-noise ratios, thereby resulting in smaller, brighter (e.g. higher luminosity) spots;

ii) an improved access of a molecule to the surface, to microfeatures, and/or to microstructures providing a faster and more complete hybridization, spotting, washing, blocking, or any of the other kinetic process involved in microarray analysis; the improved access produces expression times that are substantially similar to flat, impermeable surfaces and provides a reduction in non-specific binding/trapping;

iii) promotes uniformity of an array element, including uniformity in size (i.e., spot size) and signal intensity, because the boundaries of the array element are well defined by a microfeature and this provides a decrease in identification and quantification error, hence, an improved analytical accuracy;

iv) a controlled lateral spread (i.e., due to wicking) by defining the boundary of each array element and reducing its surface size, thereby allowing a higher density of array elements on the surface-the surface size of the array element is reduced while the surface area of the array element is increased because the array element is textured;

v) an improved analysis of small amounts of sample due to better sample utilization on increased areas, such as allowing shallower depths of the high throughput reaction wells; and vi) structural surface elements (i.e., microfeatures, microstructures) that produce a contiguous collection of analytical sources that may be individually scanned and summed statistically into data having an improved mean square deviation. Thus, the microfeature(s) in the array element provide local replications of measurements that provide more data per array element, thereby increasing quality of data, precision and accuracy of analysis.

Further, the substrates of the present invention are compatible with conventional array equipment because of the ease of surface accessibility to both the targets and probes, and absence of any alignment requirements for a solution dispenser and the substrate. These features facilitate the preparation an array element on the textured surface of the inventive substrates.

1. High Surface Area Substrates

This invention describes compositions and methods directed to the formation of high surface area substrates. The high surface area is provided by generating structural elements on a surface of the substrate to create surfaces that are accessible to a chemical molecule, particularly to macromolecules. The structural elements are collectively referred to as microfeatures and/or microstructures and may assume various shapes, sizes and dimension, as discussed further below. In certain embodiments, the textured surface comprises a plurality of microfeatures on a surface of the substrate, arranged in spatially discrete regions, to produce the textured surface, and the textured surface provides an increase in surface area as compared to a non-textured surface.

The microfeatures of the present invention occupy spatially discrete regions on the surface of the substrate, which includes a uniform distribution and/or a random distribution and/or a combination thereof. One example of a microfeature is a plurality of crests, troughs, walls and/or a textured base surface that occupies a region defined by a well. The substrate, in such embodiments, comprises a well plate or a micro-well plate in which at least one well, or preferably a plurality of the wells, comprise a textured surface (i.e., the bottom of the well, walls, etc.). In certain embodiments, the crests, walls and/or base surface that form each well is smooth, and in other embodiments, these structures are textured with microfeatures and/or microstructures, such as shown in FIGS. 2B and 7C. Each of these structural elements contribute to an increase in total surface area that is available for high throughput analysis in a microarray device.

Further, the nesting of the structural elements described herein (e.g., microfeatures and/or microstructures) provide ready access of a molecule to a plurality of the structural elements. This accessibility is maximized because each structural element communicates with at least another structural element and/or the textured surface.

In an alternative embodiment, the uniform distribution of the plurality of microfeatures provide a pattern, such as a waffle (FIGS. 1A and 1B) or a honeycomb (FIGS. 1C and 10), on the textured surface. In such embodiments, the microfeatures form regions that accommodate samples containing molecules, which are generally in a liquid form. FIG. 1A shows a substrate having a coating 10 deposited on a substrate 12. The coating 10 is patterned to generate the microfeatures in the shape of cups having a square cross-section. In specific embodiments, each of the microfeatures that are arranged in a waffle pattern are much smaller than an area of the array element. For example, the array element size (or the spot size, if prepared by spotting techniques known in the art) is about 100×100 microns to a few mm, which is several times the size of each of the microfeatures. Thus, each array element includes at least two microfeatures. The size of the microfeatures are defined as an average size of a repeat unit including the widths of the specific microfeature and the wall, if any, separating it from the next microfeature.

In further embodiments, the textured surface comprises a plurality of microstructures. The microstructures are structural elements that further increase the surface area of the textured surface as compared to a non-textured (flat) surface and may assume various shapes, sizes and dimension. In general, the shape of the microstructure includes any of a pillar, a micro-rod, a cone, a pyramid, a wall, a micro-pit (pit), a channel, a trench, a tube or the like as well as any irregular shape, such as a trapezoid, or a non-linear structure, provided the dimensions of the microstructure are smaller than a dimension of the microfeature. It is contemplated that the relative heights of the microfeatures and/or microstructures need not be the same. In preferred embodiments, the microstructure is located within the microfeature, thereby creating a size gradient of structural elements (i.e., nested structural elements) that contribute to the surface area of the substrate, such as is illustrated in FIGS. 2A and 2B. For example, FIG. 2A shows a microfeature 200 having a plurality of microstructures 201 which are arranged in a more condensed pattern therein. The microstructures, which are represented as dots in FIG. 2A, are structurally, for example, pillars, rods, or cones within each microfeature, and their presence results in a higher surface area as compared to the surface having only the hexagonal microfeatures. Further, the hexagonal boundaries provide a mechanical reinforcement to the microstructures particularly against damage by impact during handling and spotting processes involving mechanical needles. The hexagonal boundaries may be taller than the microstructures.

The textured surface shown in FIG. 2A further comprises additional nesting of structural elements, as shown in FIG. 2B. The microstructures illustrated in FIG. 2B are a plurality of pillars 20' in which the continuous walls that form hexagonal units, or microfeatures, are connected to each other through an etched channel 21'. This channel provides free fluid flow during binding (or hybridization) and aids the penetration of drops of a liquid by allowing replacement of entrapped air with the liquid. In this example, the width of the hexagonal walls is about 2 microns. The dimensions of the microfeature functioning, in part, as a mechanical reinforcement are determined relative to the microstructures by an aspect ratio. In certain preferred embodiments, the aspect ratio of the microfeature is greater than the aspect ratio of the microstructures, which in this example are represented by pillars.

The aspect ratio is defined as an average cross-section width divided by the depth or height. In an exemplary embodiment (illustrated in FIG. 2B), the aspect ratio of the pillars for a 5 micron deep etch is 0.2 (1/5) and the aspect ratio of the hexagonal walls is 0.4 (2/5). To illustrate the increase in surface that the microfeatures and microstructures provide, assume a flat surface area in each hexagon shown in FIG. 2B is about 540 sq. microns. Thus, if a hexagonal microfeature consisted of about 100 pillars (microstructures) in one micron diameter, which are etched to a depth of about 5 microns, the surface area is about 2500 sq. microns, assuming that the etch is smooth and no surface roughness is created on the pillars or on the sides of the hexagonal walls. The additional surface is created (540 sq. microns to about 2500 sq. microns) by utilizing the third dimension into the substrate. Generally, the substrates of the present invention provide a surface area that is increased by at least about 20% as compared to a nontextured surface. In other embodiments, the substrates demonstrate at least about 100% increase in surface area relative to a non-textured surface.

Generally, the aspect ratio of each microfeature is less than about 100, more preferably less than about 5 and most preferably less than about 1. In further embodiments, the microfeatures have a height of about 0.1 to about 100 microns. In embodiments that involve microfeatures that are isolated structures, such as pillars (prisms), cones and pyramids, they are further characterized by an average cross-section of about 0.01 to about 500 sq. microns. As mentioned, it is contemplated that the microfeatures may be of various sizes and shapes, and, therefore, each microfeature may posses a different aspect ratio, height and/or cross-section. Alternatively, at least one of the microfeatures is continuous, such as a wall that forms a shape at a macro-level (i.e., the walls that form the hexagon in FIG. 1C). The skilled artisan recognizes that the physical parameter used to characterize the microfeatures depends on the shape of the microfeature. For example, a wall is defined as having a characteristic height or a characteristic width, and a micro-rod is defined as having a,characteristic height or a characteristic cross-section. Determining which physical characteristic(s) is appropriate for a specific shape and/or structure is within the scope of one of ordinary skill in the art.

As discussed, the shape of or the cross-section of the microfeatures and/or microstructures are not limited to regular shapes, such as rectangular, square, triangular, hexagonal, circular, elliptical, and include irregularly shaped structures such as, a cone, a pyramid, a trapezoid, or any other shape that changes cross-section with depth as long as the structure provides for a non-planar topography to the surface. Further, the microfeatures and/or microstructures on a textured surface are not homogeneous for a single structure. For example, a textured surface may comprise a combination of shapes, sizes and dimensions, such as comprising cones, squares, and pillars, each having a specific aspect ratio.

The pillars in FIG. 2B are arranged in a regular pattern, however, this is not necessary, provided the average surface area from one array element to the next is similar, unless vaned intentionally. In other words, the variation in the surface area between the array elements is preferably less than about 10%, and more preferably is less than about 5%. In certain embodiments, the microstructures are placed randomly to minimize diffraction effects. This randomness includes varying the size of the microfeatures and/or microstructures. Although the pillars and walls are depicted as vertical, other incline angles are contemplated. The microfeatures having an average surface area over several tens of microns facilitate the tooling process and provide a cost-efficient process.

The substrate of the present invention comprises a material that is a glass, a ceramic, a metal, a non-metal, or a polymer. For example, a polymer includes injection molded or compression molded plastics, such as polystyrene polycarbonate, acrylic, nylon, polyolefin and silicone. One of ordinary skill in the art recognizes that the material is selected, in part, based on compatibility with the reagents employed in downstream processing and determining compatibility is within the ability of that skilled artisan and the scope of routine experimentation. The net shape of the substrate is conducive to the equipment that is used to analyze the analytes on the finished product. As an example, it is common to use a glass slide (usually 25 mm×75 mm). This slide is bar coded, as a one or two-dimensional code, or etched to provide a unique identification marker. Alternatively, a CD or a mini-CD form is used as the substrate and CD reader systems that are known in the art are employed to obtain analytical information.

In a specific embodiment, the microfeatures and/or microstructures comprise a material, such as a glass, a ceramic, a metal, a non-metal, an inorganic oxide or a polymer. In certain embodiments, it may be desired that the material of the microfeatures and/or microstructures is different from the material of the substrate. Thus, the material of the substrate may be the same as or different from the material of the microfeatures and/or microstructures. A non-limiting example of the former is if the microfeatures are etched directly into the surface of the substrate, then the material of the microfeature is the same as the material of the substrate. Alternatively, if the microfeatures are formed onto the surface of the substrate, then the material of the microfeature is different from the material of the substrate. An example of a non-metal material is carbon coating which is diamond like in its optical and chemical properties.

In certain embodiments, the microfeatures are etched into the surface of the substrate. Etching processes, which are discussed below, provide microfeatures in the shape of, for example, a pit, a trench, a pillar, a cone, a well, a tube, or a channel. For example, the substrate is a glass substrate that is coated to etch selective areas using a corrosive wet-chemical solution by spraying, smearing, dipping, spinning, meniscus or other methods that provide a textured surface. Non-limiting examples of etching processes include corrosion, ablation, abrasion, reaction, impact, drilling and dissolving. In specific embodiments, in which deep trenches are desired, etching deep trenches is performed by an anisotropic etch process, which is a type of dry etch process and a variation of a Bosch process, that provides microfeatures and/or microstructures having an aspect ratio of 1:100 (width to depth). The smoothness of the walls and etch rate are varied depending primarily on the choice of gas composition, pressure, flow rate, plasma energy and substrate bias.

In other embodiments, the microfeatures are formed on the surface of the substrate. Forming processes are discussed below and provide microfeatures in the shape of, for example, a rod, a pillar, a cone, or a wall. In certain embodiments, the microfeatures are formed of an inorganic oxide such as tungsten oxide, silica, zirconia, alumina, titania, tantala, zinc oxide, nickel oxide, magnesium oxide, calcium oxide, boron oxide, potassium oxide, sodium oxide, chromium oxide, tin oxide, lithium oxide, lead oxide, phosphorous oxide or a mixture thereof. In specific embodiments, the surface of the microfeatures comprise an inorganic oxide. This is accomplished by generating microfeatures on the surface of a substrate and then coating the microfeatures with an inorganic oxide or the like.

When the microfeatures are formed, the surfaces can be smooth or rough. In specific embodiments that involve a rough surface, the roughness yields micropits. The micropits, i.e., open voids, are defined as those with dimensions of about ⅕th, preferably about ⅒th and most preferably about 1/20th the size of the smallest of the designed microfeature and/or microstructure, such as the average pillar dimension in FIG. 2A. This structural hierarchy ensures improved accessibility of a molecule (i.e., a probe, a target) to the microfeatures and/or to the microstructures and/or to the textured surface.

The texture on the surface of the substrates of the present invention is characterized by having a peak-to-valley value of greater than about 10 nm, more preferably of greater than about 100 nm, or most preferably of greater than about 1000 nm. The peak-to-valley value indicates the unevenness exhibited by the textured surface. For example, a pit that has a base surface provides a minimum measurement and an adjacent microfeature, such as a micro-rod that has a specific height, provides a maximum measurement. The difference in these two measurements is the peak-to-valley value. Alternatively, the minimum measurement relative to the plane normal to the initial surface provides the peak-to-valley value, or, similarly, the maximum measurement relative to the plane normal to the initial surface provides the peak-to-valley value.

The high surface area results from the presence of microfeatures and/or microstructures, including open channels such as trenches, walls, closed channels, communicable pores or voids, pillars, micro-rods and pits. The closed channels are defined by structures that are tubular, have an even or a non-even cross-section and maintain at least a minimum cross-sectional area. In preferred embodiments, the channels have a width of less than about 300 nm, and more preferably a width of less than about 150 nm. In specific embodiments, the channels are exposed on the surface as open ends, and in other specific embodiments, the channels are beneath the surface of the substrate, such as to communicate with each other and voids, if present.

In certain embodiments, at least one, and preferably the majority, of the channels are accessible from the outside by fluids. For example, a coating comprising closely packed random spheres results in interconnected pores below the first layer of spheres (interstitial spaces), such as a coating made out of colloidal particles of, for example, silica. In certain embodiments of the present invention, the coating is etched through the thickness or selectively deposited in patterns to form open channels, which are open to the surface and are able to communicate with the pores. In other embodiments, the channel is created such that it is buried under the surface and communicates with adjacent pores and, thus, in specific embodiments, does not require etching of the coating.

Other structural elements contribute to the increase in surface area, such as, for example, surface roughness of the microfeatures. The surface roughness is defined where the surface is uneven on a scale typically less than 100 nm, or preferably less than 10 nm, both in substrate plane and normal to the substrate plane. In specific embodiments, the unevenness, which is quantitated in certain embodiments as a peak-to-valley value, results from depositing non-planar particles on the surface, or from making pit structures by either removing a substrate material from local regions or by depositing an additional layer of a material that is then patterned. Micropits have been described for individual reaction sites (see, Kikuchi et al., 1999).

Figure 7A:
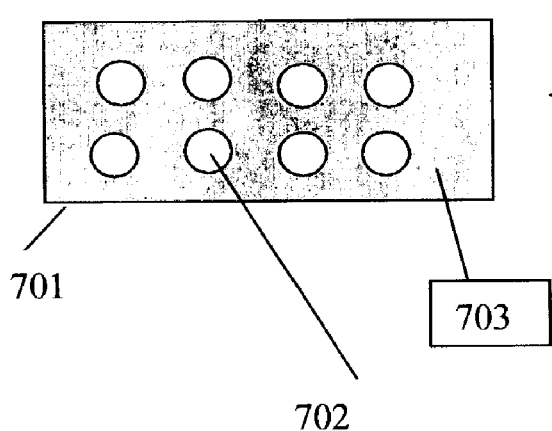
FIGS. 7A to 7C shows a high throughput microarray system that includes a substrate 701 and reaction wells 702 separated by hydrophobic regions 703 (FIG. 7A); the well comprises microfeatures 7021 and 7023 (FIG. 7B), and microstructures (FIG. 7C)
Figure 7B:
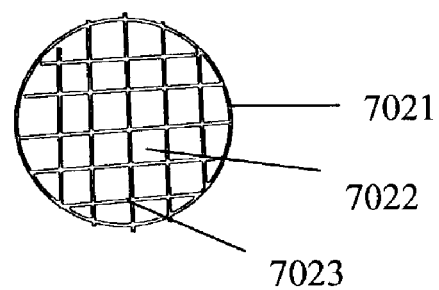
Figure 7C:
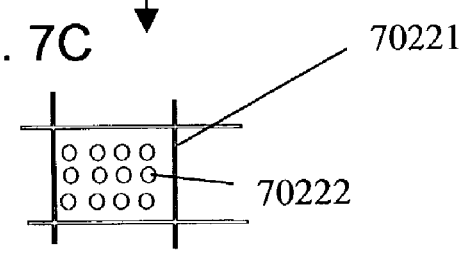

FIGS. 7A to 7C illustrate an exemplary substrate for use in a high throughput assay system. High throughput implies that each substrate has a plurality of defined regions or reaction wells, wherein each reaction well exhibits a specific biochemical and/or chemical characteristic. These reaction wells allow simultaneous analysis of several probe/target combinations in one step. Substrate 701 comprises a plurality of circular wells 702, and each well functions as a reaction chamber with respect to a specific biomolecule. These individual reaction wells are typically 7 mm in diameter for a 96 chamber well plate and are smaller for a higher number of wells on a plate, such as in a micro-well plate (i.e., a titer-well plate). In a specific embodiment, the regions separating the wells 703 are hydrophobic to prevent cross-contamination between reaction chambers. The wells shown in this example are circular in shape and have vertical walls, however, any convenient geometry is contemplated (see, for example, Van Den Doel et al., 1999). It is contemplated that the spatially discrete regions on the surface of the substrates of the present invention are wells.

One well of the present invention is shown in more detail as 7021 in FIG. 7B. The well further comprises microfeatures illustrated as walls, 7022 and 7023. In specific embodiments, the area comprising the top edge of the wall 7023 is hydrophobic. An expanded view of a cell formed by the microfeatures is shown as 70221 in FIG. 7C. The cell further comprises microstructures indicated as dots, 70222 (i.e., top of micro-rods, cones or pillars) that are attached (i.e., integral) to the base of the cell, as shown by their cross-section image. The microstructures 70222 and the walls 7023 increase the surface area in each well 702. Spacing between each microstructure 70222 is about equivalent to its cross-sectional dimension to allow ready flow and/or access of fluids and movement of biomolecules, including macromolecules such as proteins to the structural elements on the textured surface.

The well 702, which is a single region on the surface, comprises a plurality of microfeatures and/or microstructures, each of which are smaller in size than the well. In certain embodiments of preparing a microarray, an array element may comprise the well 702, and because, for example, the bottom surface of the well is textured, the array element, in a physical sense, is textured.

The textured array element allows for local replications of measurements because each microfeature may be statistically analyzed. This texture provides an increase in the signal intensity afforded by microarrays prepared from the substrates of the present invention as compared to conventional microarrays. Further, any of the plurality of microfeatures in the textured array element function as a well-defined boundary for the array element. For example, when a liquid volume is spotted on a flat surface to prepare an array element, the liquid spreads as it is drying and thus forms random concentrations within the array element making determination of the outermost boundary difficult and imprecise. However, when a liquid volume is spotted on a textured surface of the present invention to prepare an array element, the boundary is defined by at least one of the microfeatures therein. Having a well-defined boundary promotes more accurate analytical capacity of a microarray prepared from a substrate of the present invention. Moreover, each microfeature dries independently of the other microfeatures which will provide uniformity on a scale of one microfeature to the other. Further, the presence of a well-defined boundary also increases the uniformity of a signal intensity observed among the local replications of measurements because a surface area of the textured array element is increased without a proportional increase, if any at all, in surface size as compared to a non-textured array element.

In certain embodiments, all of the structural elements desired on the surface are processed in one step by preparing a pattern for an exposure mask that comprises a template for the microfeatures and/or microstructures desired on the surface.

In certain embodiments, the substrate further comprises an activating material that is coated on at least one of the plurality of microfeatures, which may include the interior of the microfeature. Generally, the activating material effects a surface modification that preferably permits immobilization of a biomolecule of interest on the textured surface of the substrate. The biomolecule is immobilized by methods well known in the art of biochemistry and organic chemistry and includes, for example, employing a covalent or a non-covalent attachment of the biomolecule to the textured surface. The nature of the biomolecule is discussed further below and may include at least one of a nucleic acid, an oligonucleotide, a peptide, a polypeptide, a protein, an enzyme, a cell, an organelle, a lipid, a carbohydrate, a fat, a vitamin, a nutrient, or an antibody.

In such cases that the activating material is a coating, the activating material has an iso-electric point (IEP) equal to or greater than about 4, and preferably equal to or greater than about 5. The activating material is either an organic or an inorganic material. For example, the actuating material may comprise a silane, a metal oxide, streptavidin, salicylhydroxamic acid (SHA), a hydrazine, an aldehyde, a ketone, an ester, an amide, poly(ethyleneimine), polyamide, polyacrylamide, nitrocellulose, an organic molecule having at least one free amino group, or derivatives thereof provided the material functions to immobilize the desired biomolecule. Examples of a suitable silane include molecules and/or compounds that further comprise an amino group, a mercaptan or an epoxy group. Examples of suitable metal oxides (i.e., inorganic material) include tungsten oxide, silica, zirconia, alumina, titania, tantala, zinc oxide, nickel oxide, magnesium oxide, calcium oxide, boron oxide, potassium oxide, sodium oxide, chromium oxide, tin oxide, lithium oxide, lead oxide, or phosphorous oxide.

In further embodiments, the surface of the substrate is characterized by having different areas or regions on the textured surface that are coated with different activating materials (e.g., having different IEP values) to effect specific characteristics to specific regions on the textured surface.

In other embodiments of the present invention a substrate having a high surface area comprising a solid substrate, and coating layered on a surface of the substrate, wherein the coating comprised an inorganic oxide and a plurality of microchannels. The microchannels may form a connecting network of channels in the coating and provide an increase in surface area as compared to a coating having non-connecting channels. The micro-channels allow infusion of the structured layer with a fluid and/or fluids, such as a gas, a liquid, including liquid solutions or a fluid polymer. The structured coating (i.e., coating having microfeatures and/or microstructures) is formed by depositing (i.e., spin-coating, dip-coating, spraying) a material comprising an inorganic oxide and a removable fibrous template. The removable fibrous template comprises particles that are volatilized, degraded and/or decomposed at a temperature that is less than a flow temperature of the inorganic oxide, and once removed leaves behind voids and/or micro-channels with selected characteristics. Further, the term "fibrous" indicates that the particles exhibit a larger length dimension as compared to a width dimension. Specifically, the fiber aspect ratio of the removable fibrous template is greater than about 3, or greater than about 5. The length dimension is preferably about the thickness of the coating. One of ordinary skill in the art recognizes that the aspect ratio is a ratio and that although as used herein in certain embodiments as width or cross-section divided by length, the ratio may be calculated as length divided by cross-sectional width, and as such the preferred ratios are accordingly inverted. For example, the removable fibrous template having an aspect ratio of 3 or greater, defined as length to width, is equivalently encompassing a removable fibrous template having an aspect ratio of 0.3 or less, defined as width to length, without departing from the scope of the present invention.

The inorganic oxide of the coating comprises silica, zirconia, alumina, titania, tantala, zinc oxide, nickel oxide, magnesium oxide, calcium oxide, boron oxide, potassium oxide, sodium oxide, chromium oxide, tin oxide, lithium oxide, phosphorous oxide, tungsten oxide, lead oxide or a mixture thereof. The removable fibrous template comprises a peptide, latex, collagen, a glycol such as polyethelyene glycol and/or polyvinyl alcohol, an amine such as tristhylamine or an organic acid such as oxalic acid, malonic acid, succinic acid, glutaric acid and/or adipic acid.

In certain embodiments, the removable fibrous template comprises fibrous particles and non-fibrous particles, i.e., particles that are characterized by having a shape of a sphere, an ellipse, a disc or any other shape that is regular or irregular provided that the non-fibrous particle functions as a removable template. It is contemplated that the plurality of particles comprise fibrous-shaped particles in about equal proportion (volume ratio of about 1:1) to the non-fibrous particles, however, any proportion is contemplated that effects the necessary communication of the microchannels within the coating, including a volume ratio in the range of, for example, 10:1 to 1:10.

In an exemplary embodiment, the coating layer is formed mixing and/or reacting the removable fibrous template, (optionally further comprising the removable non-fibrous template) with the precursor for the inorganic coating. This formulation is deposited by a wet chemical method, such as those discussed herein, on the surface of a substrate by, for example, a sol-gel process, and then the coated surface is dried under ambient conditions to remove the carrier solvent. The coated surface is heated to decompose the precursor leading to formation of the inorganic oxide and to burn off (i.e., volatilize, remove, decompose) the removable fibrous and/or non-fibrous template leading to the formation of the micro-channels (i.e., communicating microfeatures). It is understood that the oxide structure is formed first, at least to the extent that the oxide is sufficiently rigid so as not to collapse when the micro-channels are formed.

The removable template may comprise removable organic moieties, which include organic compounds such as lower carbon acids such as oxalic, malonic, succinic, glutaric and adipic acids, lower carbon bases such as formamide and higher boiling lower carbon alcohols such as glycerol. The organic moiety possesses a decomposition temperature sufficiently greater than the temperature at which the carrier solvent is removed, or must have a vapor pressure sufficiently low at the temperature at which the carrier solvent is removed, that its molecules remain integral with the precursor coating which is formed as the solvent evaporates to form a precursor/organic moiety matrix and to assure the ultimate proper formation of a void micro-channel or void. It is also necessary, however, that the organic moiety have a decomposition temperature less than or equal to the "firing" or "curing" temperature at which the precursor coating is substantially converted to an inorganic coating, or have a vapor pressure sufficiently high at or below the conversion temperature so that decomposition or evaporation of the organic moiety occurs prior to or concurrently with the establishment of the metallic oxide structure. The metallic oxide structure is typically established at temperatures lower than about 400° C., with 150° C. to 400° C. being most typical. The selection of a low carbon content organic moiety is relevant for the moieties which decompose to non-volatile residues, because entrapment in the oxide structure of too much foreign material such as carbon or equivalent residues may affect the optical quality, disturb the refractive index, and a variety of physical, chemical or functional properties.

In specific embodiments, these coatings are further patterned to generate microstructures and/or microfeatures thereon. For example, the coating is patterned to form wider channels on the surface, thereby giving better accessibility to the channels and/or voids below the surface. In certain embodiments, thin coatings (i.e., a thickness of less than about 500 mn, or preferably less then 100 nm) are employed to coat the structural elements on the textured surface to impart roughness and/or to further increase the binding capacity.

It is recognized that the features described for the substrates of the present invention are applicable to all other aspects of the present invention that incorporate such substrates.

2. Methods of Use

One embodiment of the present invention is directed to a microarray characterized by a high sensitivity for the analysis of chemicals, including biological molecules or biomolecules. In certain embodiments, a microarray comprises a substrate having a plurality of microfeatures arranged on a surface of the substrate to produce a texture on the surface, and the texture provides an increase in surface area as compared to a non-textured surface. In certain embodiments, the microfeatures are each in communication with at least one adjacent microfeature, and/or microstructure and ultimately with the textured surface. Methods to achieve the communication are discussed herein.

The three-dimensional arrangement is advantageous in that a high surface area is provided that, because of the accessibility of biomolecules, provides microarrays having fully realized increased surface area. In other words, a microarray prepared from a high surface area substrate of the present invention allows access of the biomolecule to the structural elements of the textured surface at a level that is substantially similar to the access provided by a non-textured (flat) surface. The accessibility afforded in this invention is particularly beneficial when the biological molecules, such as proteins, must alter their actual shape in order to perform their function. For example, a microarray for use in deoxyribonucleic acid (DNA) analysis is prepared by dispensing a solution containing DNA at a specific location on the substrate, also called spotting, such as an area encompassed by two of the hexagons of FIG. 1C, and, optionally each hexagon further comprising pillars, as shown in FIG. 2A. One spot defines an array element. Thus the array element is textured, which results, for example, from the continuous walls defining the hexagons and the plurality of pillars therein as illustrated in the FIGURES. The textured array element provides significant advantages over microarrays made with non-textured substrates and/or non-textured array elements because the microfeatures allow a plurality of local measurement (i.e., replicates) to be made in a single textured array element. The increase in data leads to an increase in signal intensity, precision and, thus, accuracy of an analysis (i.e., analytical accuracy) performed on a high surface area substrate of the present invention. Further, the textured array elements of the present invention improve uniformity in the signal intensity, which includes improved consistency in qualitative and/or quantitative characteristics of the measured, detected, determined signal.

To facilitate immobilization of the DNA in the solution to the textured surface, the substrate, the substrate offers good wettability, or hydrophilicity, so that the contact angle of the drop to the substrate is about 90 degrees or less, or preferably about 30 degrees or less, thereby allowing each drop to spread out on the surface and cover a larger area. Thus, the drops are dispensed in a volume that prevents cross-contamination from mixing when the spreading occurs. This constraint in the prior art leads to dispensing the drops far enough apart so that mixing does not occur and, thus, decreases sample loading capacity. However, the microfeatures described herein alleviate this constraint in the prior art because the microfeatures provide an increased sample loading capacity, and, in certain embodiments, also provide physical barriers to contain the fluids. Further, the increased binding capacity comes from the increased area from the walls in the third dimension and its morphology (porosity, roughness, etc) as the fluids dry or the carrier solvent evaporates. Thus, more dilute sample solutions may be used because an increased number of target molecules are immobilized on the textured surface and are not wasted in a washing step, and, consequently, less sample quantity is required. There are several geometrical aspects of microstructures and microfeatures that play a role in wetting for a given surface material and/or fluid due to capillary forces (For example, see Wu, S. et al., 1982). In certain embodiments, it is desired that the microfeature and/or microstructure do not have sharp corners or high energy points. Heating of the liquids and/or the substrate may be necessary to change the surface tension and/or adsorption characteristics to promote better wetting and/or spreading. Assistance from mechanical forces such as ultrasonic vibration of the substrate and/or liquid dispenser may be required. If the underlying substrate has through porosity then vacuum/pressure may be used for promoting wetting and/or expulsion of fluids, respectively.

The microfeatures are arranged in spatially discrete regions, and the surfaces in these regions are defined by biological and/or chemical characteristics. One bio/chemical characteristic that defines a region is binding or capture mechanism for the target. For example, a biomolecule is bound differently in a region as compared to another region. Another characteristic is the nature of the biomolecule that is immobilized in a region. In other embodiments, a combination of both characteristics is employed, i.e., regions characterized by a specific surface characteristics, and within these regions are sub-regions that are characterized by a specific biomolecule that is immobilized on the surface. Alternatively, the microfeature and/or microstructure characteristics are altered such that the surface area is different in these regions. This allows different areas to be analyzed independently, e.g., by using different density optical filters or setting different threshold on gains and detection so that the less abundant probes or analytes are analyzed in one area, and the more abundant species are analyzed in another area, thereby allowing an overall higher dynamic range for analysis. For example, each discrete region may be the well 702 in FIG. 7A, and at least two or more regions are different in terms of microfeature/microstructures (i.e., density, depth, size) or of surface activation.

In a particularly preferred embodiment, the substrate comprises plurality of microfeatures that are arranged in spatially discrete regions uniformly on a surface, such that the microfeatures form a pattern of square structures etched into the surface. The array element is formed by, for example, a fluid dispensing method, such as spotting methods that are well known in the art, is used to convey the analyte onto the surface of the substrate, e.g., as drops of analyte in a carrier fluid, and the area on the surface that is covered by a single drop forms a respective array element. These wells, such as represented in FIG. 1A, are advantageously smaller than the dimensions of the array element to alleviate alignment constraints on the dispenser. Thus, the printability of the substrate is maintained at a higher resolution than the capability of the dispensing mechanism, i.e., the drop dispenser need not be aligned to a specific position relative to each well.

Figure 1B:
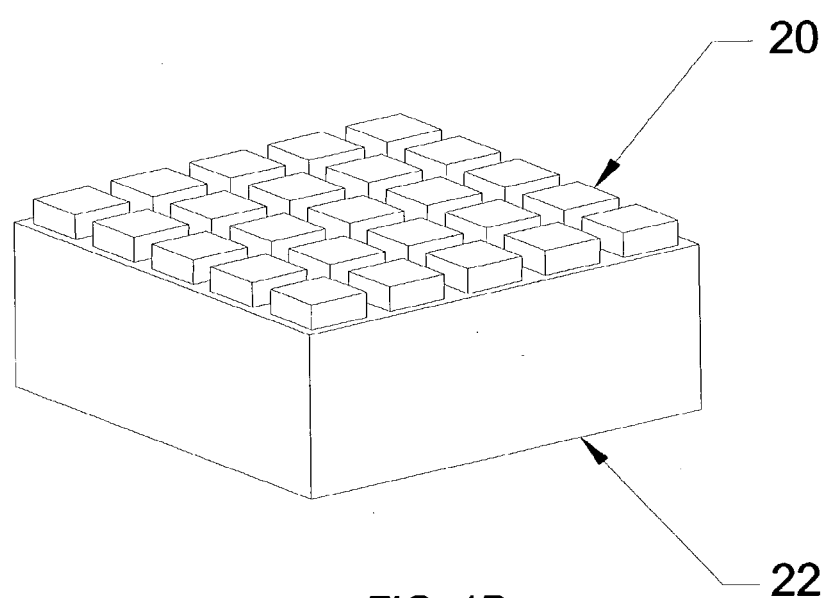
Figure 1C:
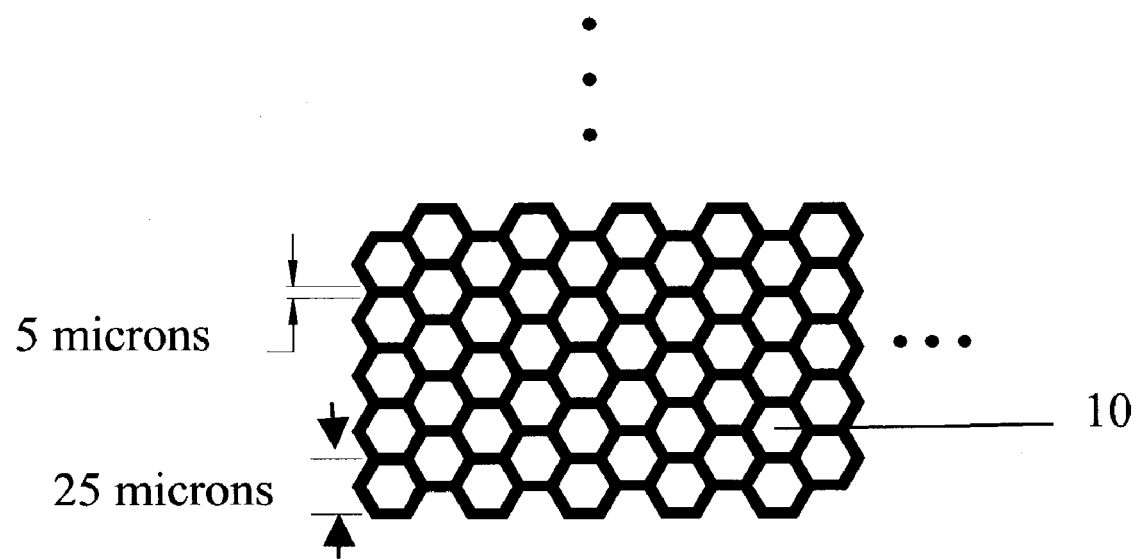

The drop spreads on the surface because of surface tension and gravity during the time taken to dry on the surface of a flat, smooth and impermeable (conventional) substrate. During this process, the analyte concentration changes within the different areas of the drop (e.g., the center relative to the edges). When a microarray made by this process is examined, the array elements within themselves and also amongst themselves are not evenly distributed resulting in a random and unpredictable concentration gradients in terms of attachment to the surface, which also varies with analyte solution properties and the additives used. The spread of the droplet on a surface of the present invention is controlled to some extent by the same factors as for conventional surfaces and strongly by the physical capacity of these wells. As more surface area and volume is available per unit projected area as compared to a conventional surface, the array element size is smaller, which allows higher packing density of spots/area. Further, in certain embodiments, a wall of the wells clearly define the edge or boundary of the textured array element, thus, the boundaries are more distinctly defined, which aids in clearly distinguishing each array element, permits less cross-contamination amongst the array elements. The size and the spread are less dependent on the solution properties. Moreover, each well (microfeature) will dry independently of the other wells which will provide high uniformity within each array-element on a scale of these wells. Alternatively, the textured array element comprises at least two hexagons, such as illustrated in FIG. 1C, and a wall of the first hexagon serves as a boundary and a wall of the second hexagon serves as a boundary. Such embodiments are contemplated when the volume spotted is greater than the holdings volume of a single microfeature.

However, though an array element may comprise more than one microfeature, it is understood that the drop of a different sample is separated by at least one microfeature, for example, a wall, a crest or a trench. Typically, the volume of each dispensed droplet to form an array element is about 1 nanoliter. Assuming no evaporation, a liquid sample of this volume that is spread uniformly over a flat surface in a circular shape having a diameter of 350 microns, has a height of about 10 microns. For a feature height of 10 microns (i.e., a continuous wall defining the boundary of a microfeature), it is possible for the array element to be 350 microns in size. Because the size of the microfeature is typically less than 100 microns, more preferably in a range of 5 to 50 microns, this array element size permits many microfeatures in each array element, i.e., to form a textured array element. Assuming a microfeature has a size of about 50 microns and also assuming that these consist of space filling hexagons, each array element will have about 60 microfeatures.

Because each array element has at least two microfeatures, and preferably several microfeatures (i.e., wells), each of the microfeatures may be imaged and then analyzed separately. For example, if an array element comprises 50 wells, then 50 different readings may be obtained. The data which may appear statistically erroneous or outside defined limits may be removed, and the data obtained from the wells forming a single array element is then combined, thereby resulting in superior quality data. As a result, analysis is precise and accurate. In conventional microarrays, several array elements are repeated on an array to achieve higher statistical confidence in the data. The latter improves the accuracy of these measurements by statistical manipulation of the data. In contrast, the present invention provides for the collecting data from multiple, consistent sub-sites within each array element, which permits statistical scanning software to enhance output images and results in better signal discrimination.

In certain embodiments, the imaging and/or analysis methods employed as described above includes an optical technique, such as imaging a fluorescent signal from the array elements. Other suitable analytical methods are contemplated and such methods are well known in the art, including, for example, laser mass desorption, which is analyzed using a mass spectrometer.

In a further embodiment, each of the plurality of wells are separated by hydrophobic regions. For example, the top surface of a wall such as 10 in FIG. 1C is hydrophobic, or a region 703 that separates microfeatures is hydrophobic (FIGS. 2 and 7, respectively).

In certain embodiments, the microarray comprising a high surface area substrate of the present invention comprises an activating material. The activating material is coated on at least one of the plurality of microfeatures, wherein the activating material functions to immobilize a biomolecule. Non-limiting examples of the biomolecule include a nucleic acid, an oligonucleotide, a peptide, a polypeptide, a protein, an enzyme, a cell, an organelle, a lipid, a carbohydrate, a fat, a vitamin, a nutrient, a pharmaceutical drug candidate, a halplen, a small organic molecule, or an antibody. To efficiently and effectively immobilize the biomolecule, the activating material preferably has an IEP of equal to or greater than about 4 so that the ionic property of the textured surface is positive, and/or comprises a covalent or a physical attachment by which to immobilize the biomolecule.

The microarrays of the present invention provide a high sensitivity to analyze chemicals, including biomolecules. Therefore, in certain embodiments, the present invention is directed to a method of detecting an analyte comprising applying a sample to a microarray device of the present invention; binding the sample to at least one biomolecule that is immobilized on the device; and detecting the binding, wherein the binding indicates the presence of the analyte. In specific embodiments, the binding comprises hybridizing, reacting, coupling, linking, tethering, or coordinating the biomolecule to the sample and/or analyte. For example, a biomolecule that is a nucleic acid is typically considered to hybridize to a complementary nucleic acid. Alternatively, a peptide, a polypeptide or a protein is generally considered to capture, chemically couple or link with a reactive group on the biomolecule. In a specific embodiment, a plurality of pharmaceutical drug candidates are analyzed wherein the textured surface comprises enzymes and/or proteins of a healthy or diseased organism. Thus, the binding step is contemplated as a generic interaction that is specific to the biomolecule and analyte pair.

In specific embodiments, the probe is coupled directly or indirectly with chemical groups that provide a signal for detection, such as chemiluminescent molecules, or enzymes which catalyze the production of chemiluminsecent molecules, or fluorescent molecules like fluorescein or cy5, or a time resolved fluorescent molecule like one of the chelated lanthanide metals, or a radioactive compound. In specific embodiments, the probe is labeled with a particle, such as a metal, quantum dots and dendrimers in order to provide for and/or facilitate signal detection. For example, a probe that is labeled with a fluorescent molecule is detected by a fluorescent signal. In preferred embodiments, the step of detecting is dependent on the chemical and biological properties of the probe, the analyte, their binding or a combination thereof. Thus, the detecting step includes light scattering, such as resonance light scattering, a radioactive signal, an electronic signal and/or mass desorption. In a specific embodiment, the detection is achieved by electronic discrimination, that includes determining a change in mass, capacitance, resistance, inductance or a combination thereof as compared to a control. In other specific embodiments, the analyte is a small molecule, a biomolecule, a macromolecule, a particle, or a cell.

In an alternative embodiment, the textured surfaces of a substrate of the present invention are used in a bioreactor. One specific type of bioreactor that is contemplated is a lab-on a chip device. The lab-on-chip device is known in the art and is described by Kopf-Sill et al., 1997. Specifically, these devices comprise a substrate having microscopic channels, pumps, filters and reservoirs for fluid flow, separations and chemical reactions on a microscale. The reservoirs may consist of microfeatures and/or microstructures, e.g., as shown in FIG. 2B. As a result, the lab-on-a-chip device has an increased surface area on which or in which reactions may occur that results from the substrate comprising at least one reservoir. The reservoir comprises communicating microfeatures that provide a textured surface in the reservoir. The textured surface increases the surface area by at least about 100% as compared to a flat, non-textured, or non-communicating surface. The reservoirs for lab-on-a-chip are typically connected with the inlet and/or outlet channel(s); one channel may function as both the inlet and the outlet or two different channels may be present, wherein one channel is the inlet and the other channel is the outlet.

Figure 9:
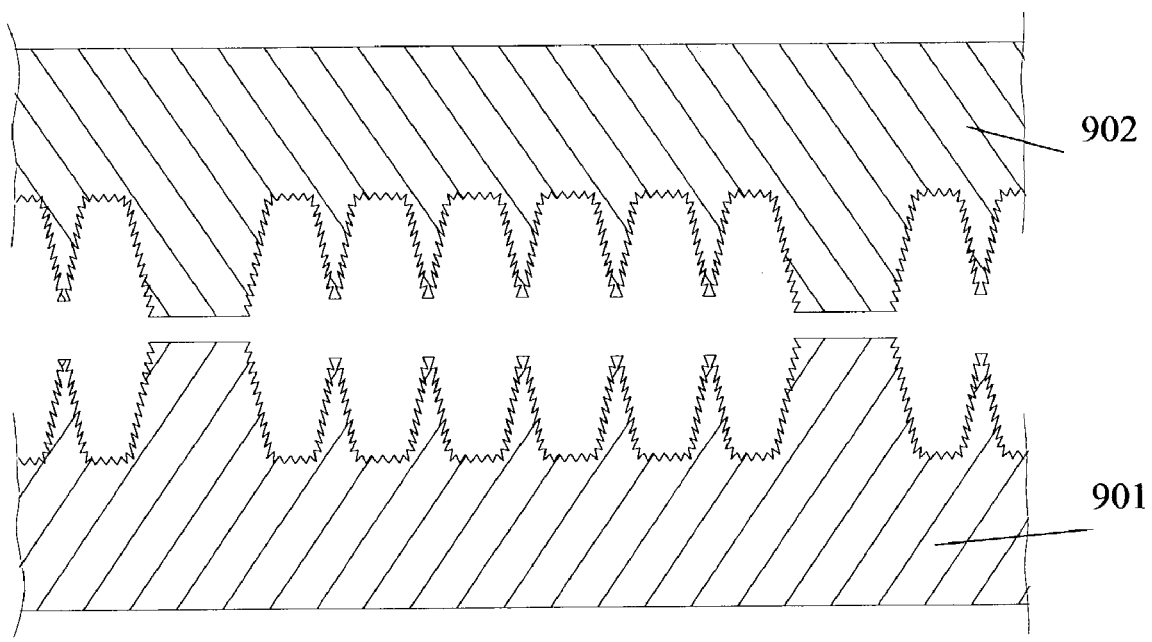
FIG. 9 illustrates two substrates having wells comprising microfeatures and microstructures that are in direct contact to form a high-throughput cell.

In an exemplary embodiment, in FIG. 9 the textured surfaces of two substrates of the present invention are placed in contact such that the textured surface are facing each other. A hybridization solution or washing fluid is dispensed into a space between the "sandwiched" substrates. This space allows communication between the microfeatures of the textured surface of the reservoir. When these substrates are moved past one another mechanically or manually, the microstructures/microfeatures work as stirrers to promote mixing and, hence, improve precision of results by facilitating the reaction/washing processes taking place therein. The mixing is promoted because the reaction chamber comprises a plurality of structural elements integral to at least one surface of the reaction chamber, and the action of moving the textured substrates past one another creates a microscopic movement of fluid resulting from the presence of the microfeatures and/or microstructures.

In an additional embodiment of a bioreactor, the sandwich assembly of two inwardly facing textured substrates is viewed as complex multipath flow chamber. Liquid introduced at one location flows by a plurality of parallel paths to any other location. This liquid is able to interact with biological molecules that are attached to the surface of the textured surface. Any reaction products are carried away by the flow of the liquid. Additionally, a plurality of these sandwich assemblies may be made such that fluid flows from one sandwich assembly to the next, i.e., in series. Alternatively, plates comprising microfeatures are also used to assemble bioreactors. The surfaces of the microfeatures in the above-described sandwich are treated to permit attachment of cells, and, further, the size of the microfeature may be optimized for the cell being attached. Alternatively, several of these plates may be sandwiched together (e.g., microstructured side facing the non-microstructured side) and through holes may be drilled into the substrates at the diagonal ends. These are placed so that the fluid has to flow across the plate to enter the next plate and so on. Once the cells are in place, the liquids carry reagents which interact with the cells to produce new entities, which are harvested from the fluid exiting the bioreactors.

The high surface area reservoirs provided herein extend the utility of the reservoir because surface chemistry of the walls in the reservoir participate significantly in the interaction with the fluids and/or reaction reagents. In specific embodiments, a surface of each of the plurality of microstructures and/or microfeatures are coated with one of a reactant or a catalyst, thereby promoting reactions at the modified surface. The reservoirs may also promote fractionation and/or may be used as filters, particularly in embodiments where the distance between the microstructures is small, which results in blocking a compound or molecule of a particular size (i.e., such as an impurity) but passing of compounds and/or molecules smaller than this size (i.e., reactants). In specific embodiments, the spacing (distance) between adjacent microstructures may be graduated from the inlet to the outlet (e.g., going from larger to smaller) to trap different sized particles at different places and, thus, providing high capacity filters. The reactions occurring may be facilitated by mechanically perturbing the microfeatures and/or microstructures using, for example, ultrasonic energy coupling or electrical methods. In an alternative embodiment, the reaction is facilitated by an electrochemical method that involves having electrodes in the reaction chamber and in contact with the microstructure.

In another embodiment of the present invention, the substrates are used for high throughput screening of small sample volumes. This is particularly important in analyzing samples that are expensive or difficult to obtain. The method of analysis includes identifying, detecting, determining, measuring, or screening for a compound of interest. In a specific embodiment, the analysis process involves a binding or hybridizing step in which a molecule that is immobilized on the surface of the textured surface selectively binds to a molecule that is in the small volume of sample. Conventional devices used for such analyses have circular wells that are typically molded in plastics, are about 500 microns or more deep and are designed to be devoid of structural elements, such as microfeatures and/or microstructures. Thus, in the binding step, the wells of a conventional array element are filled with a sample containing probes and then covered with a glass slide, which requires about 0.019 ml of sample volume.

One improved modification of these conventional wells is described in U.S. Pat. No. 6,232,066 and U.S. Pat. No. 6,238,869 which discloses a reaction chamber that at the bottom surface are wells patterned thereon to spot and form microarrays consisting of several targets. However, these reaction chambers are large, comprise a single array element and alignment of a drop dispenser is required to form the array element. In contrast, in an analytical device prepared from a substrate of the present invention, the bottom surface of the well is textured with microfeatures and/or microstructures, as described herein, so that each array element encompasses several structural elements and, thus, affords all the advantages discussed above.

In another embodiment of the present invention, the well size may be reduced such that the sample volume (i.e., probe solution volume) requirements are reduced substantially, i.e., to less than about 10 microliter, and preferably to less than about 1 microliter. By way of example, a well plate is prepared from the substrate of the present invention in which the reaction wells comprise etched microfeatures, with or without microstructures, on a flat surface covering circular areas similar in diameter to the wells which are used for high throughput analysis. When the texture of this invention is formed on the surface in a 7 mm diameter circle by etching to a depth of 20 microns, the amount of liquid that the well can hold is about 0.00038 ml (0.38 microliter) as compared to the 0.019ml (19 microliter) calculated for conventional microarray devices. This assumes that about half of the etched volume in each circular region is occupied by the microfeatures and/or the microstructures. In other embodiments, a smaller diameter reaction well is used, such as for a reaction well diameter that is 10 times smaller, the sample volume per cell is about 100 times smaller. Thus, for a 1024 well plate system (a micro-well plate) fabricated by methods of the present invention, sample volumes of about 10 nl are contemplated.

The substrates comprising three dimensional structural elements of the present invention are more suitable for synthesizing polynucleotides from monomers using photo-activated reactions and masks (i.e., see, for example, U.S. Pat. No. 5,445,934) as compared to synthesizing on porous substrates because the array elements are defined clearly along the boundary of at least one microfeature. Further, the areas of the present invention may be masked without the adverse consequence of stray light leaking or material between various array elements. The substrates of the present invention are further suitable for in situ synthesis of oligonucleotides by a process involving 5' to 3' synthesis using reverse phosphoramidite chemistry. Specifically, the substrates are suitable for generating a microarray by the process of scanning array, known in the art, in which the array is built using a diamond shaped reaction chamber that moves along the glass surface adding one by one the nucleotides of the anti-sense sequence to the target genetic material.

3. Methods of Manufacture

Certain embodiments of the present invention are directed to a method of preparing a substrate having a high surface area for use in a microarray comprising covering a surface of the substrate with a coating material; and patterning the coating material to form a microfeature and/or a microstructure.

There are many coating formulations that are suitable for the present invention, and include materials comprising a photoresist polymer, a metal, a non-metal and/or a ceramic. Further, the step of patterning comprises methods well known in the art, including ablating, depositing, dispensing, etching, embossing, forming (i.e., molding), growing, photolithography, machining (i.e., cutting, drilling, indenting or fracturing), printing and wet chemical deposition, such as sol-gel processes.

In specific embodiments, the coating material comprised a metal, and exemplary embodiments comprise an inorganic oxide solution that is deposited by a wet-chemical coating method. The coating solution comprises an inorganic precursor having at least one of Al, Si, Ti, Zr, B, Ca, K, Na, Li, Pb, Sn, Cr, W, Ni, Mg, Zn or P elements. In embodiments directed to a non-metal coating, such as an organic coating material, consolidation by drying and/or curing after the patterning step is contemplated. Non-limiting examples of precursors used to deposit coating material solutions include tetraethyl ortho silicate (TEOS), methyl triethoxy silane, aluminum tert-sec-butoxide, titanium(IV)isopropoxide, zirconium(IV)isopropoxide, boron isopropoxide, potassium ethoxide, lithium ethoxide, lithium hydroxide, sodium ethoxide, phosphoesters and phosphate esters. These materials are dispensed in an alcohol based solvent, i.e., ethanol, partially hydrolyzed and condensed before deposition (see, C. J. Brinker and G. W. Scherer, 1990). Coating materials that are modified with organic compounds, such as those described by Mackenzie and Bescher, 1998, are also contemplated.

In certain embodiments, it may be desirable to apply an adhesion promoter, which is a material that facilitates and/or promotes the adhesion of the coating material to the surface of the substrate, to the surface followed by the coating material that is patterned. In such embodiments, the coating material comprises more than one type of material. In another specific embodiment involving the coating material comprising more than one type of material, the coating material comprises a mixture of inorganic oxides to, for example, obtain a desired iso-electric point. Mixture of materials and iso-electric points are discussed in more detail below.

In a specific embodiment, embossing is employed to pattern the surface. For example, a well plate or a micro-well plate, a green ceramic, a glass composition, or a polymer comprising a thermoplastic or thermoset polymer, is applied to the surface of the substrate. The method of applying includes, but is not limited to, a sol-gel process or a wet chemical process comprising, for example, spraying, dipping, spinning, meniscus, or depositing. While the coating is soft, unconsolidated, or green, a tool resembling a negative microfeature (i.e. the inverse or female of the structure desired on the surface) is used to emboss the coating employing methods well known in the art, such as applying pressure and/or heat or photolithography to set the embossed microfeatures. The setting step allows permanent capture of the microfeatures and is conducive to large volume and cost-effective manufacturing of the substrates.

Alternatively, an un-fired sol-gel coating is embossed with a tool, such as a stamper, to generate microfeatures and subjected to a low heat treatment temperature to partially cure or consolidate the coating in the patterned form. The tool is removed and the substrate is heated to a higher temperature to preserve the structure of the microfeatures. The curing of the coating at the first heat treatment (i.e., partially cured step) is preferably performed for a time that does not relax or smooth the pattern. In alternative embodiment, the coating is partially cured using radiation. Because ultraviolet radiation allows curing to be accomplished in a few seconds, the throughput with a single tool is high. In a specific embodiment, the sol-gel coating formulations described above are modified to allow for UV- or photo-curing. For example, methacrylic or an acrylic silane and a UV initiator such as Irgacure™ 184, Darocur™ 1173 (from Ciba Specialty chemicals, Hawthorne, N.Y.) are added to the one of the wet-chemical formulations described above. The embossing of sol-gel deposited coatings is well-known in the art, such as described in A. Matsuda, Y. Matsuno, S. Kataoko, S. Katayama, T. Tsuno, N. Tohge and T. Minami, "Pregrooving on Glass Disks by the Sol-Gel Method (Part1)—Formation and Evaluation of Pregrooved Glass Disks" Proceedings SPIE. Volume 1328 pages 62 to 70 (1990); and Yoshinobu, M., et.al., "Sol-gel technology for Optical Disk Application", Proceedings SPIE. Volume 1758 page 105 (1992).

In specific embodiments, the embossing tool used to define the microfeatures and/or the microstructures of the present invention is prepared in the following manner. A photoresist coating is deposited on a substrate (i.e., glass, quartz). The photoresist coating is exposed to an appropriate source of light through a mask or writing with a laser on the coated surface leaving exposed areas that are later solubilized. This process generates pits in the photoresist layer. A thin layer of silver is deposited by physical vapor deposition conforming to the features (including pitted areas) in the photoresist layer, and nickel is grown on top of the silver layer by dipping the surface into a solution of nickel sulfamate. The nickel layer has a thickness that is sufficient to permeate the pits and form a continuous backing on the photoresist. The previously deposited silver acts as the separation layer between the nickel layer and the substrate with a pitted photoresist. The nickel mask made above is used to create another nickel mask that is its reverse image, termed the "mother". The mother is used to create additional reverse images that are then preferably used as stamps to pattern the substrates of the present invention.

In an alternative embodiment, a photoresist is used to pattern and form the microfeatures. For example, the substrate is covered with a photo-resist polymer and selectively exposed to define regions that microfeatures are to be generated. The photoresist in the exposed area is washed away (i.e., dissolved, depolymerized), and the substrate is coated with a precursor solution comprising the material with which the microfeatures are later generated, such as the sol-gel solutions described herein. The coating of precursor solution is deposited (or adheres to) only on those areas in which the photoresist was removed in the earlier step. Photolithography has been used throughout this invention in reference to the standard techniques practiced in the art. This also includes imprint lithography where finer features may be required (e.g., see Resnick, D. J. et.al., 2002).

Alternatively, a photoimagible sol-gel solution is used to coat the substrate. The photoimagible sol-gel solution is made using similar methods as described for preparing the photocurable coating. The solution is coated on the substrate and imaged using radiation to partially cure the exposed areas. The substrate is then subjected to a washing solution in which the unexposed areas are washed. The remaining photo-resist forms the spatially discrete regions that separate the microfeatures, which is optionally consolidated in a subsequent heating step. This latter heating step is useful to burn (remove) organic matter. For example, U.S. Pat. No. 6,054,253 describes a sol-gel photoresist to make optical components, which is herein incorporated by reference.

Choosing a suitable coating material for generating structural elements on the substrate involve consideration of the detection and/or analytical methods employed. It is known that inorganics and inorganic/organic hybrids offer low fluorescence characteristics. Because higher refractive indices (RI) increase reflection of light, the fluorescent signal may be increased, consequently. Employing oxides allow control of the RI of the coating material. For example, a $SiO_2$ coating formed using TEOS exhibits a refractive index of about 1.4, and a $TiO_2$ coating formed using titanium tetra-n-butoxide exhibits a refractive index of about 2.3. Further, mixing these two precursors in any ratio provides refractive indices between about 1.4 and about 2.3. It is known in the art that consideration that a higher RI causes increased reflection of ultraviolet light, thereby increasing a fluorescent signal. The RI is increased further by incorporating precursors that add lead oxide to the coating. Further, in specific embodiments, the coating material composition is tailored to more closely resemble the elements found in body tissues (i.e., incorporation of calcium oxide) to increase compatibility of biological materials.

Another important factor for coatings that are patterned is porosity. For purposes of RI, increasing porosity, lowers the RI. Porosity, includes for example, the void size, which has a significant impact on how the compounds dispensed on the surface interact. In a specific embodiment, the coating material effects the void surface characteristics such that the surface is enriched for hydroxyl content. The enrichment facilitates hydrogen bonding with water molecules and, thus, provides a natural environment for a protein thereby preventing denaturation. Further, the size may be designed so that only an biomolecule of a specific size is able to enter, thereby providing a molecular selectivity mechanism. In another embodiment, the coating comprises embedded receptors, such as liposomes which are only accessed by specifically sized molecules, e.g., viruses.

The porous coatings, as used herein, are employed to provide a plurality of microfeatures. For example, a liquid precursor for a porous coating is applied to substrate with pre-formed wells as in FIG. 1B. After consolidation, the porous coatings fill the wells. Alternatively, the porous coating is deposited on the substrate, which is then selectively etched to produce raised features, such as pyramids, truncated pyramids, cylinders, or prisms. FIG. 1B shows such a surface of a substrate 20 that is first coated with a porous coating 22 and then etched to generate square prisms. The etched areas function to expose the substrate, which is non porous, and, thus, act as natural regions separating microfeatures. Further, the separations are relatively wide channels (typically greater than 0.1 microns in size) and allow better access to (i.e., communication between) the voids (i.e., microstructures) in each of the microfeatures. The microstructure defines a separation area to ensure that the voids within one microfeature, do not communicate with the voids of another microfeature, i.e. to avoid lateral wicking. Alternatively, in the latter, the regions between the porous microfeatures are covered with a hydrophobic material.

A common method of preparing porous sol-gel coatings employs organic templates or salts, either on a molecular level or at a particulate level (Stein, A., et.al., 2001). At the molecular level, polymers or small molecules are reacted with the precursors of the sol-gel materials (Zhao, D., et al., 1998). At the particulate level, particles of polymers (i.e., latex particles) are mixed with the precursors, which may also be in a particulate form, such as colloidal silica (See, for example, WO 00/61282). After the coating is formed, it is heated to higher temperatures to burn off the organic matter leaving the voids. For example, the sol-gel formulations based on the mixed oxide network of silicon and titanium dioxide may be formed through sol-gel processing starting with, for example, their respective alkoxides such as tetraorthosilicate and titanium n-butoxide. Alternative derivatives and/or precursor forms may be used to replace the alkoxide forms and include peroxides, nitrates, chlorides, acetates and colloidal particles. By varying the ratio of Si:Ti in the coating and controlling the degree of hydrolysis and of condensation prior to deposition, the morphology and coating properties may be controlled.

An important attribute of the sol-gel formulation is the ability to form relative thick (several microns) coatings having voids without stress cracking. This may be achieved using methods well known in the art, such as the addition of a drying control agent as described in U.S. Pat. No. 5,525,264, or a polymeric template to the formulation such as polyethylene glycol (PEG). In such embodiments, the optimum average molecular number ($M_n$) of the PEG and its concentration relative to the other components in the formulation are optimized to give the desired performance and void size. In specific embodiments involving the sol-gel solutions that result in a porous material, the pre-firing or initial treatment is performed under humid conditions to prevent collapse of the voids while the matrix is still weak. The humid pre-treatment may even be performed under pressure such as in a autoclave. Non-limiting examples of organic polymer materials used to form the porous coating are forming foams or crosslinked networks that swell when they are in contact with a probe- and/or a target-carrying solution (i.e., aqueous solutions), such as polyacrylamide gels, derivatives thereof, and the like.

In an exemplary embodiment of the present invention, a substrate is coated with a photoresist polymer that is further layered with a mask. A mask is any material that functions as a cover and permits, upon exposure through, definition of an exposed area and/or an unexposed area. It is contemplated that the masked surface generates a plurality of microfeatures, such as hollow channels. In a preferred embodiment, the masked photoresist surface is exposed to initiate decomposition of the photoresist polymer in the exposed areas. The exposed surface is then rinsed and/or washed with a solvent that readily dissolves the partially decomposed polyer (i.e., in exposed areas). Thus, the unexposed areas still comprises the photoresist polymer. At this step, the artisan has many options, including etching in which the covered (unexposed) areas are protected from etching if the photoresist polymer is etch-resistant; forming micro-rods using methods described below in the exposed areas; removing the residual photoresist material from the unexposed areas; or any combination of these steps.

For example, after the disolution of the partially decomposed photoresist polymer, the exposed area is etched to afford a high surface area surface comprising a plurality of microfeatures that are trenches, pits, microchannels and/or walls and are arranged on the surface as determined by the mask employed. Then, optimally, the residual photoresist polymer is removed from the unexposed areas, which are on the textured surface, the top surface of the microfeatures, or alternatively, are the spaces separating the microfeatures. Alternatively, after etching, micro-rods are formed in the etched microfeatures, and optimally, followed by removing the residual photoresist polymer in the unexposed areas. The suitable combination of methods employed to pattern the coating material, which, as illustrated above, includes removing selective areas of the coating material, is determined based on the structural elements desired, and such determination is within the skill of one of ordinary skill in the art. It is also contemplated that an activating material may be applied at any step in the process, as the activating material may or may not be further patterned to provide microfeatures and/or microstructures; the application of activating materials is discussed further below.

It is contemplated that is certain embodiments identification marks are desired on the substrates. Such marks may be applied using the step of patterning and include special marks that are used as references for a scanning sensors. These special marks include information about the sample and are in the form of one or two-dimensional bar codes.

In one embodiment, there is provided a method of preparing a substrate having a high surface area for a microarray comprising molding the substrate and a plurality of microfeatures with a molding material in a single step. These types of molding processes are well known in the art and have been employed, for example, in the manufacture of compact disc. As applied herein, the compression molding is useful if thin and/or planar substrates of the present invention are desired. In contrast, injection molding allows preparation of, for example, a well plate or a micro-well plate. The molding material is generally a plastic, which includes a material that comprises a polycarbonate, an acrylic, polystyrene, nylon, a polyolefin, or a silicone.

An exemplary high surface area substrate generated by the molding process comprises the plurality of microfeatures in spatially discrete regions, which comprise wells. In certain embodiments, the bottom of each well is further characterized by a plurality of microstructures that are integral to the bottom surface and are smaller in dimension than each of the plurality of microfeatures therein. The presence of the microstructures on the bottom surface of a well is particularly suitable for application involving high throughput analysis. It is also contemplated that any of these structural elements may be embossed, if not molded during molding of the substrate. Further, the present invention contemplates that an actuating material is applied to at least one of the microfeatures and/or the microstructures if necessary to faciliate immobilization of a biomolecule thereon.

For example, the system depicted in FIGS. 7A to 7C represents a substrate having a plurality of reaction wells on its surface that is suitable for high throughput analysis. The methods and compositions for surface activation is discussed in the next section. Each of the reaction wells, 702 in FIG. 7A, function as separate microarrays into which a different fluid is introduced for a specific reaction. The assembly comprises several combinations of arrays and reactive fluids that are each evaluated independently, thereby defining a high throughput analysis. Within each reaction well, there are microfeatures shown as compartments defined by vertical boundaries on a scale of about 10 to about 100 microns. These structures are open to provide ready access to fluids and components therein and in certain embodiments are molded in a single step. Further, the individual wells comprise a plurality of microstructures 70222 that are present within the boundary walls, which provide additional surface area and ready access to fluids and components therein. In an exemplary example of producing a substrate of the present invention by molding, all of the reaction wells, the microfeatures and the microstructures such as illustrated in FIGS. 7A–7C, are formed in a single molding step. Alternatively, a well plate or a microwell plate is embossed to generate a plurality of microfeatures on the bottom surface and/or wall of at least one, preferably several, of the wells.

In certain embodiments, the textured surfaces and/or the substrates to which the target is bound are metallic. The use of metals have advantages, particularly if optical methods or electrical methods are used for analysis thereof. Optical reflection from the metals causes a very low background as there is no fluorescence from the back side (Che, et al., 2001). An electrically conductive surface may be used to address an array element on the textured surface. Alternatively, the electrically conductive, textured surface may be energized by applying voltage to assist in hybridization (Peterson, et al, 2001). However, binding of biomolecules to metallic surfaces is difficult. To overcome this potential inefficiency, a sol-gel coating comprising a mercaptan functionalized silane is applied to the surface or, alternatively, the biomolecules themselves are functionalized with a mercaptan. It is well known in the art that mercaptans bond well to metals and one of ordinary skill in the art is aware of methods and compositions that effect this bonding mechanism. Alternatively, the surface is treated with a mercaptan-based primer, followed by another coating such as an inorganic oxide. Non-limiting examples of suitable metals include gold, silver, chrome, aluminum, rhodium, nickel, tantalum, stainless steel and their alloys. Alternatively, the coating is an organo-silane based primer coating, which results in bonding of the inorganic part of the silane to the first coating and availability of the organic part of the silane for binding a compound, such as a receptor. Many silanes are available commercially, and include Silquest®, Dynasil® and Hydrosil®. Suitable coatings comprise active groups, such as, for example, vinyl and photoinitiators, which facilitate binding after exposure to radiation. Immobilizing a molecule by such methods preferably involves modifying the molecule with a chromophore, such as vinyl termination groups, which reacts with the active groups of the coating.

The use of metal substrates includes both the use of metal substrates and of substrates coated with a metal. The metal substrates may be made by combining more than one metal in an alloy form or may be made from layers of different metals mixed with non-metals. Similarly, the coatings may consist of several layers of metals and non-metals. Some examples are a silicon substrate with a non-metallic $SiO_2$ coating, a glass or silicon surface with chrome, gold or rhodium coating. An example of multi-layer coating is titanium layer that is deposited on a glass substrate, followed by depositing a gold layer. The presence of the sandwiched titanium layer improves the adhesion between the gold and the glass substrate. Metal layers may be patterned to make electronically addressable electrodes or addressable array-elements. In certain specific embodiments, this oxidized surface is further modified by depositing a coating on the surface to, for example, generate a microfeature and/or a microstructure.

Several methods to form coatings are well known in the art, and the two most commonly used methods are deposition of a material, or treatment of the substrate to form a layer by a chemical reaction. Oxidizing a metal surface is achieved by methods that are well known in the art and include, heat treatment, corona treatment, plasma treatment, chemical treatment and anodization. For example, a surface of an Si wafer is readily oxidized by heating in the presence of air or an oxygen-containing gas to about 1000° C. The surface may also be further treated with strong bases such as sodium hydroxide to form hydroxyl groups on the surface. The hydroxylated surface is further treated using standard methods that are known in the chemical arts to attach bio-molecules onto the glass surfaces.

Methods of depositing a metal are well known in the art, and non-limiting examples include physical vapor deposition, such as sputtering and evaporation, chemical vapor deposition, plasma-assisted deposition, electro-deposition and chemical deposition, such as electrodeless deposition. Thickness of layers is less any which will give the desired electrical, optical or any other desired properties. For optical reflection, high electrical conductivity and uniform coverage it is common to use layers in a thickness range of about 10 to 1000 nm, and preferably less than about 100 nm. In certain embodiments, a metal layer is applied to a flat or textured surface. In a preferred specific embodiment, the metal is deposited on a textured surface.

In specific embodiments, the structural elements of the textured surface, which provide the high surface area, are formed by etching or removal of material. Etching comprises corrosion, ablation, abrasion, reaction, impact, drilling, or dissolving. Etching may be carried out on monolithic substrates, layered composites, or by forming coatings and selectively etching them with or without the underlying substrate. Etching may be used to produce various regions on a surface, each having a specific surface area. For example, each region is etched differentially to provide specific depths. After etching, the surfaces may be further treated with an activating material or surface coating. For example, each of the areas 702 in FIGS. 7A to 7C comprise different sizes, different etch features, different depths or different activation coatings, e.g., coatings having different IEP.

In preferred embodiments, etching is achieved by a wet-etch or by dry etching. A wet etch process involves using a corrosive solution, such as, for example, hydrofluoric acid or hydrochloric acid. Wet etch processes are isotropic and do not yield deep cuts (i.e., heights, depths) in relationship to the etched width. Dry etch process use ions which may etch reactively and /or by impact (sputtering). Thus, in embodiments that desire deeper etching of the surface, anisotropic etching is used. Anisotropic etching is a dry process that involves mainly a Bosch process and variations thereof. Anisotropic etching provides microfeatures having an aspect ratio of 1:100 (width to depth) using activated gases, also called reactive ion etching (RIE). Several types of reactive ion etching systems are known in the art, including, for example, advanced oxide etch (AOE), deep reactive ion etching (DRIE; Khanna et al., 2001), inductively coupled plasma (ICP), and the like. A wet etch process resulting in anisotropic etching may be done by a coating or the substrate material which changes its phase upon exposure to UV in the radiated areas. These areas are easily etched by solutions in further steps. A substrate material with such characteristics and its processing guidelines are available from Schott Glass under the trade name of Foturan®. A skilled artisan is aware of methods and systems available to perform anisotropic etching processes.

By way of example, a wet-etch process under clean-room conditions involves the steps of cleaning a substrate, for example, by exposing the surface to an acidic and then a basic detergent. Alternatively the substrate is cleaned using a peroxide to remove surface oxide layers (see, Meyer, et al., 1999). A layer of mask material is then deposited, which comprises a photoresist, a metal (i.e., chrome), a non-metal (i.e., carbon to provide a diamond-like coating) or a ceramic (i.e., silicon nitride). If chrome or a ceramic material is deposited, then the deposition is followed by a photoresist layer, as described below. The photoresist process typically consists of applying a primer layer for adhesion followed by applying the photoresist layer.

Specifically, a thin layer of a hydrophobic primer is coated onto the surface of the substrate in a vapor or a liquid form; the primer to ensure good adhesion of the photoresist to the surface. Non-limiting examples of suitable hydrophobic primers include hexamethyldisilazane (HMDS) primer produced by ShinetsuMicrosi (Tempe, Ariz.) or a cholrodimethyl silane or a cholrotrimethyl silane deposited from about a 1 to about 10% solution in hexane, heptane, octane, or any suitable volatile solvent. The primer is deposited by spin coating or by a vapor phase method. A positive photoresist is then deposited by spin coating to provide the photoresist having a thickness of about 0.5 to about 3 microns. The coating heated at 90° C. to about 115° C. for a minute about 30 minutes. Following the heat treatment, the coated surface is exposed to ultraviolet light through a mask. The ultraviolet light is, for example, "I" line for an exposure of about 100 to 200 mJ/cm$^2$. The mask provides a template for generating the microfeatures, such as those in FIG. 1C. After developing, rinsing and heating the exposed coating, the substrate surface is protected in regions with a pattern of the photoresist layer. The substrate is sent for etching in the next step. on the substrate it is etched using an aqueous HF solution to form the microfeatures. The photoresist pattern is then stripped from the surface, and the substrate having microfeatures is optionally activated with a silane primer.

Alternatively, a mask comprising chrome or silicon nitride is used for patterning a surface. Such materials are typically employed in many ICP and RIE processes and the specific type is dependent on the RIE process, particularly the choice of chemistry of the substrate and that of the etching gas. For example, a layer of chrome (about 150 to 300 nm) is deposited by physical vapor deposition method prior to the steps of depositing the primer and the photoresist layers. After developing the photoresist, the chrome in the exposed areas is dissolved in an acid bath. The residual photoresist is then stripped leaving the pattern in chrome on the surface. As a non-limiting example, $CF_4$ gas may be used. $CF_4$ shows higher selectivity or etches silicate faster as compared to chrome. Other species may be used and such are know to those of skill in the art. Non-limiting examples include oxygen and argon. The substrate is then subjected to a dry etching process that preferentially etches only the non-masked areas, in a direction generally perpendicular to the surface. The residual chrome is then cleaned and either rinsed with base and stored, or further activated with an activator for subsequent production of a microarray.

As mentioned, ICP and RIE processes employ etchant gases, which include, but are not limited to, argon, oxygen, helium, chlorine, $SF_6$, $CF_4$ and $C_4F_8$. Mixtures of these gases may also be used, and the compositions of which may be changed during the process. For example, an etching process may involve cleaning cycles that are performed at regular or irregular intervals or only after the end of the etching process. Alternatively, the etching gas comprises oxygen and or argon at near completion of an etching process in order to remove chemicals that were implanted on the surface during the etching process. Further, oxygen may be used to remove the mask which protected the areas from etching, thus eliminating a latter step of residual mask removal. In certain embodiments, after oxygen, ammonia is introduced to impart the surface modification involving amine groups, using ammonia plasma in the same processing step. Activating by chemically functionalizing the surface is one example of surface modification. Activating is typically accomplished through use of an activating gas, but may be performed in other ways known to those of skill in the art. Particularly useful in the present invention is the control of the smoothness of the surface of the features and etch rate afforded by anisotropic etching, which involves varying certain parameters, such as etchant gas, pressure and substrate bias and temperature. Alternatively, the surface roughness and porosity of a textured surface is controlled by a further electrochemical treatment to generate surface features. Electrochemical treatments for silicon are well-known in the art, such as described in Chan et al., 2000.

Figure 8:
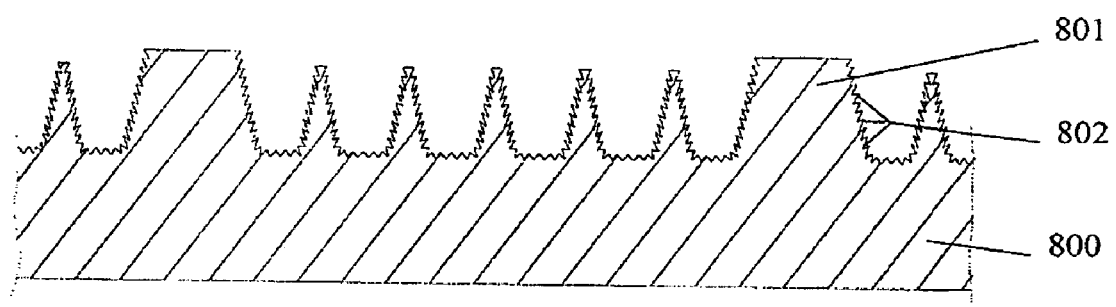
FIG. 8 shows a schematic side-view from a section of a high surface area substrate comprising microfeatures, 801 and microstructures 802, which have physical surface characteristics (represented by a jagged line)

Multiple etching steps or use of nested masks may be employed if the etching depth of different areas or different features is desired to be different. An example of this embodiment is where the pillar-like microstructures are smaller in height as compared to the boundary wall height of the microfeatures, as illustrated in FIG. 8. In certain embodiments, the pillar height is decreased by about 5 to about 20% as compared to the compartment boundary wall height, to prevent mechanical damage to the microstructure. This is done because the boundary wall of the microfeature is more robust as compared to the pillar shaped microstructures, and the mechanical contact with the substrate, such as with the spotting pins and handling, can be largely borne by these boundary walls. Additionally, we have observed that the non-etched flat tips of the pillars and the microstructure boundaries are more robust to mechanical damage as compared to when these areas are also etched into finer features.

Another embodiment of the present invention is directed to a method of preparing a substrate having a high surface area comprising the step of growing micro-rods on the surface. The micro-rods nucleate on the surface and then grow, and the material for the growth and/or the nucleation process is generally provided by a fluid medium surrounding the substrate. Generally these micro-rods are crystalline structures that first nucleate and then grow on the surface while submerged in a liquid medium. In a crystal growth process, the temperature of the medium and the concentration of the ingredients are important in controlling the rate of nucleation and growth. The resulting structural features may be further arranged in larger microstructures, as discussed herein.

One way to arrange the micro-rods is to grow them in spatially discrete regions that provide a pattern. An exemplary method of such comprising coating a surface of the substrate with a material (for example, a photoresist), exposing (to radiation, such as UV through a mask) a region of the coated surface to provide an exposed region and an unexposed region, wherein the exposing renders the material removable in the exposed region; removing the material from the exposed areas, and forming a micro-rod in at least one of the exposed region or the unexposed region, wherein the micro-rod provides the high surface area. This method allows micro-rods to be preferentially grown in a distinct pattern as defined by the pattern of exposed and the unexposed areas. The selectivity for the formation of the micro-rods is dependent on the surfaces such as photoresist or the substrate. In a further embodiment, the residual material in the unexposed region is removed.

Figure 5:
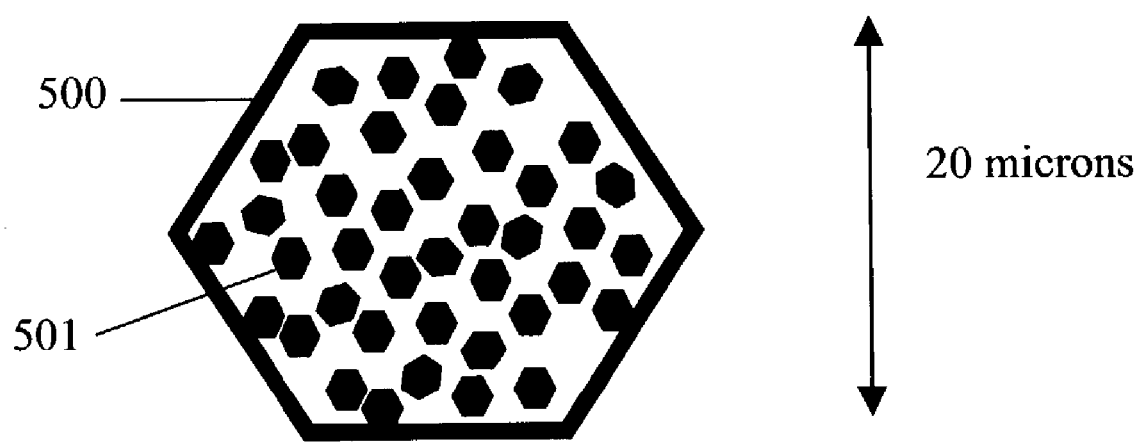
FIG. 5 is a mask having a pattern for use in forming a microfeature 500 and/or a microstructure 501 on a substrate.

FIG. 5 shows an example of micro-rods 401 as microstructures that are arranged within the hexagonal areas 400 but not in the boundary areas depicted in FIG. 1C. Thus, each forest of micro-rods is separated, and, thus, has a cross-section that is smaller, preferably by a factor of about 10, than each microfeature. The micro-rods have an aspect ratio of less than about 10, more preferably less than about 5, and most preferably, less than about 1.

The boundary comprises the exposed surface lacking micro-rods, or, alternatively, they can be walls that are non-porous or porous. Alternatively, the boundary walls are characterized by comprising a hydrophobic material. These boundaries separate each microfeature from the another and optionally, as shown in FIG. 5, are arranged in a pattern. The size of each pattern, hexagon in this case, corresponds to a discrete array element or, preferably, is smaller than the area occupied by a single array element. In certain embodiments, the surface is selectively covered with a material that inhibits the growth of the micro-rods. This type of structure is prepared by selectively masking some areas on the substrate by a photoresist and then burning or dissolving (stripping) the photoresist after the rods are grown. Alternatively, a material, such as a metal, is used that promotes the growth of the micro-rods. In a specific embodiment, the photo-resist remains permanently on the surface as a boundary (as depicted by the dark areas of FIG. 1C).

Microfeatures deposited on the substrate by printing methods are also contemplated. For example, a plurality of horizontal and vertical lines are deposited on the surface of the substrate, and are arranged in a grid (see, FIGS. 1A and 1B), and within each mesh of the grid, several microstructures are introduced. In a specific embodiment, a glass substrate is used and the grid is deposited by a printing method. A preferred printing method is screen printing, which creates walls having a height of a few microns to several hundred microns. Ceramic frits for screen printing on glass are available (e.g., from Ferro of Cleveland, Ohio), and polymers such as silicones, urethanes, acrylics and epoxies are available commercially. In specific embodiments, the material used in the screen printing process are designed so that they are screenable (e.g., viscosity is controlled with fillers such as fumed oxides that comprise silica, a mineral or glass powders). Materials characterized by having a low fluorescence are preferred. Other preferred printing methods are laser printing and inkjet printing. For example when laser printing is used, the thickness of the characters made by laser toner is about 5 to 10 microns thick, however, the thickness may be manipulated according to the application. Also a 2400 dpi printer results in a resolution of 10 microns, and a 10,000 dpi printer results in a resolution of 2.5 microns. 10,000 dpi is achievable by larger commercial printers. These resolutions are sufficient for several of the embodiments discussed here. The toner or ink formulations may be based on partially cured polymers (i.e., amine cured epoxies) and polymer solutions and sol-gel formulations, as discussed herein.

In another embodiment, electrode patterns are imprinted to address a microfeature and/or an array element. For example, one electrode, which is placed at the hexagonal boundaries, provides paths to accommodate electrodes to the edge of the chip, and a second electrode is placed in the central region, which comprises the micro-rods. Conductive coatings may be applied to nonconductive substrates, such as glass or substrates having a nonconductive layer thereon, such as silicon dioxide. The circuit is laid out to define the array elements and/or microfeatures and busbars to permit connection to an edge of the substrate where in turn they may be connected with wires or other methods to appropriate electronics.

By way of a non-limiting example, the circuit may be laid out by depositing a metal, such as chrome, on an insulating substrate. The chrome is etched to define the array elements and the paths. A photoresist layer is then coated on top of this and patterned to expose only those areas on the substrate (areas for array elements and/or microfeatures) in which the microfeatures are desired.

It is contemplated that the processing steps described herein represent particularly convenient modes of processing. However, one of ordinary skill in the art recognizes that other processing modes consistent with the teachings of this disclosure may be developed through the use of routine experimentation.

4. Surface Activation and Modification

The present invention involves the use of coatings for purposes of surface activation and/or surface modification. By the term "surface activation," it is meant that the substrates of the present invention are coated with an activating material. A suitable activating material permits the immobilization of a compound of interest to the textured surface of the substrate. By the term "surface modification," it is meant altering and/or changing a chemical characteristic of a surface, by applying a coating to, for example, effect a desired ionic property. In many embodiments, the activating materials and the surface modification coatings may be used interchangably.

In general, the material may comprise a silane, a metal oxide, streptavidin, salicylhydroxamic acid (SHA), a hydrazine, an aldehyde, a ketone, an ester, an amide, polyethylenimine, polyamide, polyacrylamide, nitrocellulose, an organic molecule having at least one free amino group, or derivatives thereof including branched and hyperbranched structures such as those described in Joon Won Park, et.al., 2002. In further specific embodiments, the silane comprises an amino group, a mercaptan, or an epoxy group, and the metal oxide comprises an inorganic oxide selected from the group consisting of tungsten oxide, silica, zirconia, alumina, titania, tantala, zinc oxide, nickel oxide, magnesium oxide, calcium oxide, boron oxide, potassium oxide, sodium oxide, chromium oxide, tin oxide, lithium oxide, lead oxide, phosphorous oxide or mixtures thereof. Also contemplated is the co-addition of oxides of monovalent ions such as sodium, potassium and lithium, in which the monovalent ion is selected based on the chemical alteration afforded, i.e., potassium imparts more basicity as compared to sodium, which is more basic as compared to lithium. It is understood that a monovalent ion is part of the material composition and is not used singularly. The activating material is applied using similar methods described herein that are used to apply surface coatings, i.e., wet-chemical, chemical vapor deposition, etc. In certain instances, the surface is cleaned prior to applying the activating material. Also contemplated are co-addition of oxides of monovalent ions, in which potassium imparts more basicity as compared to sodium, which is more basic as compared to lithium.

In a specific embodiment, the coating is modified with organic materials. In another specific embodiment, the coating is prepared from colloidal particles, and processed such that a high porosity and/or surface roughness is provided. In yet another specific embodiment, the IEP of tungsten oxide is increased by doping with basic ionic oxides, such as lithium oxide and sodium oxide. Methods to dope tungsten oxide coatings with alkali oxides and control porosity using a sol-gel method are well known in the art, such as is described in U.S. Pat. No. 6,266,127. In general, a suitable IEP value for a coating of the present invention is in the range of 0.2 to 12. In embodiments that involve an analyte that is a nucleic acid, a polynucleotide, a peptide, a protein or an enzyme, a preferred IEP value is between 4 and 10, and a more preferred IEP value is between 5 and 9 to avoid denaturation of the larger natural polymers. Further, it is contemplated that the IEP of a surface activation coating is modified by changing the compositions of inorganic oxide and/or dopants, as described herein, and these modification are made to selectively bind a specific analyte. In general, the modified compositions promote acid-base interactions between the coating material and the biomolecule for bonding.

In a specific embodiment that involves surface activation immobilization of a nucleic acid or any negatively charged molecule, a coating characterized by having a basic or cationic property is applied to the textured surface. Activating the textured surface of the substrate by treating with, for example, aminosilane provides the required electronic property because the amino group provides a cation that is available to coordinate to the DNA, or another negatively charged molecule.

In other embodiments, the cationic properties are imparted by applying oxide coatings that have appropriate iso-electric points (IEP). In such embodiments, the IEP is at least about 4, or is at least about 5. It is contemplated that transparent inorganic oxides are used in the methods and devices of the present invention in such embodiments that a specific IEP is desired because the transparent oxides allow the artisan to adjust to the desired IEP. The high IEP indicates that the activated surface is basic or cationic. Common transparent oxides that exhibit an IEP greater than about 7 include ZnO, MgO, NiO, and alumina (see also, Parks, G. A., 1965).

For example, a surface having a IEP of about 7 has a net positive charge, due to protonation, in medium below pH 7 and, conversely, has a net negative charge in medium above pH 7. The positive charge creates a surface field attraction to solution state DNA below about pH 7, but creates a repulsive field to solution state DNA above about pH 7. Thus, binding or hybridization is conducted below about pH 7 and washing is conducted at slightly above pH 7. It is known that binding of DNA to such surfaces, at or below pH 7, facilitates an increase of binding rate and affinity, and washing at a pH above the IEP reduces nonspecific binding, thus the analytical sensitivity increases by several fold. It is also known that DNA and proteins retain their natural state in aqueous solutions within a certain pH range due to their association with ions, which for several class of bio-molecules is in the range of about pH 4 to about pH 9. Thus, a coating in which the ionic association is substituted by the charged species on the surface of the coating to prevent denaturation of a molecule are contemplated for the present invention. These coatings are prepared by mixing more than one component, such as the inorganic oxides.

Alumina, zirconia, titania, tantala, and silica are good networking oxides. Further, amongst these alumina is most basic, zircona is closer to a neutral pH as compared to titanium oxide, and titanium oxide is more basic as compared to silica. Thus, in preferred embodiments the controlled IEP coatings comprise one of alumina, zirconia, titania, tantala, silica or a mixture thereof, and, in further embodiments, other oxides are added to obtain a desired IEP. Doping the coating with at least one inorganic oxide having a high IEP results in cationic coatings having strong interaction with nucleic acids. An example of a neutral dopant is chromium oxide. The dopant is added based on the ratio of cation mole ratio, which is preferably in the range of about 1 to about 50% of the matrix forming cations. Doped cationic coatings are sufficiently attractive to negatively charged molecules, and surfaces coated with them do not require an aminosilane. This is advantageous because the process steps are decreased and the fluorescence of the background remains low because of the absence of organics in the composition. Non-limiting examples of suitable dopants include zinc oxide, nickel oxide, magnesium oxide, calcium oxide, boron oxide, potassium oxide, sodium oxide, chromium oxide, tin oxide, and lithium oxide. In oxides of monovalent ions, typically potassium imparts more basicity as compared to sodium, which is more basic as compared to lithium. Also contemplated are single composition oxides such as of nickel, zinc, zirconium and aluminum. In one specific embodiment, crystals of zinc oxide may be grown on the three dimensional surface instead of (i.e., form micro-rods) applying a coating. Additional non-limiting examples of dopants include halide salts and nitrate salts. Organic salts may also be used as dopants in the present invention. Non-limiting examples of organic salts include cetyltrimethylammonium chloride, cetyldimethylethylammonium bromide, cetyltrimethylammonium bromide and octadecylamine hydrochloride. Other potential dopants useful in the present invention are recognized by those of skill in the art in light of the examples provided herein.

A preferred method of deposition is wet-chemical methods, which allow all the components of the coating to be mixed homogeneously before application. Further, if the coating is applied to the textured surface of the present invention, a conformal coating is readily obtained. The deposition of the coatings includes spraying, dipping, spinning, dispensing or chemical vapor deposition (CVD) processes, in which methods of spraying, dipping and spinning are well known in the art. In embodiments described above in which the structural elements are formed from the coating comprising an inorganic oxide with a desired surface property (such as IEP), one of ordinary skill in the art recognizes that after forming the structural elements, no further coating is needed for immobilizing a biomolecule. However, a significant difference between the coatings used for forming three dimensional structures and the coatings used for surface activation lies in terms of thickness. Coatings for surface activation are thin to prevent blocking, plugging, or reducing the space between the microstructures and/or microfeatures. Further, when the coating is applied on a textured surface for purposes of surface activation, it is preferred that the coatings neither fill in the gaps nor smooth the surface roughness of the underlying structures to an extent that leads to a reduction in the surface area and/or the dimensions of the microfeatures. In specific embodiments, a preferred thickness is below about 100 nm, and more preferably below about 10 nm. Desirable coatings of oxides for surface activation are usually between 1 to 200 nm, and more preferably between 10 and 100 nm. In embodiments that employ organic activation, which is described below, silanes and hyperbranched molecules are used, and the thickness of the coatings are generally below 10 nm.

In alternative embodiments that involve surface modification and/or surface activation, the coatings are textured and/or are porous or non-porous. Texturing and porosity of the coating layers further increase the surface area. Because the porosity in the coating is limited by the depth of its thickness, these pores are readily accessible to molecules including biomolecules. The porosity may be controlled by using reactive organic additives, colloidal particles, ablative particles, including both spherical and tubular shaped ablative particles.

Organic activation using silanes such as amino or epoxy silanes is contemplated in certain embodiments, however, other mechanisms may be used to activate the textured surface. One such method involves using streptavidin, which selectively binds to biotinylated oligonucleotides. Biotin and streptavidin form strong non-covalent bonds. Other examples include surface activation using a hydrazide modification to covalently bind carboxy modified oligonucleotides. Another activating group that has been used are mercaptans and ionic materials such as poly(ethyleneimine) (PEI). For example, attaching PEI to glass and silicon using silanized poly(ethyleneimine) has been described in U.S. Pat. No. 6,150,103, and is herein incorporated by reference. Density of the amines on the surface is controlled by employing, for example, the silanes and the aziridines leading to the hyperbranched structures that are described in Joon Won Park et al., 2002. Other polymers including polyamides and derivatives thereof and epoxy resins such as those described in WO 02/02585, which include a polyamido polyamine modified epoxy resin that is cured with tetraethylene pentaamine to provide a polycationic charged surface. Epoxy resins are cured with curatives that are commercially available, including polyamides, aliphatic, aromatic or cycloaliphatic amines. Alternatively, the surfaces are primed prior to application of the epoxy or other polymers. Other polymer coatings include Nylon 6, Nylon 66, polyacrylamide and nitrocellulose and derivatives thereof.

In other embodiments, the coating and/or activating material comprises a modified surface. The modified surface is generated by exposing a surface of the material to a surface modification process, such as reacting the atoms at the surface with a gas or ionized particles. Ion implantation processes are contemplated for altering surface characteristics and/or for activating a textured surface. Ion implantation involves treating the surface with a gas comprising high energy ions (e.g., by plasma), which are forced into the surface. High energy radiation such as ultraviolet energy and gamma rays are used to promote reactions with gases. A non-limiting example of a suitable surface modification process involves ionizing radiation, such as a plasma treatment, involving exposing the textured surface to an ammonia plasma, which leads the coupling of amine groups to the surface. The surface modification processes are applicable to any surface, including plastic, metal and glass surfaces.

Surface modification may be performed in those embodiments in which the surface is desired to be compatible with the biological molecules in order to promote binding. Such surface modification processes include several chemical and radiative methods that are well known in the art. Non-limiting examples of chemical treatments comprise treatment with strong acids, strong bases, flame treatment, oxidizing agents, ozone treatment or the like. Non-limiting examples of radiative processes comprise gamma ray treatment, corona discharge, photo-activation using UV, laser, ion-beam, electron beam or plasma treatment in gases, such as in oxygen, argon, fluorine, ammonia, or the like. The energetic species in gas plasma include ions, electrons, radicals, meta-stable species, photons, short wavelength UV, or the like. The bombardment of the surface with energetic species may result in etching, adhesion promotion, binding improvements of biological species, surface functionalization, barrier property modification, or other such alterations in chemical and/or physical characteristics. One of ordinary skill in the art is aware that bombardment processes involve consideration of parameters such as gas type, treatment power, treatment time and operating pressure, and the skilled artisan is also aware of methods well known in the art to determine these parameters for carrying out the process, such as described in AST Technical Journal- Ih-Houng Loh, Plasma Surface Modification in Biomedical Applications, (AST products Inc., Billerica, Mass.). Because ion implanted surfaces may offer etch-resistance, e.g., boron implantation in silicon, the process and resulting surface may be used as a mask for methods of the present invention that involve etching and/or defining patterns.

Surface modification and/or activation using a plasma treatment is contemplated. An advantage of a plasma treatment is the non-directionality, thereby promoting surface treatment encompassing all of the intricate patterns that are present on the textured surface. Plasma treatment has been described in T. C. Chang, Plasma Surface Treatment in Composites Manufacturing, J. of Industrial Technology, volume 15, no. 1, November 1998 to January 1999, in which oxygen plasma is demonstrated to be more effective in surface etching and the ammonia plasma is determined to be more effective in grafting the amine groups on the surface. Such use of two or more stage plasma process employing two or more different gases is contemplated as an effective method for modifying a surface and/or activating a surface of the present invention. Specifically, the oxygen plasma may cause a fine pitting of the structures created by molding, which leads to further increases in the surface area of the substrate. Following the oxygen plasma treatment with an ammonia plasma treatment, effects attachment of the surface to amine groups specifically important to bind proteins, polynucleotides, and the like. The plasma etching is carried out only to an extent in which the surfaces of fine patterns are etched and the structural integrity of the patterned features are preserved. This edge may also reduce the sharp edges on the microfeatures. For some applications, the chemical aspect of surface modification provided by oxygen in terms of increased surface area, increased surface cross-linking density and formation of oxidative groups such as carboxyl are sufficient. However, in embodiments requiring and/or desiring further modification, plasma treatments using mixed gases may also be used.

In an alternative embodiment, the surface composition of glass is altered by ion-exchange processes. It is well known in the art that optical waveguides are routinely fabricated by ion exchange (Ramaswamy, 1988). The ion exchange process is also used in the art to chemically strengthen glass by replacing ions such as sodium and lithium, which are at the surface, with larger ions such as potassium (see, for example, U.S. Pat. No. 4,483,700). In specific embodiments, this treatment increases the mechanical robustness of the surface and changes the inherent surface chemistry. This treatment may be applied uniformly to the entire surface of the substrate or selectively in pre-defined areas. In an exemplary embodiment, a glass substrate is etched to define the three-dimensional structural features to provide the textured surface, and then the textured surface is subjected to ion exchange to replace sodium with potassium. In another example involving conducting ion exchange in pre-defined areas, a substrate is covered with a mask (e.g., a titania coating) that, for example, comprises the pattern shown in FIG. 1C (dark areas). The titania coating is hydrophobic and resistant to ion exchange. The exposed areas are subjected to ion exchange thereby changing the surface ion structure in only those selected areas. The resulting micro-fabricated pattern of surface ion deposition is used for adsorption coupling of ionic surface probes (either nucleic acids or charged proteins). Alternatively, the patterned surface ions are used for electrostatic attraction or repulsive interaction of solution state targets.

In specific embodiments, it is desired to apply a coating to a microfeature and/or to a microstructure therein that is chemically different from the coating on at least one other microfeature. For example, a substrate 1 inch×3 inch has 8 regions, in which each region, such as 702 in FIG. 7, is characterized by having a coating of a specific IEP. A substrate having such a surface allows facile testing of an appropriate IEP that is optimal for subsequent experimentation. Further, the retention characteristics are specific for different regions, which extends the dynamic range of measurement by varying the concentration of attached biomolecules. This type of substrate is particularly suitable for microarrays that are designed to analyze proteins or in any instance that the analyte presents difficulty in establishing which type of surface is most suitable for binding.

A preferred method of coating these coatings is by dispensing wet-chemical process. Dispensing refers to a process that involves placing a discrete volume of a liquid on a surface of the substrate. For example, in FIG. 7A, a discrete volume is dispensed on each reaction wells 702. Alternatively, to some of these reaction wells, molecules are attached to the coating that are capable of forming a covalent linkage with a biomolecule, and the remaining sites provide an electrostatic attraction to attract the biomolecule to the surface and facilitate the binding process, thereby improving binding efficiency. Thus, this selective chemical modification of the specific areas on the surface of one integrated assembly expands the capabilities of the substrate to bind a broad range of biomolecules.

In certain embodiments, the surface is coated with dilute solutions, for example less than about 5% and preferably less than about 1% solids, to prevent plugging the open microfeatures and/or microstructures. In specific embodiments, the dilute coating solutions comprise silanes to promote adhesion. In specific embodiments, the thickness of the coating is less than 10 times the average distance between adjacent microfeatures to ensure that plugging of the open microfeatures and/or microstructures does not occur. Hybrid materials such as polycerams, i.e., combinations of organic and inorganic materials, are also contemplated.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

EXAMPLES

Example 1

Substrate Having an Accessible Microfeature

Figure 11A:
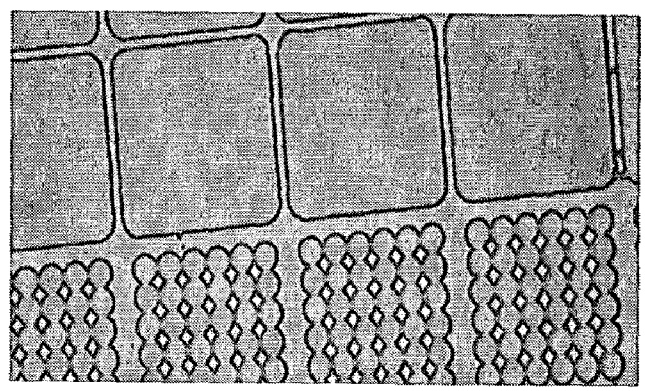
FIG. 11A to 11C shows high surface area substrates comprised of different types of textured surfaces.
Figure 11B:
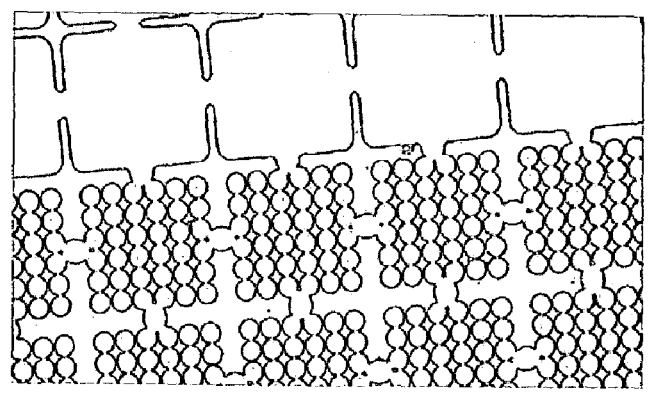
Figure 11C:
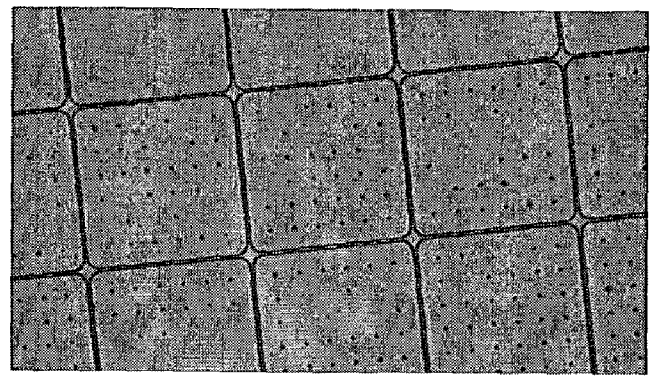

A sodalime silicate glass substrate B270 from Schott Glass (Yonkers, N.Y.) was cleaned and coated by evaporation with a 200 nanometer layer of chromium. The chromium layer was patterned using photolithographic methods to form a series of 7 mm diameter areas comprising nested structural elements, as illustrated in FIGS. 11A to 11C. Each area was patterned differently with respect to the size, shape, and/or density of microfeatures and/or microstructures that were generated in the area.

The chromium covered patterned substrate was acid etched by immersing in a 6 weight % hydrofluoric acid solution for 30 seconds and rinsed immediately with deionized water. The etch rate was 0.017 microns/second. The chromium was removed from the surface by placing the substrate in a hydrochloric acid (37 weight %) solution at 60° C. with the addition of a small chunk (~0.2 g) of aluminum as a catalyst. Analysis of the cleaned etched glass substrate by surface profilometry confirmed that the etched pattern had depths of 0.5 microns. Three of these patterns are shown in FIGS. 11A to 11C. These pictures are taken at the center using an optical microscope, where the top half have square wells, and the bottom half have square wells with pillar-type microstructures, further, the squares in FIG. 11A are connected by the breaks in the walls. The size of squares (the length of the sides) in all cases is 55 microns. The diamond areas inside the squares in FIGS. 11A and 11C are pillars, as are the dots in FIG. 11B.

Subsequently, each slide was rinsed with filtered deionized $H_2O$ followed by ethanol. They were then placed in a glass cleaning vessel with 10% weight/volume (w/v) NaOH in a 57% ethanol aqueous solution for 16 hours.

Example 2

Higher Surface Area Afforded by Substrate Comprising Microfeatures

The silanization process was performed on a textured surface of the substrates made in Example 1. After cleaning, the slides were immediately immersed in deionized $H_2O$ to prevent NaOH crystallization. The slides were then rinsed in ethanol and placed in a 50° C. oven to dry. A 1% (v/v) solution of 3-glycidoxypropyltrimethoxysilane in toluene was prepared in a glass vessel into which the slides were immersed for 16 hours. After silanization, the slides were rinsed with toluene and allowed to dry in a 50° C. oven. They were stored under vacuum in a desiccator until use.

The probe was applied in a 1/100 ratio of 5'-Cy3-3' amine oligonucleotide/'5 unlabeled-3' amine olignucleotide onto each feature in 1 µl spots at two final probe concentrations, 25 and 50 µM. Control spots were also placed onto the non-etched area of the slides (i.e., outside of the etched well) and on the non-etched control slides. The slides were placed in a humidity chamber for 1 hour and then removed and allowed to dry under ambient conditions. After the slides were dry, each was washed vigorously in a 50 ml conical using filtered, deionized $H_2O$ and, again, allowed to air dry. The slides were imaged in an Arrayworx E microarray imager under Cy3 excitation and emission filters. Intensity values were taken for each spot.

Figure 12:
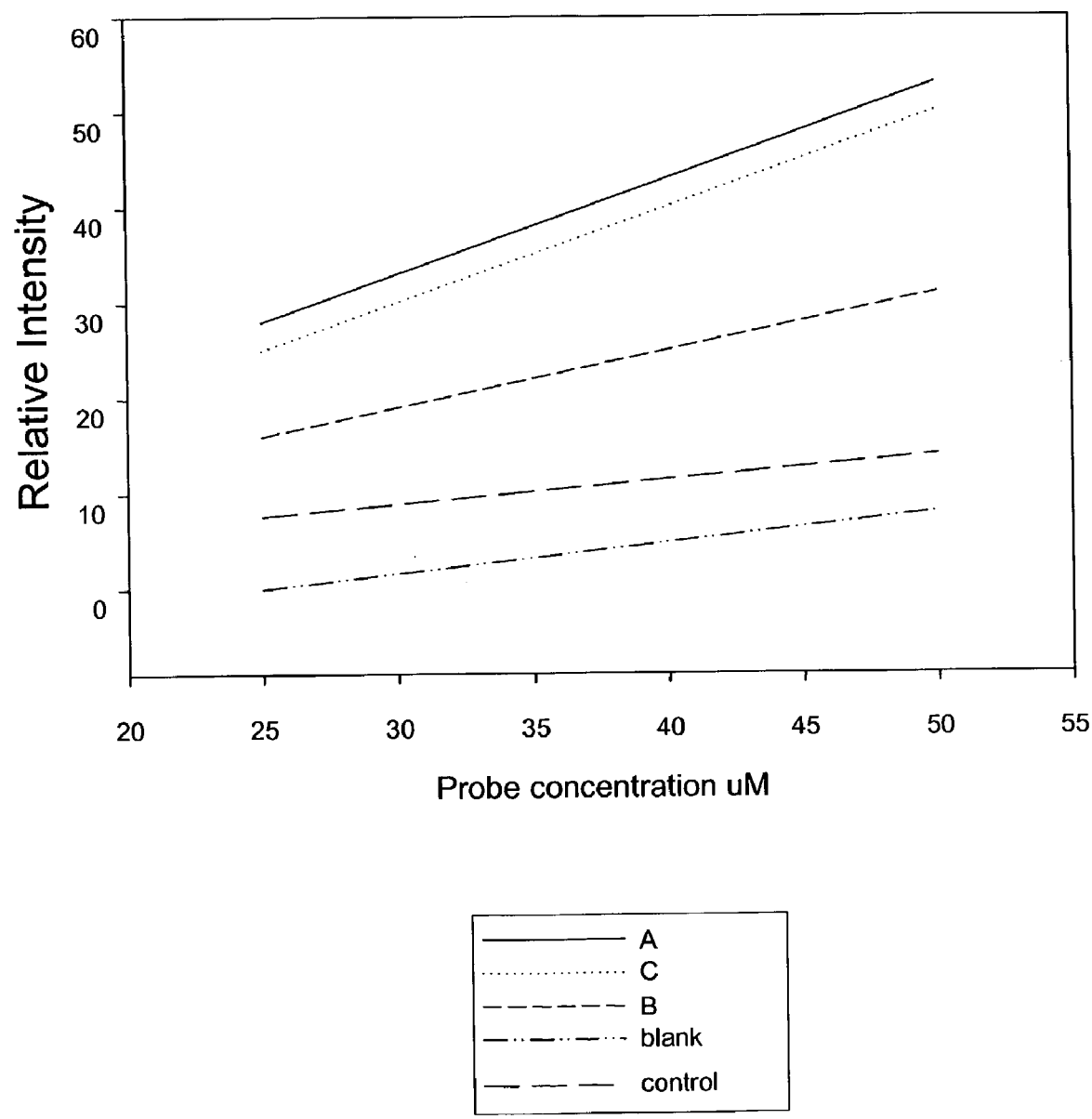
FIG. 12 is a graph of the signal intensities measured from an analysis using the high surface area substrate as compared to a flat substrate.

The observed relative intensities are plotted in FIG. 12. The textured substrate of FIG. 11A is denoted as "A"; of FIG. 11B is denoted as "B"; of FIG. 11C is denoted as "C"; as compared to the data obtained with the blank and the control. The intensity values for the etched surfaces were much higher over the 25–50 µM probe concentration range as compared to the intensity values observed in the controls and in the non-etched region. Thus, overall, multidimensional surfaces have an increased surface area and, as a result, exhibited higher signal intensities than traditional flat surfaces. The signal intensity observed proved of superior analytical quality, and leads to a concomitant improvement in precision and, ultimately, accuracy of analysis. These improved analytical characteristics are provided by microarray devices comprising the high surface area substrates described herein, in part, because each microfeature may be analyzed as a discrete signal. Thus, an array element comprising more than one microfeature also offers significant improvements in microarray analysis over conventional microarray devices.

Example 3

Generating a Microfeature using a Photoresist

The substrates of the present invention comprise microfeatures, and the microfeatures were formed using a photoresist coating. The photoresist layer was deposited on the surface of the substrate and was patterned. The resulting walls of the residual photoresist (in the unexposed areas) increased the surface area of the substrate. A flexible photoresist having a wall height in the range of about 2 to about 100 microns is preferably used to generate a microfeature. For example, the Shin-etsu MicroSi (Phoenix, Ariz.) photoresist SINR-3170M series (e.g. SINR-3170M-13) is processed by first uniformly coating a substrate by spin coating. The substrate is cleaned prior to the coating step. The coating parameters are adjusted to control the thickness, and the coated substrate is heated to about 100° C. for 2 minutes. The coated substrate is exposed, using a contact method or a non-contact method, through a patterned mask to an appropriate radiation level; the mask has, for example, the honeycomb pattern as shown in FIG. 1C. After heating for about 2 minutes at 100° C., the exposed photoresist layer is developed in isopropanol, which dissolved the unexposed area. A final rinse in a solution of 50:50 water-isopropanol followed by a curing step yields the textured surface-having vertical walls that are made out of the photoresist material.

Alternatively, a photoimagible sol-gel solution is employed. The photoimagible solution is coated on the substrate, imaged and the unexposed or exposed area is removed by washing, methods of which are specific to the composition of the photoimagible solution used. The remaining material, which forms the pattern of microfeatures, is consolidated by heating. The preferred material in the finished oxide comprises tungsten oxide, silica, zirconia, alumina, titania, tantala, zinc oxide, nickel oxide, magnesium oxide, calcium oxide, boron oxide, potassium oxide, sodium oxide, chromium oxide, tin oxide, lithium oxide, lead oxide, phosphorous oxide or a mixture thereof.

For subsequent use in a microarray, the substrate is activated to bind a molecule of interest. This is done by, for example, immobilizing silane primers on the textured surface or by a plasma treatment. Silane primers useful in the present invention include amino-silanes (A1100) and epoxy silanes (A187) from Crompton Corp (Charleston, W. Va.). Methods of making silane primers are well known in the art (e.g., see E. P. Plueddemann, Plenum Press, NY (1991)). The silane treatment process is performed in a vapor phase or a liquid phase, and the walls of the microfeatures are also activated.

Example 4

Determination of Wet Etching Rates

Three different methods were tested to generate a plurality of microfeatures on a surface of a substrate. The step height and surface roughness (Ra) were determined on an Alpha Step Profilometer (KLA-Tencor Instruments, San Jose, Calif.) using a five micron tip.

Experiment A: A borosilicate glass, BorofloatTm (Schott glass, Yonkers, N.Y.), was cut into 1"×3" pieces. The substrates were cleaned using sonication, washed with deionized water (18.2 MΩ-cm) and dried at 135° C. for 30 minutes. An etch resistant polyamide tape was applied to half of the surface of each substrate. The substrates were etched using 48% hydrofluoric acid solution under ambient conditions. After etching, a step was formed on the glass at a location that correlated to the edge of the tape. The etch rate was determined based on the height of the step formed in a specific time period. The etch rate was determined to be 0.12 µm/sec. The etched surface was determined to have a Ra (roughness) value of 5 nm.

Experiment B: A Borofloat™ glass substrate cleaned as described in experiment A was coated with a 5% solution of chlorotrimethylsilane in heptane. The deposition involved spin coating at 5000 rpm under ambient conditions. The coated glass was dried at 135° C. for 15 minutes and acid etched as described in Experiment A. The primed surface was etched at the same rate (0.12 µm/sec) as the uncoated glass.

Experiment C: Experiment B was repeated using a 5% solution of aminoethylaminopropyltrimethoxysilane in methanol to prime the surface. The pH of the priming solution was adjusted to less than about pH=7 using acetic acid. The coating was deposited by spin coating at 5000 rpm and air dried at room temperature. The etch rate was determined to be about 0.12 μm/sec, relatively the same as observed for the uncoated surface.

Experiment D: Different substrates were subjected to etching conditions described in Experiment A, and all reaction times were 60 seconds. The substrates tested consisted of a low iron containing glass B270 (commercially available from Schott Glass, Yonkers, N.Y.), a sodium lime silica microscope slide glass and BoroFloat glass. The experimental results for the three glasses are summarized in Table 1.

TABLE 1

Etching Characteristics of Different Substrates

| Glass Type | Material removed after etching for 60 sec. | Ra (before etch) | Ra (after etch) |
| --- | --- | --- | --- |
| Borofloat™ | 8 μm | 0.005 μm | 0.005 μm |
| Microscope Glass Slide (Corning 2947) | 42 μm | 0.005 μm | 0.140 μm |
| Low Iron Glass B270 | 49 μm | 0.010 μm | 5.265 μm |

The difference in the surface roughness after as compared to before the etching process is greatest for the low iron glass B270. No difference is observed for Borofloat™ glass, but the increase in surface roughness for the microscope glass was substantial. Thus, the BoroFloat glass is a more suitable substrate to etch microfeatures if smoother walls are required and/or desired by this process.

Example 5

Substrates Having Communicating Microfeatures

The problems associated with microarrays comprising porous layers and poor molecular accessibility results in several problems, including inadvertent trapping of the targets, poor access of longer molecules to the pores and long hybridization times. The inadvertent trapping of the targets effect a high background signal and, thus, negates the signal increase afforded by the pores. In these cases, the present invention is directed to improving molecular accessibility by providing substrates having textured surfaces comprising structural elements, which are communicating, i.e., communicating microfeatures. The communicating microfeatures comprise those microfeatures that are connected structurally and/or physically to another microfeature, such as a channel. The communication offers an improvement in fluid flow and allows the biomolecules (i.e, target or probe) to access the structural elements of the textured surface.

Figure 3:
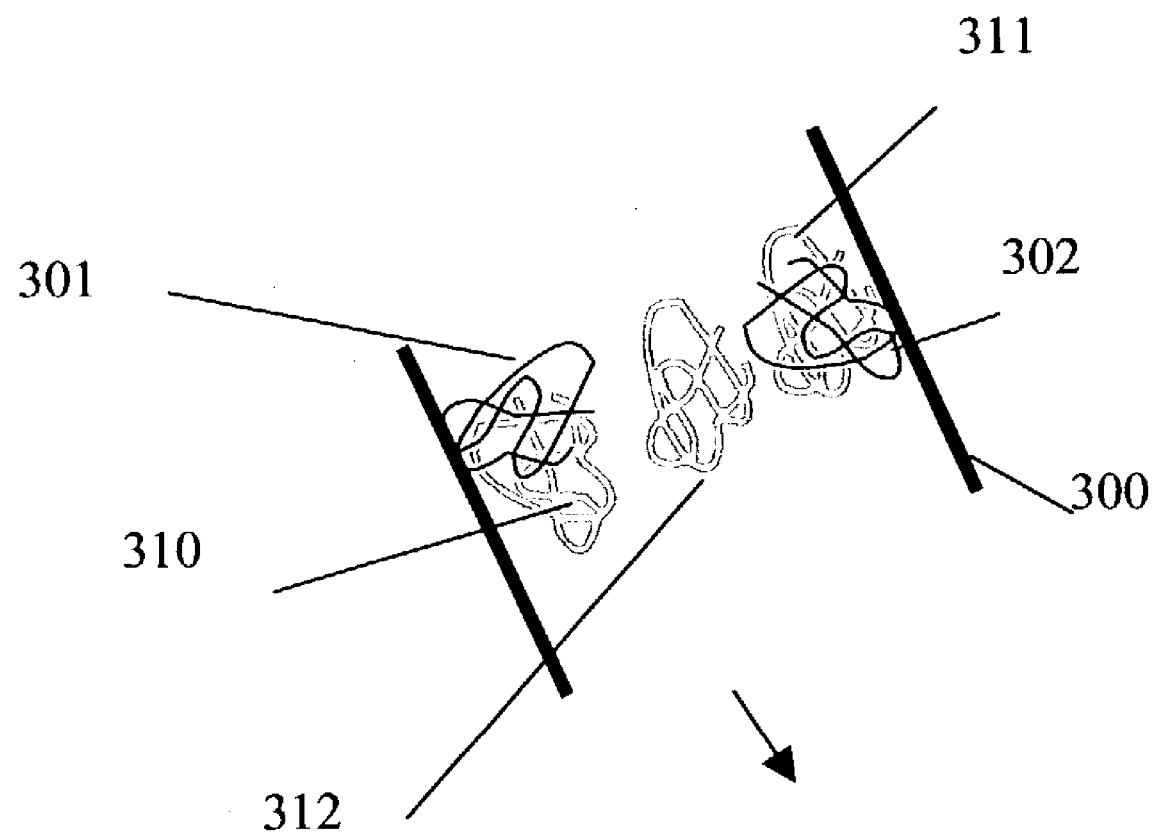
FIG. 3 illustrates a channel and the disposition of targets and analytes.

Thus, the present invention recognizes that the problem lies in increasing the communication between, for example, the pores of the prior art microarrays by providing channels of an appropriate cross-section size to form a communicating system of three-dimensional structural elements. These channels provide increased access of surfaces to larger molecules, improved fluid flow so as to decrease the hybridization times, and improved communication between pores to reduce inadvertent trapping. The channel size is dependent on the size of the biomolecules that are adsorbed or attached to the channel boundaries, and the biomolecules that are flowing through the channel. This is illustrated schematically in FIG. 3. The straight lines 300 indicate the boundary of the channel. The gray lines, 301 and 302, indicate the attached targets (large macromolecules) to the walls and the black lines 312 indicate target molecules flowing through the channels, wherein 310 and 311 are attached to the probe of the microarray.

The channel size (diameter or equivalent) is pre-calculated. For example, assume that each of the DNA molecules (i.e., target and probe) is about the same length and equal to 48 base pairs, which is equal to one segment of statistical length ~50 nm (Maier et al., 1999). Further, assume that the confirmation of the molecules does not change after binding to the surface or to another molecule (i.e, the probe molecule binding to the target molecule), and that the target molecules flowing through the channels have no affinity for the attached molecules. An assumption is also made that the binding is around the entire perimeter of the channel and that enough space for a quick flow through the molecules is permitted. Based on these assumptions, a suitable width (or diameter) of the channel is about 3 times the size of the statistical length of the molecule, or about 150 nm.

It is recognized that the diameter of the DNA molecules are smaller in solution than the theoretical calculation for 48 base pairs because the conformation of the adsorbed molecules is tighter. Because the molecules are assumed to be attached around the entire perimeter of the channel, the use of a hard sphere model introduces errors. The molecules are also capable of traveling through another molecule by reptation. Consideration of the error introduced by the assumptions made, a channel diameter or equivalent size is about 1.5 times the size of the larger of the probe or the target and a preferred channel diameter is greater than about 3 times the size of larger of the probe or the target. In general, cross-section dimensions exceeding 150 nm are preferred. Thus there is no upper limit, but excessive width comes at the expense of reduced surface area. By the same reasoning, high surface area structural elements (i.e., microfeatures and/or microstructures) are created to avoid the formation of channel having a width of less than about 300 nm or preferably less than about 150 nm.

In specific embodiments, communicating voids with each other and with the outside surface through channels involves applying solutions with removable cylindrical particles. For example, the colloidal silica coating solution is mixed in about a 1:1 or about a 2:1 ratio (by volume based on solids) with the cylindrical shaped particles that are easily removed in post-processing steps, such as thermal ablation. Part of the cylindrical shaped molecules may be substituted by removable spherical particles such as latex spheres, which assist in increasing the porosity and the pore size. The removal of the cylindrical shaped particles yield communication pathways or channels between at least a majority of the pores, thereby forming a communicating plurality of microfeatures. Preferred cylindrical particles and removable spherical particles, if used, are larger in diameter as compared to the biomolecules penetrating the surface. Most preferably, the diameter is larger than 3 times the diameter of the larger of the probe or the target (see Example 8). For example, flexible or rigid fibers having a diameter greater than about 20 nm is employed. The fiber aspect ratio of the cylindrical particles is greater than about 10 and a length is about the equivalent to the coating thickness. The fiber aspect ratio, or aspect ratio for the particles of the removable fibrous template, is length divided by their characteristic cross-section dimension, e.g., average diameter, average side length, etc.). If lateral wicking is a problem, the coating is patterned to generate additional structural elements, and preferably nesting the structural elements, which provides improved access to the pores and the communication channels. The cylindrical shaped particles are prepared from peptides to fashion tubes. The tubes have a 25 nm diameter and a length that is submicrons to several microns. Exemplary materials for such tubes are available as Tubulin products from Cytoskeleton Inc (Denver, Colo.). Fibers made from latex, collagen, nylon, acrylic and other polymers in a diameter range of 20 to 1000 nm can also be obtained from Espin Technologies (Chattanooga, Tenn.).

Example 6

Substrates Having Micro-Rods

Micro-rods were generated on Borofloat™ substrates. After cleaning, the substrates were placed in a one liter reaction vessel fitted with a condenser, thermometer and stopper. The reaction vessel was placed in an oil bath and the temperature was stabilized at about 90° C. The reaction kettle was loaded with an equimolar (0.1M) solution of zinc nitrate hexahydrate and hexamethylenetetramine in deionized water. BoroFloat substrates were placed in the solution and maintained at about 90° C. for two days. The substrates were then washed several times with deionized water and dried at 135° C. The resulting substrates were milky white in color. Microscopic examination indicated a highly orientated array of ZnO crystals present on the surface. The crystals were about 6 μm in height and the surface roughness (Ra), as determined by profilometry, was 1.305 μm as compared to a control (uncoated surface) which exhibited a surface roughness of 0.005 μm. The ZnO crystals were observed as in a random order, pointing away from the surface in the third dimension at a straight and at an incline with respect to the normal plane of the surface.

Figure 4:
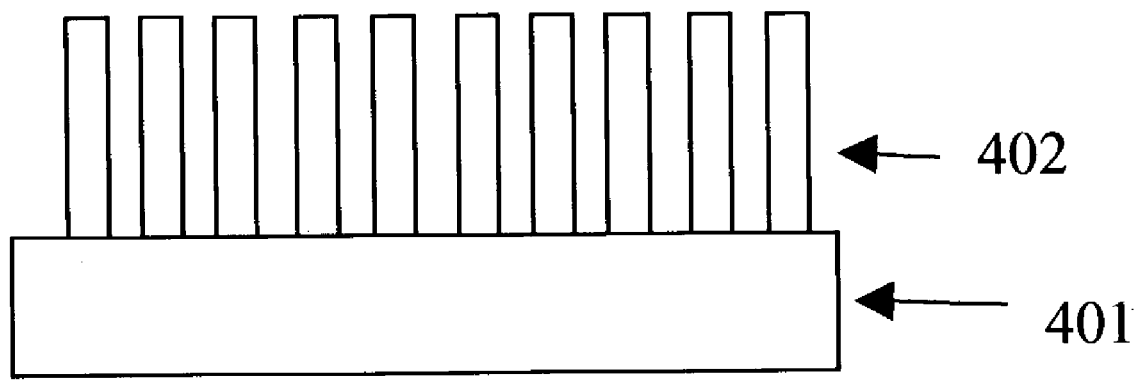
FIG. 4 is a substrate having rods that were grown on its surface.

The micro-rods provided open channel structures on the surface, which are hollow or solid. In specific embodiments, the biomolecule is readily attached to the external surface of the micro-rod and, if the micro-rod is hollow, to the internal surface. FIG. 4 shows a two-dimensional drawing of an exemplary substrate comprising micro-rods. The shaded rods 402 are grown on one of the surfaces of the substrate 401. These rods are uniform in their characteristics of size and spacing, however, this is not necessary as non-uniform size and spacing is contemplated, provided the micro-rods afford a high surface area that is readily accessible to the biomolecules of interest. Thus, a mircoarray prepared with such a substrate is characterized by a reduction in hybridization time, a reduction in inadvertent physical trapping of the biomolecule and an increase in the signal/background (signal-to-noise) ratio. The micro-rods maintain an average distance on the order of greater than aobut 150 nm to avoid physical entrapment of molecules.

To determine the suitability of the micro-rods for microarray, the stability of ZnO rods in water was examined. The micro-rods comprising ZnO crystals grown on BoroFloat glass were prepared as described above, and then were placed in deionized water at 50° C. for 24 hours. The thickness of the coating was measured before and after incubation in water, and the thickness remained stable at 6 μm. The appearance of the coating was also unchanged. The temperature of the water was increased to 95° C., and the substrate comprising a plurality of micro-rods were incubated for 15 minutes and 75 minutes. After the incubation, the appearance and thickness of the ZnO crystals were unchanged as compared to the initial observations.

Example 7

Method for Growing Micro-Rods

Figure 6:
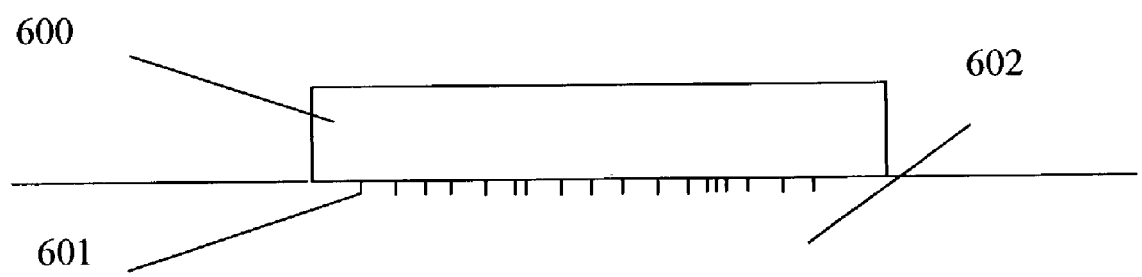
FIG. 6 shows the schematic of a substrate 600 having micro-rods 601 grown as a result of being in contact with a surface of a reaction solution 602.

In one embodiment, micro rods are grown on a substrate using a process that involves placing a substrate in a solution containing zinc nitrate hexahydrate. The reaction is heated to a decomposition temperature (i.e., of zinc) to grow the crystals, which involves the nucleation of oxide crystals that precipitate in the solution. In another embodiment, the reagent solution temperature is maintained below a decomposition temperature by about 10° C., which includes a temperature less than or equal to about 80° C. FIG. 6 illustrates the substrate 600 that is at least at the decomposition temperature and is stationed at the surface of the reagent solution 602. This placement allows the growth of the crystals 601 to occur on a single surface and reduces the amount of solution required to generate the substrate having a plurality of micro-rods 601.

Controlling the nucleation and the growth processes of the crystals, a temperature gradient is employed and applied to the substrate and/or the reagent solution. For example, the substrate is heated to a first temperature that is about 2° to 20° C. below the decomposition temperature for nucleation to occur, then heated to a second temperature, which is higher than the first temperature, for growth. The reagents used comprise an oxidizing agent, such as an amine-containing molecule, and a salt of the cation which is decomposed. Specifically, the substrate is coated with an amino silane, which immobilizes on the surface of the substrate at one end of the molecule and provides a free amino at the other end. The surface is then subjected to a reagent having a cation salt, and reacted at an appropriate temperature to nucleate the crystals. The surface of the substrate is then exposed to a solution containing an amine, such as, for example, hexamethylenetetramine, and a metal salt, such as, for example, zinc nitrate hexahydrate, to initiate growing the micro-rods.

Example 8

Growing Micro-Rods in Pre-Selected Areas

A substrate having a plurality of micro-rods provides a high surface area that is open to the free flow of fluids containing biomolecules, including probes and/or targets. The high surface area includes complete accessibility of the biomolecules to the extensive surfaces created by the micro-rods, thereby avoiding the trapping of biomolecules and increasing signal-to-background ratios. It was determined that coating a borosilicate glass surface with a hydrophobic silane inhibited growth of the micro-rod on the coated area(s). This discovery allowed treatment of specific regions on a substrate with a material that retards or inhibits crystal growth in those regions. Thus, this process is used to selectively grow micro-rods, and particularly, the process is used for growing the micro-rods in a pattern.

In another embodiment, the incorporation of micro-rods is combined with a first process of etching pits onto a surface of the substrate, followed by growing micro-rods in the pits. In this embodiment, a pit defines the pre-selected area to grow the micro-rods. The micro-rods have a height of about equivalent to or less than the depth of a pit, which prevents mechanical damage from occurring to the micro-rods during processing and handling of the substrates. Still further, the dimension of each micro-rod is smaller in dimension than the dimension of an array element.

Forming micro-rods in pre-selected areas includes, under clean-room conditions, cleaning a surface of the substrate (e.g., glass). The substrate is coated with a mask material and patterned. Several mask materials and their patterning is described earlier or can be a pattern formed of a hydrophobic material. The mask is so chosen, which does not allow crystals to be grown on its surface. The patterned substrate is then subjected to the solution for growing the micro-rods. After the micro-rods are grown in the non-masked areas, the mask is removed leaving the micro-rods in a pattern. In one embodiment it may be desired to leave the mask material on the substrate to ensure that the biomolecules do not attach in the boundary regions surrounding the micro-rod cluster patterns.

The uniform distribution forms a pattern such as illustrated in FIG. 1C Using masking, photolithography and etching (preferably anisotropic etching), the hexagonal pits are etched into the substrate leaving the walls (dark lines). During the growth process the dark lines are still covered with a mask which resists the growth of micro-rods. The substrate is then subjected to a solution to grow the micro-rods, so as to grow these in the etched pits.

FIG. 5 shows a nested structural element to provide a textured surface, in that a microfeature of the surface illustrated in FIG. 1C, includes a plurality of micro-rods hexagonally-shaped. The micro-rod diameter 501 is less than about 5 microns, and more preferably less than about 2 microns, and has an average spacing of about the same or within one order of magnitude of the diameter. In certain embodiments, the micro-rods have sub-micron or nanometer dimensions. Further, it is expected that in a specific embodiment, the micro-rods are also grown which are not normal to the bottom surface of the pit as the crystals nucleate and grow from the side walls of the pits.

Example 9

Surface Characteristics of Micro-Rods and Creating Micro-Wells

In certain embodiments of the present invention, crystals grown as micro-rods are not suitable for bioapplications because, for example, their surface characteristics, solubilty, optical properties and/or chemical stability is not optimal for such uses. Thus, methods to overcome these problems involve coating the surface of the micro-rods with materials, such as inorganic oxides, to alter or modify the surface properties. In a specific embodiment, the inorganic oxide is deposited on the surface by a sol-gel process to form a coating. The thickness of the coating is such that the spacing between the rods is preserved. The inorganic oxide includes at least one of an inorganic oxide comprising tungsten oxide, silica, zirconia, alumina, titania, tantala, zinc oxide, nickel oxide, magnesium oxide, calcium oxide, boron oxide, potassium oxide, sodium oxide, chromium oxide, tin oxide, lithium oxide, lead oxide, or phosphorous oxide. The oxide coatings are further modified by optionally adding one or more of lithium oxide, sodium oxide and potassium oxide. In another specific embodiment, the region between the micro-rods (see, FIG. 5) are filled with an inorganic oxide, preferably deposited by wet-chemical method. Subsequently, each of the micro-rods are selectively dissolved, thereby generating open hollow structures on the surface of the substrate, referred to as micro-wells. This method is performed, for example, by dissolving ZnO in a strong acid (i.e., 1 M HCl), which other inorganic oxides are not soluble. In a further specific embodiment, a polishing step is employed after the coating process to expose the ends of the ZnO rods for removal by etching.

For example, the material used to fill the regions between the micro-rods is a colloidal material, such as colloidal silica. Specifically, ZnO crystals were grown on BoroFloat™ glass, as described herein, to provide a textured surface. The surfaces having the plurality of micro-rods were filled with a silica-based hard coating solution, PHC587 from GE Silicones (Waterford, N.Y.). The solution was spin coated on the textured surface at 3,000 rpm and dried at 135° C. for 90 minutes. The solution was calibrated to produce a coating thickness of approximately one micron, and the surface roughness of the coated crystals was determined to be 1.3 µm. The surface characteristic of the micro-wells are further modified by coating/filling with a second material to effect hydrophilicity, such as a silane.

Example 10

Controlling Dimensions of Micro-Rods

In another embodiment, the substrates having a surface comprised of a plurality of micro-rods was prepared from a glass slide pre-coated with chlorotrimethyl silane from a 5% solution in heptane, which was used to impart a hydrophobic characteristic to the surface. The application of the silane solution blocked nucleation and growth of the prisms. Thus, nucleation and growth of prisms, or micro-rods, on the surface is a controllable process. For example, the microrids are grown on a surface in a desired pattern, such as shown in FIG. 1C. This process is applied to patterning, or generating microfeatures on, an existing glass surface by removing surface layers, or by depositing at least one coating in spatially discrete regions to grow these prisms on selected areas. In a specific embodiment, the micro-rods are arranged within a hierarchy to provide nested structural elements, as shown in FIGS. 2A and 2B.

In an alternative embodiment, the process is applied to a conductive indium-tin-oxide (ITO) coated glass substrate and involves patterning by selectively removing ITO. The electrical conductivity of ITO is used to fabricate pixels, in which binding of biomolecules (i.e., a probe to a target) in each of these pixels is detected electronically, without tagging the probes, by measuring changes in complex impedance, resistance, or dielectric relaxation. Alternatively, the selective etching of ITO is used to impose a DC voltage bias, which attracts solution state target molecules to the surface by electrophoresis.

Example 11

Microfeatures and Microstructures

FIG. 8 illustrates a cross-section of a substrate comprising pillars having a height that is less than the height of the walls defining a well 800. The view shows the compartment walls 801, and the pillars 802. The etching process used produced the roughness on the surfaces, which is drawn as non-linear lines. The top area 801 is smooth because the photoresist is removed after the etching process, which is drawn as straight lines. The pillars 802 are shown as conical and have heights less than the heights of the compartment walls. In a specific embodiment, the height of each pillar is decreased to a predetermined height by a process comprising etching, removing a photoresist from the top of the pillars in a second exposure step and then continuing to etch.

Alternatively, nested masks are made in areas in which the mask thickness above the pillar tips (microstructures) is less than that of the boundaries of the microfeatures. During the etching process, the mask material is also consumed, but at a lower rate as compared to the substrate being etched. The etching process is continued after the mask on the microstructures is consumed, while the thicker mask material continues to protect the microfeature boundaries from etching, thereby creating nested three-dimensional structural elements.

Example 12

High Surface Area Realized by Communicating Structural Elements

The system depicted in FIGS. 7A to 7C represents a substrate having a plurality of reaction wells on its surface for high throughput analysis. Each of the reaction wells, 702 in FIG. 7A, represents a reaction chamber having characteristic dimensions on the order of millimeters. The bottom of these wells serve the microarray function. Thus, each well is a separate microarray, in which a different or the same fluid is introduced for a specific reaction. The assembly comprises several combinations of arrays and reactive fluids that are each evaluated, thereby defining a high throughput analysis. Within each reaction well, there are microfeatures on their bottom surface, which is shown as compartments defined by vertical boundaries on a scale of about 10 to about 100 microns. These structures are open to provide ready access to fluids and components therein. Further, compartment boundaries also provide mechanical protection with respect to impact.

Further still, a plurality of microstructures 70222 are provided within the boundary walls, which provide additional surface area and ready access to fluids and components therein. The microstructures have dimensions of about 0.1 microns to about 5 microns. Further, the surfaces of the microstructures provide shallow pits because of surface roughness on the order of about 10 nm to about 100 mn. Thus, paths to these physical surface characteristics are accessible because, in part, of the close proximity to the wide channels formed by other structural elements. In specific embodiments, the textured surface is modified by adding layers and/or coatings to yield surfaces having increased surface area and tailored surface characteristics. In a further specific embodiment, the modification comprises a highly branched molecular structure. In another further specific embodiment, the modification comprises pores limited to the thickness of the coatings.

The hierarchy of the three-dimensional structural elements is shown in the Table 2. The reaction chamber includes the well of, for example, a well plate or micro-well plate. The presence of microfeatures and/or of microstructures provide the substrate with an increased surface area that permits accessibility and increased statistical range of a microarray prepared therefrom. The presence of a microstructure within a microfeature provides a nesting structural element on the textured surface that provides a high surface area. The physical surface characteristics includes surface roughness, pores, and/or micropits that are on the surface of the microfeature and/or microstructures and add further to the available surface area of the substrate.

TABLE 2

| Hierarchy of Substrate | |
|---|---|
| Structural Feature | Characteristic dimension |
| Reaction chamber (well) | 1–10 mm |
| Microfeature | 10–100 microns |
| Microstructure | 0.1 to 5 microns |
| Physical surface characteristics | 10 to 100 nm |

Example 13

High Surface Area Reaction Vessel

FIG. 9 illustrates a reaction vessel that comprises contacting textured surfaces of the substrates of the present invention. Two substrates 901 and 902 are placed such that the textured surface of substrate 901 is facing the textured surface of substrate 902. For a high-throughput cell, the microfeature, in this case a well, of substrate 901 is placed directly opposite the microfeature of substrate 902. In embodiments that involve hybridization, hybridization fluid in placed in the space between the two substrate, and during hybridization, one of the two substrates is laterally oscillated e.g., by several hundred microns or less, thereby creating a turbulent flow. The turbulent flow promotes efficient mixing and, thus, a high degree of hybridization and a reduction in hybridization time. Further, using two substrates increases throughput and eliminates the need for a cover slide. Using a roughened cover slide, or brushes is also contemplated, however, appropriate parameters are optimized to prevent damage to the microfeatures and/or microstructures. Ultrasonic energy is applied to further assist the hybridization process.

Example 14

Multi-Level Microfeatures

Figure 10:
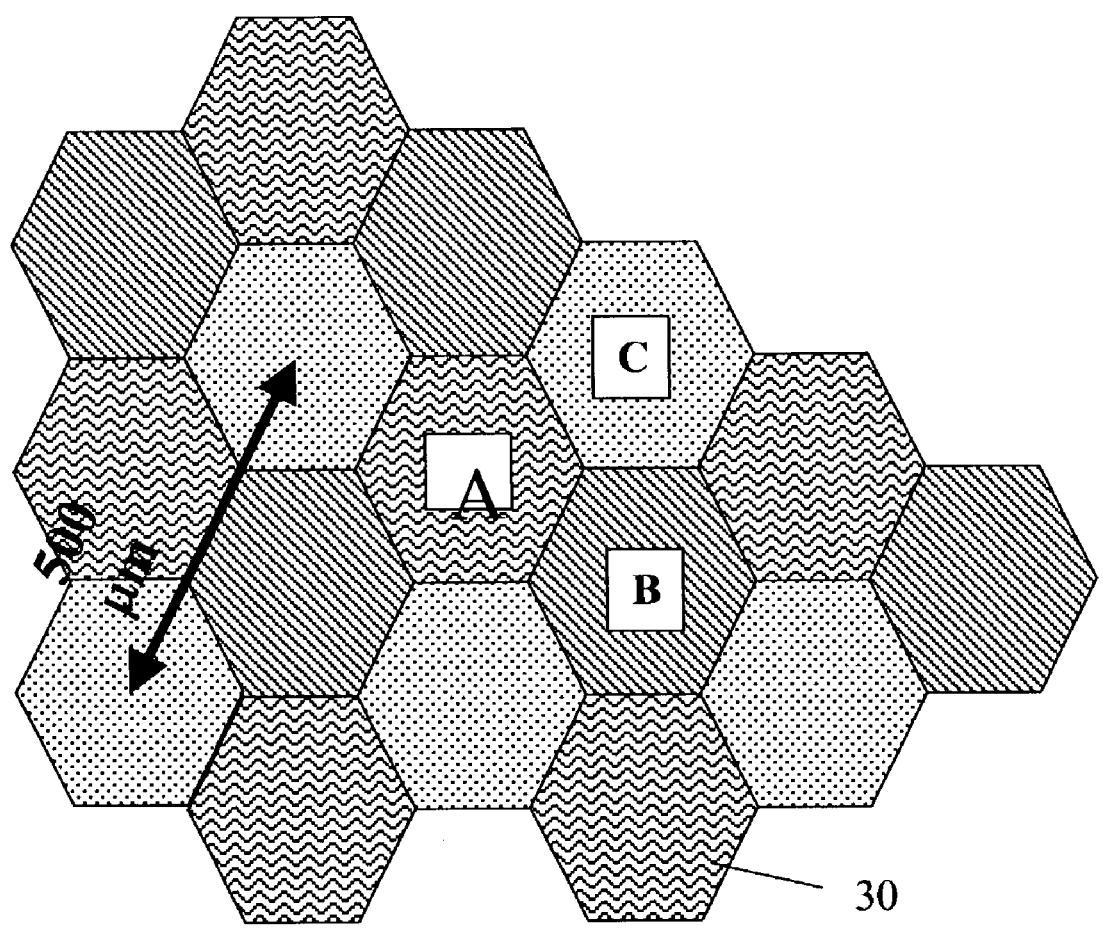
FIG. 10 shows a surface of a multi-level substrate having a plurality of microfeatures residing in multiple planes, labeled "A", "B" and "C"

In certain embodiments of the present invention, a microarray is made that provides an improved spatial resolution. FIG. 10 shows three types of hexagonal features 30, which are labeled as "A", "B" and "C" and are repeated over the substrate. They are distinguished by differences in shading that indicate the multiple heights of each of the three microfeatures. The hexagons each have a side measuring 250 microns, and one array element is dispensed thereon. Thus, each hexagon defines an array element. Alternatively, each array element includes more than one hexagon.

A 250 micron size hexagon allows a dense packing of features of almost 600 features/sq.cm, and a 100 micron hexagon feature allows 3600 features/sq. cm. Moreover, in specific embodiments, each microfeature lies on a different plane to produce a plurality of multilevel microfeatures. In specific embodiments, any two adjacent microfeatures are separated by a height of 5 to 100 microns to provide the multi-level microfeatures Multilevel microfeatures are made by embossing or molding using a tool having, for example, three sets of microfeatures that differ based on height from its base. Alternatively, the multilevel microfeatures are made by etching using nested masks. The use of nested masks involves depositing a first coating on a surface of a substrate, which is preferably an oxide. The coating is patterned using a photolithographic mask that comprises all of the topographic features desired on the surface, including microfeatures, and/or microstructures. The first coating is then removed selectively and a second coating is dispensed and patterned with a second photolithograpic mask that comprises specific structural elements that are already engraved on the surface. The second mask allows etching of the "B" levels. This sequence is repeated until the desired depth of each level is obtained.

It is preferred that a microfeature at a first level is separated by an adjacent microfeature at a second level. One advantage of the multi-level array is the imaging and the detecting of analytical reactions without interference from neighboring reactions. For example, a substrate having multi-level microfeatures is derivatized with a plurality of biomolecules to form a plurality of array elements. A camera is focused at a first level of the microfeatures and the array elements at that first level are imaged. The image is sharply focused at array elements emitting at the first level, and images emitting at the second, third, an so on levels are out of focus. Then, the camera is focused at the second level, without interference of the image from the other planes and so on. This process allows microfeatures to have different imaging planes that provides, with subsequent use in a microarray, chips having densely packed array elements that are evaluated with low interference from adjacent array elements.

Example 15

Solgel Silica Coatings—Probe Binding

Two silica coatings with different degrees of density were formulated by by a wet chemical process (sol-gel process in this case). The coatings were prepared according to the procedure of M. Ogawa et al. Advanced Materials, number 14, volume 10, 1998, from a partially hydrolyzed tetraethyl orthosilicate (TEOS) in ethanol solution. A stock solution was prepared as follows: 8.5 g of TEOS was added under dry nitrogen to 93.75 ml of dry ethanol and 3 g of HCl/water solution. The molar ratio of TEOS/Ethanol was 0.026. The acidified water solution was prepared by taking 0.3 mls. of 37 wt % HCl and diluting with 3 mls of deionized water. Cetyltrimethylammonium chloride [$CH_3(CH_2)_{15}N(CH_3)_3$ Cl] (organic moiety) was added to decrease the density of the fired coating. The cetyltrimethylammonium chloride ($C_{19}TAC$) was added in a concentration of 0.0018 moles from a 25 wt % solution in water. The coatings were deposited by spin coating the liquid precursor described above on a B270 sodalime glass substrate (from Schott Corp, Yonkers, N.Y.) at 2000 rpm under ambient atmosphere and fired at 350° C. at a heating rate of 5° C./minute and held at 350° C. for one hour. Table 1 lists some of the properties of the fired coatings prepared with (Silica-C) $C_{19}TAC$ additive and without it (Silica). Thickness measurements were made using a Tencor Alpha-Step profilometer (Mountain View, Calif.). Haze values were obtained using a HunterLab UltraScan XE Colormeter (Reston, Va.) in the total transmission mode. Transmission was measured in a Spectrometer (MPC 3100, from Shimadzu, Columbia, Md.). Refractive index measurements were made using a Gaertner Ellipsometer (Skokie, Ill.) for the coatings deposited onto a silicon wafer. Increased haze appears to be due to increased surface roughness, as the refractive index change amongst the two samples does not support an argument for increased porosity in sample Silica-C.

TABLE 1

| Additive/Characterization | Coating | |
| --- | --- | --- |
|  | Silica | Silica-C |
| Cetytrimethylammonium chloride | No | Yes |
| Thickness (nanometers) | 51 | 77 |
| Contact Angle for water at 25° C. | 36° | 15° |
| % Haze | 0.12 | 0.39 |
| % Transmission (between 350 and 900 nm) | >95 | >95 |
| Refractive Index at 632.8 nm, 25° C. | 1.412 | 1.425 |

The substrates were spotted with DNA probes using oligomers of 25 base pairs. A mixture of untagged oligomers and oligomers tagged with Cy 3 fluorescence dye were used as described below. Prior to solution preparation the oligomers were purified to remove salts using reverse phase HPLC and by passing through a sephadex column.

The oligomers were dissolved in water where the concentration of the untagged oligomer was 25 μM and the tagged 2.5 μM. This solution was spotted at 0.5 μL volumes on the substrates using a hand help pipette. This produced spots with a diameter of ~ one millimeter. The deposited spots were incubated in a humidity chamber for 30 minutes to ensure hydration. They were then dried under ambient atmosphere for 5 minutes and heated to 80° C. for two hours. The spotted substrates were then washed with sodium bicarbonate buffer pH =9.3 to remove unattached oligomer and to prevent binding of the washed off material to the substrate. After the buffer rinse the substrates were washed with deionized water and finally with ethanol. They were then dried at 50° C. for 10 minutes. The slides were imaged in an Arrayworx E microarray imager (Applied Precision LLC, Issaquah, Wash.) under Cy3 excitation and emission filters. Table 2 shows the mean intensities for the DNA spots on glass, commercial aminosilane coated slides (GAPS II Coated Slides, Coming, Acton, Mass.) and silica 1 and 2. In all examples relative intensity units are used.

TABLE 2

| Sample | Mean Intensity above background |
| --- | --- |
| Non-coated Glass (B270) | Background only, no distinguishable signal |
| Commercial amino silane coated | 7 |
| Silica coated glass | 7 |
| Silica-C coated glass | 103 |

Example 16

Doped Silica Coatings—Probe Binding

Six ml of the stock solution described in example 1 above was doped with a metal cation according to Table 3.

TABLE 3

| Coating Label | Dopant (10 mole %) | Cetytrimethylammonium chloride |
| --- | --- | --- |
| Silica-Li | LiCl | Not added |
| Silica-Li—C | LiCl | Added |
| Silica-Zn | $Zn(NO_3)_2 6H_2O$ | Not added |
| Silica-Zn—C | $Zn(NO_3)_2 6H_2O$ | Added |

The coatings were deposited and fired as described in example 1 above. Some physical and optical properties of the coatings are given in Table 4.

TABLE 4

| Characterization | Coating | | | |
|---|---|---|---|---|
| | Silica-Li | Silica-Li—C | Silica-Zn | Silica-Zn—C |
| Thickness (nm) | 51 | 77 | 51 | 77 |
| Contact Angle for water at 25° C. | 30° | 14° | | 22° |
| % Haze | 0.14 | 0.51 | 0.22 | 0.33 |
| % Transmission (between 350 and 900 nm) | >95 | >95 | >95 | >95 |

The coated substrates listed in Table 4 were spotted with labeled DNA as described in example 1. The spotting binding data is summarized in Table 5.

TABLE 5

| Sample | Mean Intensity (above background) |
|---|---|
| Non-coated Glass (B270) | Background only, no distinguishable signal |
| Commercial amino silane coated slide | 7 |
| Silica-Li | Background only, no distinguishable signal |
| Silica-Li—C | 137 |
| Silica-Zn—C | 142 |

The spots for the microarrays of silica-Li—C and silica-Zn—C were more uniform in intensity as compared to the others.

Example 17

Textured Surfaces and Combination with Solgel Coatings—Probe Binding

A textured surface was prepared on a soda lime silicate glass (B270) by blasting with silicon carbide abrasive powder at bout 35 psi. The silicon carbide had an average particle size of 100 microns. The blasting time was six seconds. This produced a surface with pits varying in depth from 2.5 to 7.5 microns as determined by surface profilometry using a Tencor AlphaStep (Mountain View, Calif.) with a 5 micron diameter probe.

The textured surfaces (Sample T-A) and flat glass (B270A) were coated with an amino silane solution to enhance binding of DNA. The amino silane solution was prepared from 2 weight % aminoethylaminopropyltrimethoxysilane and 5 weight % water in ethanol. The primer was deposited by dip coating and dried at 120° C. for 5 minutes.

In a second experiment the textured surface was coated with a sol-gel coating of type silica-Li—C as described in example 2. This surface was then further coated with the amino silane. Table 6 summarizes the differences in the four samples

TABLE 6

| Sample Name | Type | Mean Intensity (Above Background) |
|---|---|---|
| B270-A | Flat Glass/Amino silane | 83 |
| B270/Silica-Li—C-A | Flat glass/Silica-Li—C/Amino silane | 217 |
| T-A | Silicon carbide blasted/Amino silane | 789 |
| T-Silica-Li—C-A | Silicon carbide blasted/Silica-Li—C/Amino silane | 1012 |

The substrates described in Table 6 were spotted with DNA as described in example 1 and the binding intensity results for these substrates are also shown in this table. As seen, when a flat or a textured substrate is further coated with the solgel coating described here, the signal intensities are higher.

Example 18

Patterned Substrates by Ion-Etching—Probe Binding and Spot Morphology

A 1.1 mm thick boro-silicate glass substrate Borofloat™ from Schott Glass (Yonkers, N.Y.) was cleaned and coated by evaporation with a layer of about 300 nanometers of chromium. The chromium layer was patterned using photolithographic methods comprising nested structural elements.

Figure 13:
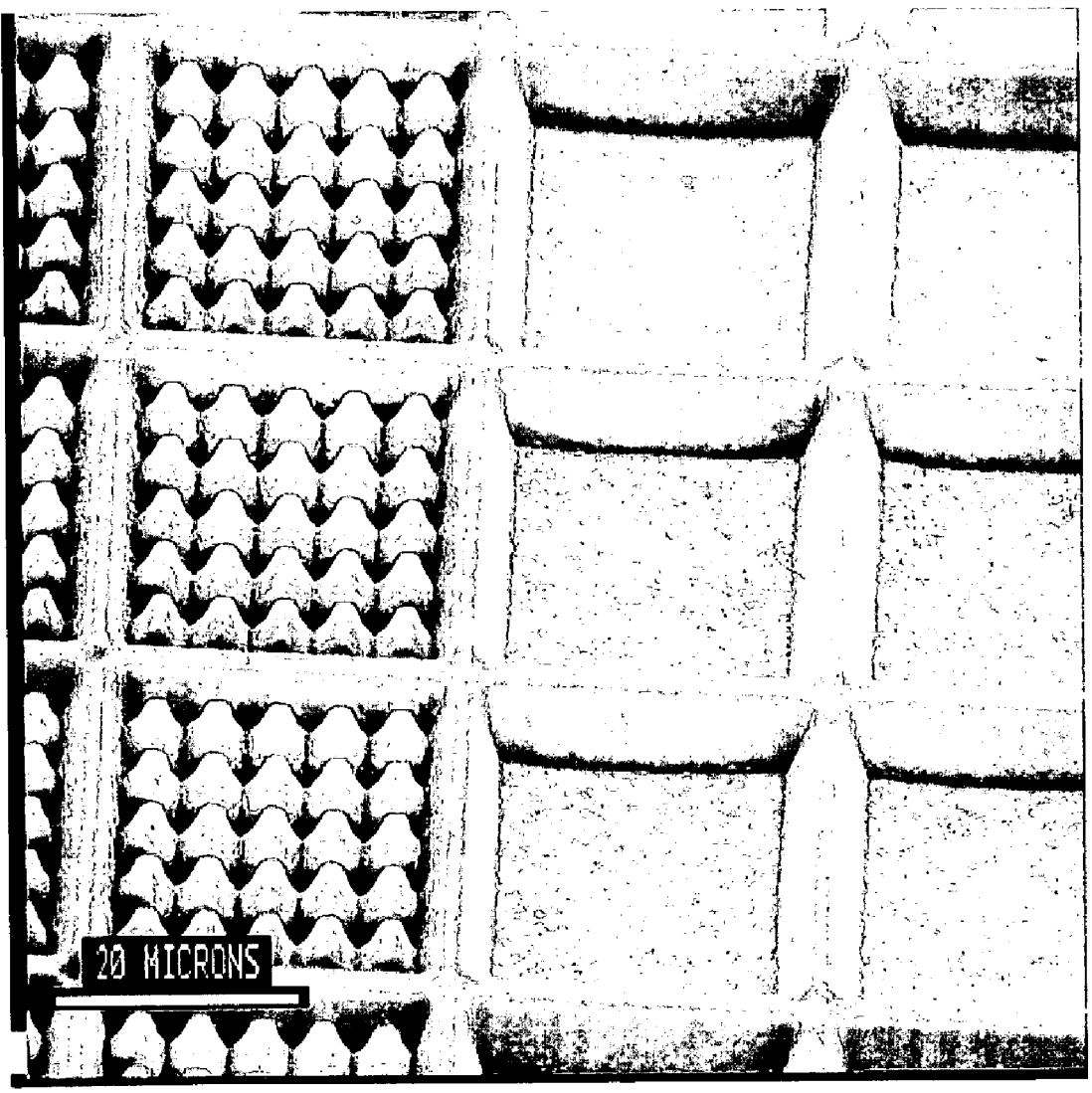
FIG. 13 shows etched patterns formed by ion-etching using CF4 plasma.

The chromium covered patterned substrate was ion etched using CF4 plasma in an inductively coupled plasma (ICP) equipment. The etch rate was 100 nm/min. The samples were etched to a depth of approximately 8 microns. The chromium was removed by dipping the samples in a chemical reactant CR7 (from Cyantek, Freemont, Calif.) and then rinsed several times in distilled water while using ultrasonic agitation. Two of these etched patterns are shown in FIG. 13. This picture is taken using a scanning electron microscope (SEM), at a spot where there is a change in pattern, the area on the left hand side has square wells with pillar-type microstructures and the area on the right hand side has no pillars. The size of squares (the length of the sides interior to the walls) is 25 microns for both sides.

A After etching, each slide was heated to about 450° C. in air to burn off any organic residues. The substrates were then rinsed in DI water, solution A at 80° C. (consisting of 5:1:1 parts of water, ammonium hydroxide and 10% hydrogen peroxide) and then in solution B at 80° C. (here ammonium hydroxide in solution A was replaced by 37% hydrochloric acid). The samples were rinsed several times in DI water and dried in an oven. They were then subjected to a standard priming treatment using a prehydrolyzed amino-silane based primer.

The probe was applied and the substrates prepared for evaluation and evaluated as described in Example 1. Control spots were also placed onto the non-etched area of the slides (i.e., outside of the etched well) and on the non-etched control slides. The spots on the textured substrate appeared to have a contact geometry resembling a square.

Figure 14A:
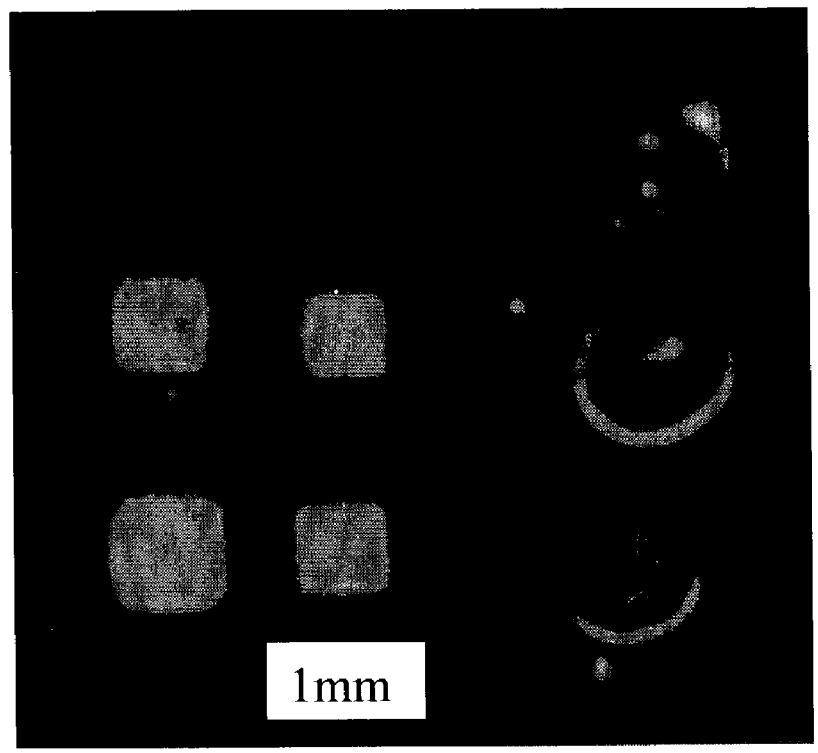
FIG. 14A shows spots in non-textured and textured glass.

The background intensity (areas with no spots) was 75 units in both textured and the non-textured (flat) areas. In the flat area spotted area, the intensity was 154 and in the textured area with no pillars it was 487. This clearly shows the enhancement in the signal due to the increased surface area. The spots on the non-textured and the textured glass are shown in FIG. 14A. The spots in the textured area (square spots) were much more uniform in their intensity, second the spot morphology was very consistent, and in this case the geometry resembled a square (or the same as surface texture). This shows that the spot morphology can be controlled by the texturing pattern. The round spots were in an adjacent flat (non-textured) area. These spots were non-uniform and weak in average intensity.

Figure 14B:
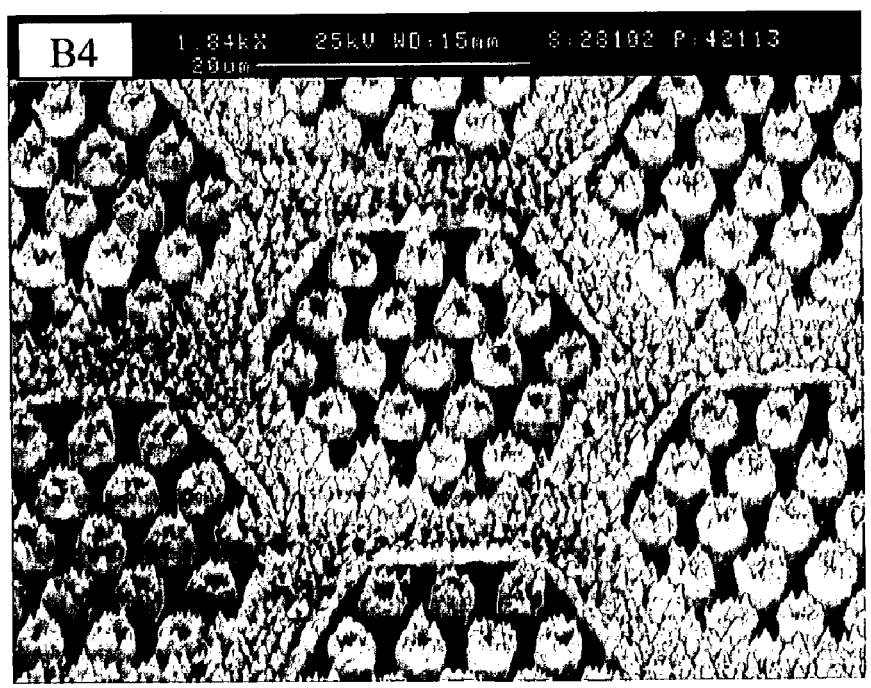
FIG. 14B demonstrates ion-etching process continued to a point where the chrome mask is completely etched and the surface below is etched.

The ion-etching process can also be continued to a point where the chrome mask is completely etched and the surface below is etched to make it rougher, while still maintaining the integrity of the microfeatures and the microstructures as shown in FIG. 14B. One may generate the fine random microfeatures all over the usable area of a substrate (as seen on the tip of the walls and the pillars) by etching a non-masked plate to an ion etch (or dry etch) process.

Example 19

Patterned Substrates by Ion-Etching—Probe Binding and Target Hybridization

A borosilicate glass slide with a microstructure as shown in the left hand side of FIG. 1 (Example 4, area with pillars in square troughs) was used to conduct this experiment. The slide was coated with an epoxy silane by immersing in a 1% v/v (3-Glycidoxypropyl)trimethoxysilane in dry toluene solution. The slides are incubated for ≧4 hrs, then removed and rinsed with dry toluene. The slides are immediately placed in a 110° C. oven for 10 min and then stored under desiccation.

These slides were spotted with a pipette dispensing 0.5 μl of the probe solution. The aqueous probe solution comprised of the following in final concentrations:

| | |
|---|---|
| 3' amine/5' unmodified 25mer capture probe | 99.0 μM |
| 3' amine/5' Cy5 modified 25mer capture probe | 1.0 μM |
| NaOH | 25 mM |

Figure 15A:
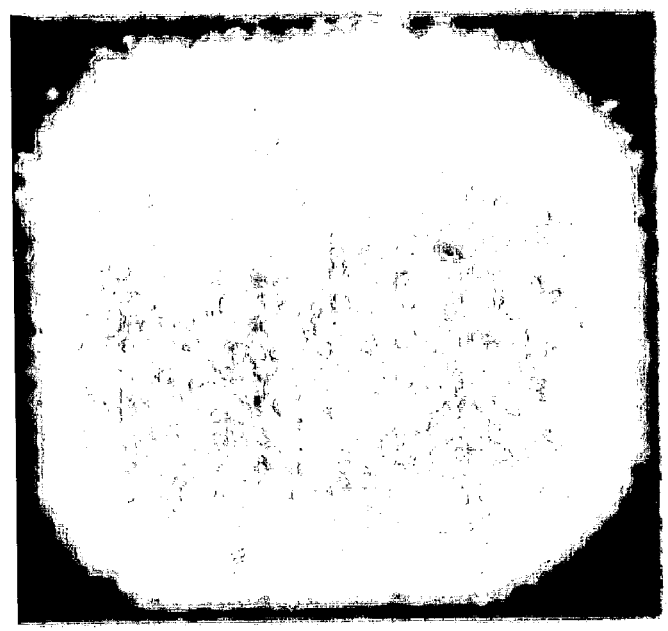
FIGS. 15A to 15B show the pixel intensities for CY5 signals for a microstructured area (FIG. 15A) and a flat area (FIG. 15B).
Figure 15B:
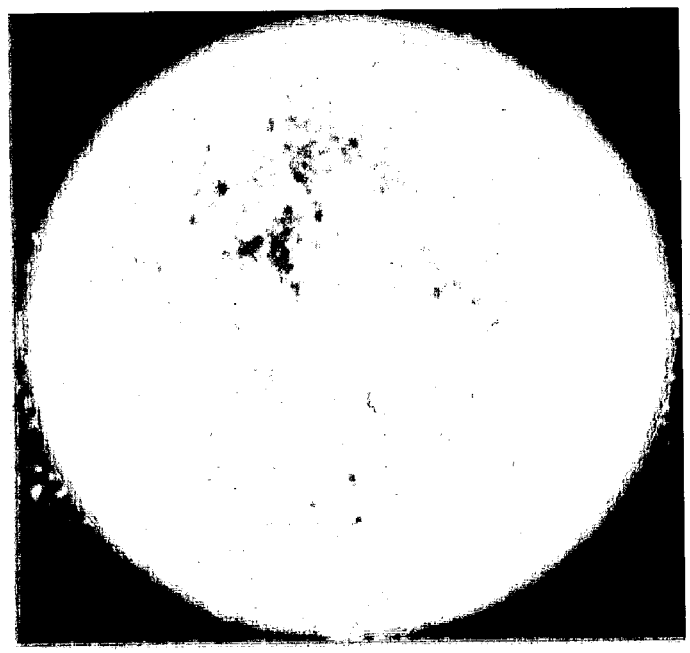

The spots were allowed to incubate in a humidity chamber for 30 min then flushed with DI (deionized) water, rinsed with ethanol and allowed to dry in a 50° C. oven. The slides were imaged in an Arrayworx imager with the following settings:

5.1 μm pixel resolution
High range sensitivity
Cy5-634 nm excitation/686 nm emission filters
0.3 sec exposure Mean pixel intensities were recorded with a 100. times. 100 pixel circular collection template. These results are for the microstructured area, shown in FIG. 15A, and a flat area, shown in FIG. 15B, (circular spot).

Hybridization of targets to Epoxysilanized probe spotted arrays was conducted as follows:
1. Probe spotted arrays were incubated for 30 min with a prehybridization buffer containing: 2×SSC+5× Denhardt's solution.
2. The prehybridization buffer was aspirated, and a heat denatured 10 nM Cy3 labeled perfect match oligo target in 2×SSC+5× Denhardt's solution was incubated on the array at 27° C. for 30 min.
3. The hybridization solution was aspirated and the array was washed with 0.5×SSC to remove unbound target.
4. The array was rinsed with ethanol and dried in a 50° C. oven before imaging.

Figure 16A:
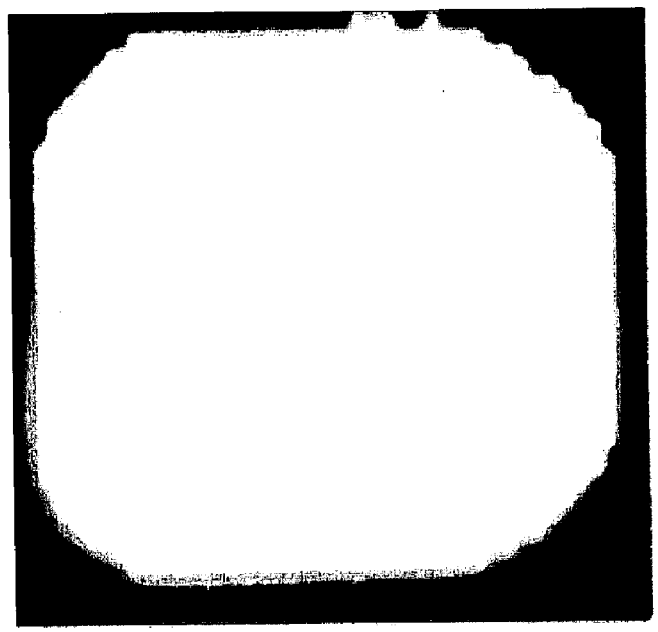
FIGS. 16A to 16B show the pixel intensities for CY3 signals for microstructured area (FIG. 16A) and a flat area (FIG. 16B).
Figure 16B:

The slides were imaged and intensities in an Arrayworx imager using the same settings as before but using a CY3 channel (549 nm excitation and 596 nm emission filters). These results are shown in FIGS. 16A and 16B for the corresponding areas shown earlier in FIG. 15.

In the microstructured slides, the intensity is highly uniform in the spot area. One could subdivide the spot in finer arbitrary areas or along the borders of the pattern, which in this case may be one or more square wells. The set of readings from a spot can be combined statistically to get a more definitive identification of the probe.

Example 20

Solgel Silica Coatings—Large Probe Binding

Figure 17A:
FIGS. 17A to 17C show a non-coated soda lime glass (B270)(FIG. 17A), a commercial amino silane coated slide (FIG. 17B), and a substrate coated with a solgel coating Silica-Li—C (FIG. 17C).
Figure 17B:
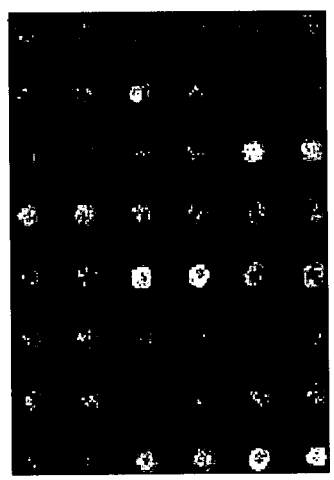
Figure 17C:
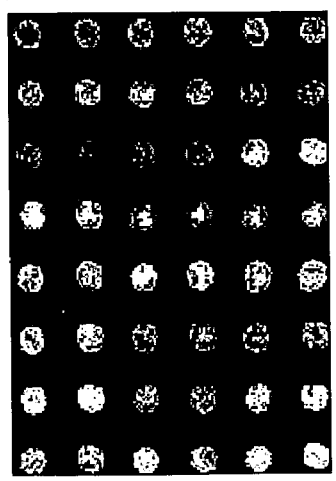

The probe binding was compared for a substrate coated with a solgel coating Silica-Li—C, FIG. 17C, (see example 16), non-coated soda lime glass (B270), FIG. 17A, and a commercial amino silane coated slide (Clontech slide was Type 1, catalogue # 7880-2, BD Biosciences Clontech, Palto), FIG. 17B. These were printed with a library DNA (Clone ID. AA09FOF) with a gene base catalogue # BE038159 prepared by the University of Arizona. The DNA had a fragment size of 1,000 base pairs. The commercial slides are compatible with oligonucleotide fragments that are 50–10,000 bases in length. The blank glass slides were acid/base washed and rinsed in deionized water and heated at 90. degree. C. prior to printing. The sol-gel coated slides were washed with deionized water and dried at 90. degree. C. The slides were stained with Syto 61 red fluorescent nucleic acid stain and washed in ethanol. The spots were imaged on Scan Array 3000 (Packard Biosciences, Wellesley, Mass.). Table 7 summarizes the binding data and FIGS. 17A and 17B show this visually.

TABLE 7

| Sample | Mean Intensity | Mean Spot Size (Microns) |
|---|---|---|
| Glass (B270) | 1730 | 121 |
| Commercial slide | 3255 | 119 |
| Silica-Li—C | 7252 | 141 |

REFERENCES

Patents

U.S. published application 2001/003907 to Nagasawa et al.
U.S. Pat. No. 5,843,767 to Beattie
U.S. Pat. No. 5,412,087 to McGall et al
U.S. Pat. No. 5,744,305 to Foder et al.
U.S. Pat. No. 5,445,934 to Foder et al.
U.S. Pat. No. 5,951,295 to Lyles et al.
U.S. Pat. No. 5,629,186 to Yasukawa et al
U.S. Pat. No. 5,700,637 to Southern
U.S. Pat. No. 6,054,270 to Southern
U.S. Pat. No. 5,807,522 to Brown et al.
U.S. Pat. No. 5,451,260
U.S. Pat. No. 6,266,1277 B1
U.S. Pat. No. 6,150,103
U.S. Pat. No. 4,483,700
U.S. Pat. No. 5,525,264 to Cronin et al.
WO 01/61042
WO 01/73126 to Lyles
WO 99/32663
WO 90/03382
WO 93/22680
WO 95/15970
WO 00/61282
WO 01/16376
WO 01/66687

Non-Patented Literature

A. Matsuda, Y. Matsuno, S. Kataoko, S. Katayama, T. Tsuno, N. Tohge and T. Minami, "Pregrooving on Glass Disks by the Sol-Gel Method (Part1)—Formation and Evaluation of Pregrooved Glass Disks" Proceedings SPIE. Volume 1328 pages 62 to 70 (1990)

Yoshinobu, M., et.al., "Sol-gel technology for Optical Disk Application", Proceedings SPIE. Volume 1758 page 105 (1992)

Turner S., et.al. Proceedings SPIE, vol 2978-Micro- and Nanofabricated Electro-Optical Mechanical Systems for Biomedical and Environmental Applications II, (1997) p-141

E. P. Plueddemann, Plenum Press, NY (1991)

Heng Zhu, et.al., in Nature Genetics, Volume 26, p-283 (2000)

Chan, S., et.al., Proceedings SPIE, vol 3912-Micro- and Nanotechnology for Biomedical and Environmental Applications, (2000), p-23

Meyer et al., Semiconductor International, July 1999

Parks, G. A., Chemical Reviews, vol 65 (1965) p-177

Belosludtsev Y., et al., Biochemical and Biophysical Research Communication vol 282, (2001), p 1263

Zhang et al., Nucleosides, Nucleotides Nucleic acids, Vol 4–7 (2001) p-1251

Maier et al, Phys Rev Letters, 82 (1999) 1911

Vayssieres et al. "Three Dimensional array of highly oriented Crystalline ZnO microtubes", Chemistry of Materials, Volume 13, no 12 (2001) p-4395

Van Den Doel et al, Proceedings SPIE, Micro- and Nanofabricated Structures and Devices for Biomedical and Environmental Applications II, vol 3606 (1999), p-28

Kikuchi, H. E. et al., Proceedings SPIE, vol 3606-Micro- and Nanofabricated Structures and Devices for Biomedical and Environmental Applications II, (1999), p-150

Khanna et al., Microfabrication Protocols for Deep Reactive Ion Etching and Wafer-Level Bonding, Sensors, April 2001, http://www.sensorsmag.com/articles.

Kopf-Sill, A. R. et al., Proceedings SPIE, vol 2978-Micro- and Nanofabricated Electro-Optical Mechanical Systems for Biomedical Environmental Applications II, (1997), p-172

C. J. Brinker and G. W. Scherer, "Sol-Gel Science, The Physics and Chemistry of Sol-Gel Processing", Academic Press 1990

"Structure, Properties and Potential Applications of Ormosils" J. D. Mackenzie and E. P. Bescher, J. Sol-Gel Sci. and Technol. Vol. 13, 371–377 (1998)

"The role of Surfactants and Amphiphiles in the Synthesis of Porous Inorganic Solids" by Andreas Stein and Brian Melde from the book "Reactants & Synthesis in Surfactant Systems"edited by J. Texter, by Marcell and Dekker to be published in 2001

"Porous Silica Obtained from Biodegradable and Biocompatible Inorganic-Organic Hybrid Materials" D. Tian, S. Blacher. Ph. Dubois, J. P. Pirard and R. Jerome, J. Sol-Gel Sci. and Technol. Vol.13, 415–419 (1998)

Kremsky J. N., et.al., Nucleic Acid Research vol 15, p-2891 (1987); Ghosh S. S., et.al., Nucleic Acid Research vol 15, 5353 (1987).

Ion Exchanged Glass waveguides, A review' Ramaswamy, R. V., J. of Lightwave Technology, vol 6, (1988) p984

Joon Won Park, et.al., Langmuir (2002), vol 18, p-1764

Zhao, D., et. Al., Nonionic triblock and star diblock and oligomeric surfactant synthesisof highly ordered, hydrothermally stable, mesoporous silica structures, J. Am. Chem. Soc., 120; 6024 (1998)

Che, D., et al, Novel surface and multicolor charge coupled device-based fluorescent imaging system for DNA microarrays, J. of Biomedical Optics, 6(4); 450 (2001), Peterson, W. A. et al, The effect of surface probe density on DNA hybridization, Nucleic Acids Research, 29(4); p-5163 (2001).

AST Technical Journal-Ih-Houng Loh, Plasma Surface Modification in Biomedical Applications, (AST products Inc., Billerica, Mass.).

T. C. Chang, Plasma Surface Treatment in Composites Manufacturing, J. of Industrial Technology, volume 15, no. 1, Nov. 1998 to January 1999.

Wu, S., "Polymer Interface and Adhesion", Chapter 1, Marcel Dekker Inc (Publishers), New York, 1982

Resnick, D. J. et.al., "Release layers for contact and imprint lithography," Semiconductor International, June (2002) p-71

What is claimed is:

1. A microarray device comprising:
   (a) a substrate having a textured surface comprising a plurality of microfeatures; and
   (b) a plurality of separate array elements,
   wherein each of said plurality of array elements being larger than the distance between any two adjacent microfeatures and is immobilized on said two adjacent microfeatures to form a textured array element, wherein the textured surface further comprises a plurality of microstructures, and wherein each of the plurality of microstructures are smaller in dimension than each of the plurality of microfeatures and each of the plurality of microstructures occupies a spatially discrete region within a respective microfeature.

2. A microarray device comprising:
   (a) a substrate comprising a textured surface; and
   (b) a plurality of array elements,
   wherein the textured surface comprises a plurality of microfeatures arranged in spatially discrete locations, and wherein at least one of the plurality of microfeatures comprises microstructures which are smaller in dimension than said microfeature and occupy spatially discrete regions within said microfeature, and
   wherein each of the plurality of array elements is immobilized on at least two adjacent microfeatures to form a textured array element.

3. A microarray device of claim 2, wherein each of the plurality of array elements is larger than the distance between any two adjacent microfeatures.

4. A microarray device comprising:
   (a) a well with a textured bottom surface having a plurality of microfeatures; and
   (b) a plurality of separate array elements,
   wherein at least one microfeature of the textured bottom surface contains a plurality of microstructures, each of which is smaller than the microfeature, and
   wherein each of the plurality of array elements is immobilized on two adjacent microfeatures of the textured bottom surface to form a textured array element.

* * * * *